US009691589B2

(12) United States Patent
Van De Peut et al.

(10) Patent No.: US 9,691,589 B2
(45) Date of Patent: Jun. 27, 2017

(54) DUAL PASS SCANNING

(75) Inventors: Teunis Van De Peut, Leusden (NL);
Marco Jan-Jaco Wieland, Delft (NL)

(73) Assignee: MAPPER LITHOGRAPHY IP B.V., Delft (NL)

( * ) Notice: Subject to any disclaimer, the term of this patent is extended or adjusted under 35 U.S.C. 154(b) by 0 days.

(21) Appl. No.: 13/293,393

(22) Filed: Nov. 10, 2011

(65) Prior Publication Data

US 2012/0286170 A1 Nov. 15, 2012

Related U.S. Application Data

(63) Continuation of application No. PCT/IB2010/052217, filed on May 19, 2010.
(Continued)

(51) Int. Cl.
*H01J 37/302* (2006.01)
*H01J 37/04* (2006.01)
(Continued)

(52) U.S. Cl.
CPC .......... *H01J 37/3026* (2013.01); *B82Y 10/00* (2013.01); *B82Y 40/00* (2013.01);
(Continued)

(58) Field of Classification Search
CPC ............... H01J 37/3174; H01J 37/3175; H01J 31/3177; H01J 37/3026
See application file for complete search history.

(56) References Cited

U.S. PATENT DOCUMENTS 4,063,091 A * 12/1977 Gee ........................ 250/310
4,430,571 A    2/1984 Smith et al.
(Continued)

FOREIGN PATENT DOCUMENTS

CN    101063822 A    10/2007
EP       1523027 A2   10/2004
(Continued)

OTHER PUBLICATIONS

"Multi-tone rasterization, dual pass scan, data path and cell based vector format" ip.com Journal, ip.com Inc., West Henrietta, NY, US, May 22, 2009.

*Primary Examiner* — Wyatt Stoffa
*Assistant Examiner* — James Choi
(74) *Attorney, Agent, or Firm* — Hoyng Monegier LLP; David P. Owen

(57) ABSTRACT

A method for exposing a wafer using a plurality of charged particle beamlets. The method comprises identifying non-functional beamlets among the beamlets, allocating a first subset of the beamlets for exposing a first portion of the wafer, the first subset excluding the identified non-functional beamlets, performing a first scan for exposing the first portion of the wafer using the first subset of the beamlets, allocating a second subset of the beamlets for exposing a second portion of the wafer, the second subset also excluding the identified non-functional beamlets, and performing a second scan for exposing the second portion of the wafer using the second subset of the beamlets, wherein the first and second portions of the wafer do not overlap and together comprise the complete area of the wafer to be exposed.

24 Claims, 42 Drawing Sheets

Related U.S. Application Data

(60) Provisional application No. 61/179,762, filed on May 20, 2009.

(51) Int. Cl.

| | | |
|---|---|---|
| *H01J 37/317* | (2006.01) | |
| *H01J 37/30* | (2006.01) | |
| *B82Y 10/00* | (2011.01) | |
| *B82Y 40/00* | (2011.01) | |
| *G03F 7/20* | (2006.01) | |

(52) U.S. Cl.
CPC ........ *G03F 7/70475* (2013.01); *H01J 37/045* (2013.01); *H01J 37/3002* (2013.01); *H01J 37/3174* (2013.01); *H01J 37/3175* (2013.01); *H01J 37/3177* (2013.01); *H01J 2237/3175* (2013.01); *H01J 2237/31761* (2013.01); *H01J 2237/31764* (2013.01)

(56) References Cited

U.S. PATENT DOCUMENTS

| | | | |
|---|---|---|---|
| 4,467,211 A | 8/1984 | Smith et al. | |
| 5,384,463 A | 1/1995 | Honjo et al. | |
| 6,087,046 A * | 7/2000 | Nakasuji | B82Y 10/00 430/296 |
| 6,156,464 A | 12/2000 | Hada | |
| 6,159,644 A | 12/2000 | Satoh et al. | |
| 6,249,306 B1 * | 6/2001 | Isono | B41J 2/45 347/233 |
| 6,288,406 B1 | 9/2001 | Penberth et al. | |
| 6,501,869 B1 | 12/2002 | Athale | |
| 6,556,702 B1 | 4/2003 | Rishton et al. | |
| 6,582,046 B1 | 6/2003 | Sato | |
| 6,837,563 B2 | 1/2005 | Sato | |
| 6,897,458 B2 | 5/2005 | Wieland et al. | |
| 6,919,952 B2 | 7/2005 | Kruit | |
| 6,941,006 B1 * | 9/2005 | Penberth et al. ............. | 382/141 |
| 6,958,804 B2 | 10/2005 | Wieland et al. | |
| 7,019,908 B2 | 3/2006 | van 't Spijker et al. | |
| 7,084,414 B2 | 8/2006 | Wieland et al. | |
| 7,129,502 B2 | 10/2006 | Kruit | |
| 7,473,910 B2 | 1/2009 | Kojima | |
| 2003/0082466 A1 * | 5/2003 | del Puerto et al. ............. | 430/22 |
| 2005/0072941 A1 * | 4/2005 | Tanimoto et al. ....... | 250/492.22 |
| 2005/0084766 A1 | 4/2005 | Sandstrom | |
| 2005/0253093 A1 | 11/2005 | Gorski et al. | |
| 2006/0269116 A1 | 11/2006 | Makarovic et al. | |
| 2007/0029507 A1 * | 2/2007 | Karel Steenbrink et al. ....................... | 250/492.22 |
| 2007/0057204 A1 | 3/2007 | Kruit et al. | |
| 2007/0064213 A1 | 3/2007 | Jager et al. | |
| 2007/0075275 A1 | 4/2007 | Buller et al. | |
| 2008/0073588 A1 | 3/2008 | Kruit et al. | |
| 2008/0145767 A1 | 6/2008 | Lordi et al. | |
| 2009/0123870 A1 | 5/2009 | Usa et al. | |
| 2009/0212229 A1 | 8/2009 | Wieland et al. | |
| 2009/0261267 A1 | 10/2009 | Wieland et al. | |
| 2011/0073782 A1 | 3/2011 | Wieland | |
| 2011/0079730 A1 | 4/2011 | Wieland | |
| 2011/0216299 A1 | 9/2011 | Steenbrink et al. | |
| 2012/0091358 A1 | 4/2012 | Wieland et al. | |
| 2012/0287410 A1 * | 11/2012 | Wieland ................. | B82Y 10/00 355/18 |
| 2012/0293810 A1 * | 11/2012 | Meijer ................... | B82Y 10/00 356/623 |
| 2013/0344443 A1 * | 12/2013 | Kawamoto ......... | H01J 37/3174 430/296 |
| 2015/0028230 A1 * | 1/2015 | Platzgummer ...... | H01J 37/3026 250/492.3 |

FOREIGN PATENT DOCUMENTS

| | | |
|---|---|---|
| JP | 05275322 A | 10/1993 |
| JP | 2006 019436 A | 1/2006 |
| TW | 2004 05421 A | 4/2004 |
| TW | 2008 30055 A | 7/2008 |
| WO | WO 0135165 A1 * | 5/2001 |
| WO | WO 2004 038509 | 5/2004 |
| WO | WO 2004 040614 A2 | 5/2004 |
| WO | WO 2007 008792 | 1/2007 |
| WO | WO 2007013802 A1 | 2/2007 |

* cited by examiner

| K | Distance between scanlines (=pixel size in X) |
|---|---|
| 1 | 8.63 |
| 2 | 4.31 |
| 3 | 2.87 |
| 4 | 2.16 |
| 5 | 1.73 |

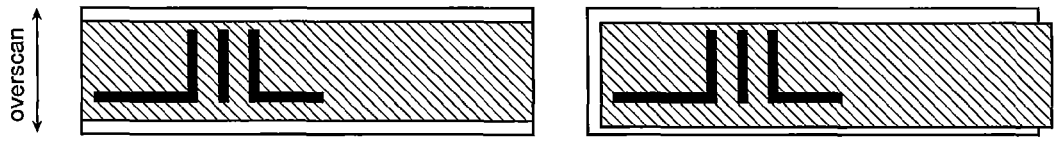
Fig. 25
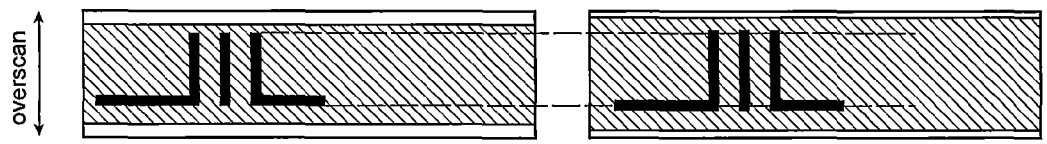
Fig. 26
| Correction | Update per | Beam/Beamlet | Range | Resolution |
|---|---|---|---|---|
| Global pattern shifting X | Field | Beam | +/-200nm | 0.1nm |
| Global pattern shifting Y | Field | Beam | +/-200nm | 0.1nm |
| Blanker timing offset (Y) | - | Beamlet | < 1 pixel | 0.1nm |
| Blanker hole (Y) offset | - | Beamlet | +/-210nm | 0.1nm |
| Dose correction | Wafer scan | Beamlet | 80% - 100% | 0.2% |
| Pattern scaling Y | Wafer scan | Beam | 1 - 1.1 | 0.0001 |
Fig. 27
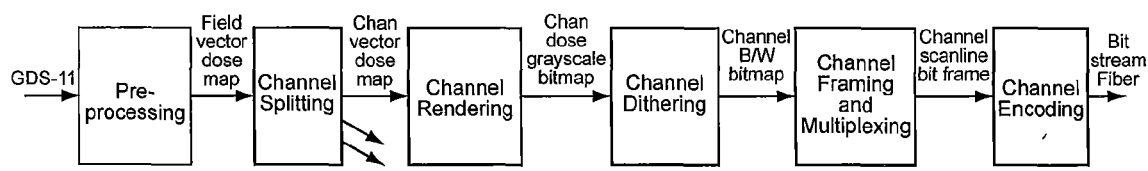
Fig. 28

| $N_{pat\_beams}$ | $\alpha_{array}$ | $P_{proj}$ | $K = P_{proj}/L_{pixX}$ $L_{pixX} = 3.5$ nm | closest factor K GCD($N_{pat\_beams}$, K) = 1 | realized $L_{pix\_X}$ [nm] | $W_{proj}$ [nm] |
|---|---|---|---|---|---|---|
| 4 | 0.464 | 26.9 | 8 | 9 | 2.99 | 82 |
| 9 | 0.322 | 19.0 | 6 | 7 | 2.71 | 154 |
| 16 | 0.245 | 14.6 | 5 | 5 | 2.92 | 222 |
| 25 | 0.197 | 11.8 | 4 | 4 | 2.95 | 287 |
| 36 | 0.165 | 9.89 | 3 | 5 | 1.98 | 350 |
| 49 | 0.142 | 8.51 | 3 | 3 | 2.84 | 413 |
| 64 | 0.124 | 7.46 | 2 | 3 | 2.49 | 476 |
| 81 | 0.111 | 6.64 | 2 | 2 | 3.32 | 538 |
| 100 | 0.100 | 5.99 | 2 | 3 | 2.00 | 600 |

*Fig.57*

DUAL PASS SCANNING

CROSS REFERENCE TO RELATED APPLICATIONS

This application is a continuation of PCT application number PCT/IB2010/052217 filed on 19 May 2010, which claims priority from U.S. provisional application No. 61/179,762 filed on 20 May 2009. Both applications are hereby incorporated by reference in their entireties.

BACKGROUND OF THE INVENTION

1. Field of the Invention

The present invention relates to a maskless charged particle lithography apparatus, and in particular to a data path, a method for implementing corrections, and a scanning method for such apparatus.

2. Description of the Related Art

A design for an integrated circuit is typically represented in a computer-readable file. The GDS-II file format (GDS stands for Graphic Data Signal) is a database file format which is the lithography industry standard for data exchange of integrated circuit or IC layout artwork. For lithography machines which use masks, a GDS-II file is typically used to manufacture a mask or set of masks which are then used by the lithography machine. For maskless lithography machines, the GDS-II file is electronically processed to put it into a format suitable for controlling the lithography machine. For charged particle lithography machines, the GDS-II file is converted into a set of control signals for controlling the charged particles beams used in the lithography process.

A preprocessing unit may be used to process the GDS-II file to generate intermediate data for the present lithography system. Depending on the architecture option this intermediate data is either a bitmap format or a description of areas in vector format. The Present lithography system uses the intermediate data to write patterns on to a wafer using a large quantity of electron beams.

The architecture of the data path needs to be defined to implement all features required to be able to scale up to a full-field high volume at the lowest cost. The data path features required for the full-field high volume machine contains different types of correction, which are required for tool calibrations and process variations.

In yet another aspect, the invention provides a method for exposing a wafer according to pattern data using a charged particle lithography machine generating a plurality of charged particle beamlets for exposing the wafer. The method comprises providing the pattern data in a vector format, rendering the vector pattern data to generate multi-level pattern data, dithering the multi-level pattern data to generate two-level pattern data, supplying the two-level pattern data to the charged particle lithography machine, and switching on and off the beamlets generated by the charged particle lithography machine on the basis of the two-level pattern data, wherein the pattern data is adjusted on the basis of corrective data.

Adjusting the pattern data may comprise adjusting the vector pattern data on the basis of first corrective data, adjusting the multi-level pattern data on the basis of second corrective data, and/or adjusting the two-level pattern data on the basis of third corrective data.

Rendering the vector pattern data may comprise defining an array of pixel cells, and assigning multi-level values to the pixel cells based on relative coverage of the pixel cells by features defined by the vector pattern data. Dithering the multi-level pattern data may comprise forming the two-level pattern data by application of error diffusion on the multi-level pattern data. The error diffusion may comprise distributing quantization error in a pixel of the multi-level pattern data to one or more adjacent pixels of the multi-level pattern data. Application of error diffusion may include defining an array of pixels, dividing the array of pixels into portions, each portion being assigned to be exposed by a different beamlet, determining error diffusion parameter values for each portion, and assigning a two-level value to the pixels within each portion using error diffusion parameter values. The error diffusion parameter values may comprise a threshold value and a weight value for the higher level of the two-level value. The error diffusion parameter values may further comprise a weight value for the lower level of the two-level value. The threshold value may be equal to 50% of the high level pixel value.

The threshold value equals the average of the high level pixel value and the low level pixel value. Determining the error diffusion parameter values may be based on beamlet current measurements. The error diffusion parameter value may be a threshold value, and assigning a two-level value to the pixel cells within a portion may be based on comparison with the threshold value determined for the portion. The error diffusion parameter may be a value representing the higher level of the two-level value, and it may be a one-dimensional error diffusion or a two-dimensional error diffusion. The application of error diffusion may be restricted by disallowing diffusion towards one or more pixels with a multi-level value equal to or below a further threshold value, and the further threshold value may be equal to zero.

The application of error diffusion may be restricted by disallowing diffusion to one or more pixels that are located outside the features described in the vector pattern data.

The first corrective data may comprise a proximity effect correction, which may comprise a dose correction, a shape correction, or a combination of dose correction and shape correction. The first corrective data may comprise a resist heating correction, a correction to compensate for variation in the position of one or more of the beamlets, a correction to compensate for errors in the positioning of a field of the wafer with respect to the wafer, and/or a correction to compensate for errors in the size of a field of the wafer.

The correction may comprise an adjustment of the vector pattern data that results in shifting the multi-level pattern data by less than a full pixel. The wafer may be moved in a mechanical scan direction during exposure of the wafer, and the correction may comprise an adjustment of the vector pattern data that results a shift of the multi-level pattern data having a component in both the mechanical scan direction and a direction substantially perpendicular to the mechanical scan direction. The first corrective data may comprise a correction to compensate for variation in the transmission time of the beamlet control signals to the lithography machine.

The method may comprise switching the beamlets on and off by beamlet blanker electrodes in a beamlet blanker array, each beamlet blanker electrode receiving a beamlet control signal, wherein the first corrective data comprises a correction to compensate for a difference in the time when beamlet control signals are received by the beamlet blanker electrodes. The beamlets may be deflected to scan the surface of the wafer, and the first corrective data may comprise a correction to compensate for variations in the amount of deflection experienced by different beamlets.

Dithering the multi-level pattern data may comprise assigning a high value or a low value for each corresponding multi-level value of the multi-level pattern data based on comparison with a threshold value, and a quantization error may be calculated by subtracting a weight of the high level value or a weight of the low level value from the multi-level pattern data, the weight of the high level value being defined on the basis of the second corrective data. The weight of the low value may be defined on the basis of the second corrective data. The threshold value may be defined on the basis of the second corrective data. Dithering the multi-level pattern data may comprise determining a two-level value by comparing a corresponding multi-level value of the multi-level pattern data to a threshold value, and wherein adjusting the pattern data comprises adjusting the threshold value on the basis of the second corrective data.

The second corrective data may comprise a correction to compensate for variation in the position of one or more beamlets, a correction to compensate for errors in the positioning of a field of the wafer with respect to the wafer, and/or a correction to compensate for errors in the size of a field of the wafer. The correction may comprise an adjustment of the multi-level pattern data equivalent to shifting the multi-level pattern data by less than a full pixel.

The wafer may be moved in a mechanical scan direction during exposure of the wafer, and the correction may comprise an adjustment of the multi-level pattern data that results a shift having a component in both the mechanical scan direction and a direction substantially perpendicular to the mechanical scan direction. The second corrective data may comprise a correction for realizing a soft edge between areas exposed by different beamlets or groups of beamlets. The soft edge may be made by multiplying the multi-level pattern data with a soft edge factor, the soft edge factor increasing linearly with the distance to the edge until a maximum value is reached. The maximum value may be 1, a starting value of the factor may be 0 at an edge, and the soft edge may have a width of about 0.5 to 1.5 micron.

The third corrective data may comprise a correction to compensate for variation in the position of one or more beamlets, a correction to compensate for errors in the positioning of a field of the wafer with respect to the wafer, and/or a correction to compensate for errors in the size of a field of the wafer. The wafer may be moved in a mechanical scan direction during exposure of the wafer, and the third corrective data may comprise a full pixel shift in the mechanical scan direction. The wafer may be moved in a mechanical scan direction during exposure of the wafer, and the third corrective data may comprise a full pixel shift in a direction substantially perpendicular to the mechanical scan direction.

The step of providing pattern data in a vector format may comprise providing design data describing a plurality of layers of a device design, and transforming a layer of the design data to generate two dimensional pattern data in vector format. The design data may comprise data in a GDS-II format or an OASIS format. The vector pattern data may comprise vector data describing the shape of features for patterning on the wafer and dose values associated with the features. The vector pattern data may comprise vector data describing the shape of features for patterning on the wafer and an array of dose values for corresponding areas on the wafer.

The multi-level pattern data may comprise an array of multi-level values assigned to pixel cells, and the multi-level pattern data may comprise gray scale bitmap data. The two-level pattern data may comprise black/white bitmap data.

The rendering and rasterizing steps may be performed by off-line processing whereby the rendering and rasterizing of pattern data for the whole wafer is completed before the wafer scan begins. The rendering and rasterizing steps may be performed once per design. The rendering and rasterizing steps may be performed by in-line processing, whereby the rendering and rasterizing of pattern data for a first set of fields of the wafer is completed before a scan of the first set of fields begins, while the rendering and rasterizing of pattern data for the remaining fields of the wafer continues during the scan of the first set of fields. The first set of fields and the remaining fields may be such that they do not overlap. The first set of fields and the remaining fields together may comprise the complete area of the wafer to be exposed.

The first set of fields may be exposed in a first scan of the wafer and the remaining fields exposed in a second scan of the wafer. A first subset of the beamlets may be allocated for exposing the first set of fields and a second subset of the beamlets may be allocated for exposing the remaining fields. The rendering and rasterizing steps may be performed once per wafer, and may be performed by real-time processing, whereby the rendering and rasterizing for a first set of fields of the wafer continues during the scan of the first set of fields. The rendering and rasterizing steps may be performed once per field of the wafer, and may be performed during exposure of the wafer.

In a further aspect of the invention, a charged particle lithography system for exposing a wafer according to pattern data is provided. The system comprises an electron optical column for generating a plurality of electron beamlets for exposing the wafer, the electron optical column including a beamlet blanker array for switching the beamlets on or off, a data path for transmitting beamlet control data for control of the switching of the beamlets, and a wafer positioning system for moving the wafer under the electron optical column in an x-direction. The wafer positioning system is provided with synchronization signals from the data path to align the wafer with the electron beams from the electron-optical column. The data path further comprises one or more processing units for generating the beamlet control data and one or more transmission channels for transmitting the beamlet control data to the beamlet blanker array.

The transmission system may comprise a plurality of transmission channels, each transmission channel for transmitting data for a corresponding group of beamlets. The beamlets may be arranged in a plurality of groups, each transmission channel for transmitting beamlet control data for one of the groups of beamlets. The data path may comprise a plurality of multiplexers, each multiplexer for multiplexing beamlet control data for a group of beamlets. The system may further comprise a plurality of demultiplexers, each demultiplexer for demultiplexing beamlet control data for a group of beamlets. The data path may comprise electrical-to-optical conversion devices for converting the beamlet control data generated by the processing units to an optical signal for transmission to the charged particle lithography machine.

The transmission channels may comprise optical fibers for guiding the optical signal, and the beamlet blanker array may comprise optical-to-electrical conversion devices for receiving the optical signal and converting it to an electrical signal for control of the beamlets. The transmission system may comprise an array of lenses and a mirror, the array of lenses for guiding the optical signal onto the mirror, and the mirror for reflecting the optical signal onto the beamlet blanker array of the charged particle lithography machine.

The system may further comprise a first number of processing units sufficient for processing the pattern data to generate first beamlet control data for a first subset of the beamlets allocated for exposing a first portion of the wafer. The system may further comprise a cross-connect switch for connecting the processing units to a subset of the transmission channels.

The beamlets may be arranged in a plurality of groups, each processing unit for generating beamlet control data for any one group of beamlets, and each transmission channel dedicated for transmitting beamlet control data for one of the groups of beamlets. Seven processing units may be provided for every twelve transmission channels.

The charged particle lithography system may have a first subset of the beamlets allocated for exposing a first portion of the wafer and a second subset of the beamlets for exposing a second portion of the wafer, and the cross-connect switch may connect the processing units to a first subset of the transmission channels corresponding to the first subset of the beamlets for a scan of the first portion of the wafer, and connect the processing units to a second subset of the transmission channels corresponding to the second subset of the beamlets for a scan of the second portion of the wafer. The first number of processing units may be sufficient for processing the pattern data to generate the first beamlet control data and processing the pattern data to generate the second beamlet control data, but not sufficient for processing the pattern data to generate both the first and second beamlet control data at the same time.

The lithography system may be adapted for exposing the wafer in a dual-pass scan in which a first portion of the wafer is exposed according to first pattern data and subsequently a second portion of the wafer is exposed according to second pattern data, and the processing units may comprise memory, the memory being divided into a first memory portion for storing the first pattern data and a second memory portion for storing the second pattern data, and during exposure of the second portion of a wafer of a current batch of wafers, first pattern data for a wafer of a next batch of wafers may be loaded into the first memory portion.

In another aspect the invention comprises a method for exposing a wafer in a charged particle lithography system. The method comprises generating a plurality of charged particle beamlets, the beamlets arranged in groups, each group comprising an array of beamlets, moving the wafer under the beamlets in a first direction at a wafer scan speed, deflecting the beamlets in a second direction substantially perpendicular to the first direction at a deflection scan speed, and adjusting the wafer scan speed to adjust a dose imparted by the beamlets on the wafer. The beamlets may expose the wafer using a parallel projection writing strategy, and the deflection scan speed may comprise a beamlet scan speed and a fly-back speed.

Each array of beamlets may have a projection pitch Pproj in the first direction between beamlets of the array, and a group distance equal to the projection pitch Pproj multiplied by the number of beamlets in the array, and wherein a scan step, equal to the relative movement in the x-direction between the beamlets and the wafer between each scan, equals the group distance divided by an integer K. The scan step may be adjusted by adjusting a beamlet scan speed and/or a fly-back speed, or by adjusting a beamlet deflection period, the beamlet deflection period comprising the time for one beamlet scan in the y-direction and a beamlet fly-back time. The deflection period may be equal to the group distance divided by integer K, divided by the beamlet scan speed. The method may be such that K satisfies a requirement that the greatest common denominator of K and the number of beamlets in each array, is one.

In yet another aspect the invention relates to a method for exposing a wafer in a charged particle lithography system. The method comprises generating a plurality of charged particle beamlets, the beamlets arranged in groups, each group comprising an array of beamlets, moving the wafer under the beamlets in an first direction at a wafer scan speed, deflecting the beamlets in a second direction substantially perpendicular to the first direction at a deflection scan speed, switching the beamlets on and off according to pattern data as the beamlets are deflected to expose pixels onto the wafer, and adjusting the wafer scan speed relative to the deflection scan speed to adjust the pixel width in the first direction.

The beamlets may expose the wafer using a parallel projection writing strategy, and the deflection scan speed comprises a beamlet scan speed and a fly-back speed. Each array of beamlets may have a projection pitch Pproj in the first direction between beamlets of the array, and a group distance equal to the projection pitch Pproj multiplied by the number of beamlets in the array, and a scan step, may be equal to the relative movement in the x-direction between the beamlets and the wafer between each scan, equals the group distance divided by an integer K. The scan step may be adjusted by adjusting a beamlet scan speed and/or a fly-back speed. The scan step may be adjusted by adjusting a beamlet deflection period, the beamlet deflection period comprising the time for one beamlet scan in the y-direction and a beamlet fly-back time. The deflection period may be equal to the group distance divided by integer K, divided by the beamlet scan speed. The method may be such that K satisfies a requirement that the greatest common denominator of K and the number of beamlets in each array, is one.

In yet another aspect, the invention provides a method for exposing a wafer in a charged particle lithography system. The method comprises generating a plurality of charged particle beamlets, the beamlets arranged in groups, each group comprising an array of beamlets, creating relative movement in a first direction between the beamlets and the wafer, deflecting the beamlets in a second direction substantially perpendicular to the x-direction at a deflection scan speed, so that each beamlet exposes a plurality of scan lines on the wafer, and adjusting the relative movement in the first direction and the deflection of the beamlets in the second direction to adjust a dose imparted by the beamlets on the wafer. Each array of beamlets has a projection pitch Pproj in the first direction between beamlets of the array, and a group distance equal to the projection pitch Pproj multiplied by the number of beamlets in the array, and the relative movement in the x-direction between the beamlets and the wafer between each scan equals the group distance divided by an integer K.

The value K may be selected so that the greatest common denominator of K and the number of beamlets in each array, is one. A width of the scan lines may be the projection pitch Pproj divided by integer K. The beamlets may be switched on and off according to pattern data as the beamlets are deflected to expose pixels onto the wafer, and a width of the pixels in the first direction may be the projection pitch Pproj divided by integer K.

In yet a further aspect, the invention relates to a method for defining features for writing on a target using a lithography process. The method comprises defining an array of cells, the features occupying one or more of the cells, and describing for each cell any corners of the features that fall within the cell. The corner may be described by a corner position, a first vector, and a second vector, the two vectors originating from the position. The corner positions may be described by two coordinates, and/or by Cartesian coordinates. Each vector may be described by an orientation code specifying a direction for the vector.

The feature may be defined as the area bounded by the vectors and the cell boundaries when moving in a predetermined direction from the first vector to the second vector, such as a clockwise direction. A pseudo corner may be defined for a feature falling partly within a cell but otherwise having no corners within the cell. The pseudo corner may be described by first and second vectors oriented at 180 degrees with respect to each other.

The vectors may be selected to only have a direction parallel to a cell boundary or perpendicular to a cell boundary, and/or to only have a direction parallel to a cell boundary, perpendicular to a cell boundary, or at 45 degrees to a cell boundary.

A minimum feature pitch may be defined and the cells may have a size equal to or less than the minimum feature pitch. The cells may have a size equal to or less than half of the square root of two multiplied by the minimum feature pitch. The minimum feature pitch may be defined as a size equal to or greater than the size of the cells multiplied by the square root of two.

For features or part of features having an edge oriented at 45 degrees to a cell boundary, a minimum feature pitch may be defined having a size equal to or greater than the size of the cells multiplied by the square root of two. A maximum number of corners may be defined for each cell. Each cell may contain one or more features, and/or a portion of one of more features. Each cell may comprise pattern data for part of a field of the wafer, or pattern data of a stripe of a field of the wafer.

In another aspect, the invention comprises a method of processing pattern data for use in a lithography process, the method comprising providing the pattern data in a vector format, transforming the vector pattern data a generate pattern data in a cell based format, and rasterizing the cell based pattern data to generate two-level pattern data for use in the lithography process. The cell based pattern data may comprise cell data describing features occupying one or more of the cells of an array of cells, the cell data describing for each cell any corners of the features that fall within the cell. Rasterizing the cell based pattern data may be performed in real-time processing while the lithography process is being performed. Rasterizing the cell based pattern data may comprise rendering the cell based pattern data to generate multi-level pattern data, and dithering the multi-level pattern data to generate the two-level pattern data.

In yet another aspect, the invention provides a method for exposing a wafer according to pattern data using a charged particle lithography machine generating a plurality of charged particle beamlets for exposing the wafer, the method comprising providing the pattern data in a vector format, transforming the vector pattern data a generate pattern data in a cell based format, rasterizing the cell based pattern data to generate two-level pattern data, streaming the two-level pattern data to a beamlet blanker array for switching on and off the beamlets generated by the charged particle lithography machine, and switching on and off the beamlets on the basis of the two-level pattern data.

The cell based pattern data may comprise cell data describing features occupying one or more of the cells of an array of cells, the cell data describing for each cell any corners of the features that fall within the cell. Rasterizing the cell based pattern data may be performed in real-time processing while the lithography machine is exposing the wafer. Rasterizing the cell based pattern data may comprise rendering the cell based pattern data to generate multi-level pattern data, and dithering the multi-level pattern data to generate the two-level pattern data.

BRIEF SUMMARY OF THE INVENTION

The present invention provides a method for exposing a wafer using a plurality of charged particle beamlets. The method comprises identifying non-functional beamlets among the beamlets, allocating a first subset of the beamlets for exposing a first portion of the wafer, the first subset excluding the identified non-functional beamlets, performing a first scan for exposing the first portion of the wafer using the first subset of the beamlets, allocating a second subset of the beamlets for exposing a second portion of the wafer, the second subset also excluding the identified non-functional beamlets, and performing a second scan for exposing the second portion of the wafer using the second subset of the beamlets, wherein the first and second portions of the wafer do not overlap and together comprise the complete area of the wafer to be exposed.

The first and second subsets may be substantially equal in size, and the first and second portions may be substantially equal in size. The first and second portions may each comprise selected stripes from a plurality of fields of the wafer. The step of identifying the non-functional beamlets may comprise measuring the beamlets to identify failed or out-of-specification beamlets. Measuring the beamlets may comprise directing the plurality of beamlets onto a sensor and detecting presence of the beamlets, directing the plurality of beamlets onto a sensor and measuring beamlet position, scanning the plurality of beamlets onto a sensor and measuring beamlet deflection, and/or scanning the plurality of beamlets onto a sensor and measuring beamlet current.

The plurality of beamlets may be divided into groups, each group of beamlets for exposing a corresponding stripe within each field of the wafer. The position of the wafer with respect to the plurality of beamlets may be different at the beginning of the second scan than at the beginning of the first scan.

The method may further comprise calculating a first wafer position of the wafer with respect to the plurality of beamlets, moving the wafer to the first position before beginning the first scan, calculating a second wafer position of the wafer with respect to the plurality of beamlets, and moving the wafer to the second position before beginning the second scan, wherein the first position in conjunction with the allocation of the first subset of beamlets to the first portion of the wafer, and the second position in conjunction with the allocation of the second subset of beamlets to the second portion of the wafer, results in the first and second portions being exposed by beamlets of only one of the subsets of beamlets.

The method may alternatively further comprise executing an algorithm to determine a first position in conjunction with the allocation of the first subset of beamlets to the first portion of the wafer, and a second position in conjunction with the allocation of the second subset of beamlets to the second portion of the wafer, that will result in the first and second portions being exposed by beamlets of only one of the subsets of beamlets.

The method may include switching the beamlets on and off by a beamlet blanker array during each scan according to beamlet control data. The beamlet control data may comprise first beamlet control data for switching the first subset of beamlets during the first scan, and second beamlet control data for switching the second subset of beamlets during the second scan, and wherein the method further comprises transmitting the first beamlet control data to the beamlet blanker array during the first scan and transmitting the second beamlet control data to the beamlet blanker array during the second scan.

The method may further comprise processing pattern data to generate the beamlet control data, and wherein the second beamlet control data is generated during the first scan. The processing may comprise rasterizing the pattern data to generate the beamlet control data, and wherein the rasterizing for the second beamlet control data is performed during the first scan. The processing of the pattern data may comprise preparing the beamlet control data for streaming to the beamlet blanker array, and wherein the second beamlet control data is prepared for streaming to the blanker array during the first scan.

The method may further comprise processing pattern data to generate the beamlet control data, and the first beamlet control data of the next wafer to be exposed may be generated during the second scan of the wafer currently being exposed. Processing the pattern data may comprise rasterizing the pattern data to generate the beamlet control data, and the rasterizing for the first beamlet control data of the next wafer to be exposed may be performed during the second scan of the wafer currently being exposed. Processing the pattern data may comprise preparing the beamlet control data for streaming to the beamlet blanker array, and the first beamlet control data of the next wafer to be exposed may be prepared for streaming to the blanker array during the second scan of the wafer currently being exposed.

The method may further comprise providing a first number of processing units sufficient for processing the pattern data to generate the first beamlet control data, providing a second number of channels for transmitting the beamlet control data to the beamlet blanker array, each channel transmitting data for a corresponding group of beamlets, connecting the processing units to the channels corresponding to the first subset of beamlets for exposing the first portion of the wafer, processing the pattern data in the processing units to generate the first beamlet control data, and transmitting the first beamlet control data to the beamlet blanker array.

The method may further comprise providing a third number of processing units sufficient for processing the pattern data to generate the second beamlet control data, providing a fourth number of channels for transmitting the beamlet control data to the beamlet blanker array, each channel transmitting data for a corresponding group of beamlets, connecting the processing units to the channels corresponding to the second subset of beamlets for exposing the second portion of the wafer, processing the pattern data in the processing units to generate the second beamlet control data, and transmitting the second beamlet control data to the beamlet blanker array.

The first number of processing units may be sufficient for processing the pattern data to generate the first beamlet control data and processing the pattern data to generate the second beamlet control data, but not sufficient for processing the pattern data to generate both the first and second beamlet control data at the same time. Seven processing units may be provided for every twelve channels.

The invention in another aspects provides a lithography system comprising a charged particle optics column including a blanker for generating charged particle beamlets for projection of a pattern onto a target, a target support, the column and target support being included moveable relative to one another in the system, the system further comprising a data path for processing and transferring pattern data to a blanker of the column, the blanker arranged capable of switching each of the beamlets on and off in respect of projection on the target, the datapath comprising processing units for processing pattern data into projection data related to a stripe on the target forming a projection area of a beamlet at relative movement of target support and column, the data path thereto comprising channels connected to the blanker for individually controlling a beamlet by the projection data, the system further being provided with a switch for switching connection a processing unit between different channels.

BRIEF DESCRIPTION OF THE DRAWINGS

Various aspects of the invention and certain examples of embodiments of the invention are illustrated in the drawings in which:

FIGS. 25 and 26 are diagrams illustrating an example of x and y pattern shift;

FIG. 27 is a table of typical parameters and ranges for different types of corrections;

FIG. 28 is a simplified functional block diagram of a data path;

FIG. 57 is a table of pixel size and grid width in dependence on the number of beamlets per patterned beam ($N_{pat\_beams}$), the array tilt angle ($\alpha_{array}$), the projection pitch ($P_{proj}$), and K factor;

DESCRIPTION OF ILLUSTRATIVE EMBODIMENTS

The following is a description of various embodiments of the invention, given by way of example only and with reference to the drawings.

Charged Particle Lithography System

Figure 1:
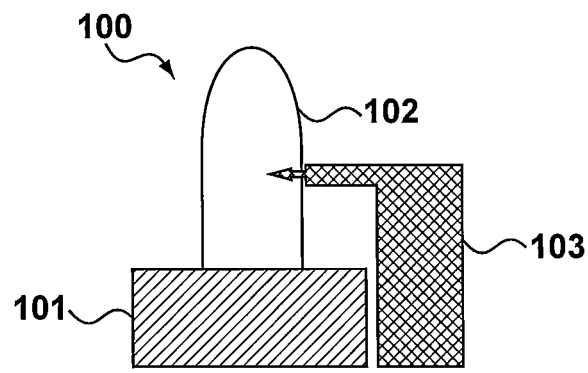
FIG. 1 is a conceptual diagram showing a maskless lithography system.

FIG. 1 is a conceptual diagram showing a charged particle lithography system 100 divided into three high level subsystems: a wafer positioning system 101, an electron optical column 102, and data path 103. The wafer positioning system 101 moves the wafer under the electron optical column 102 in the x-direction. The wafer position system 101 is provided with synchronization signals from the data path 103 to align the wafer with the electron beamlets generated by the electron-optical column 102.

Figure 2A:
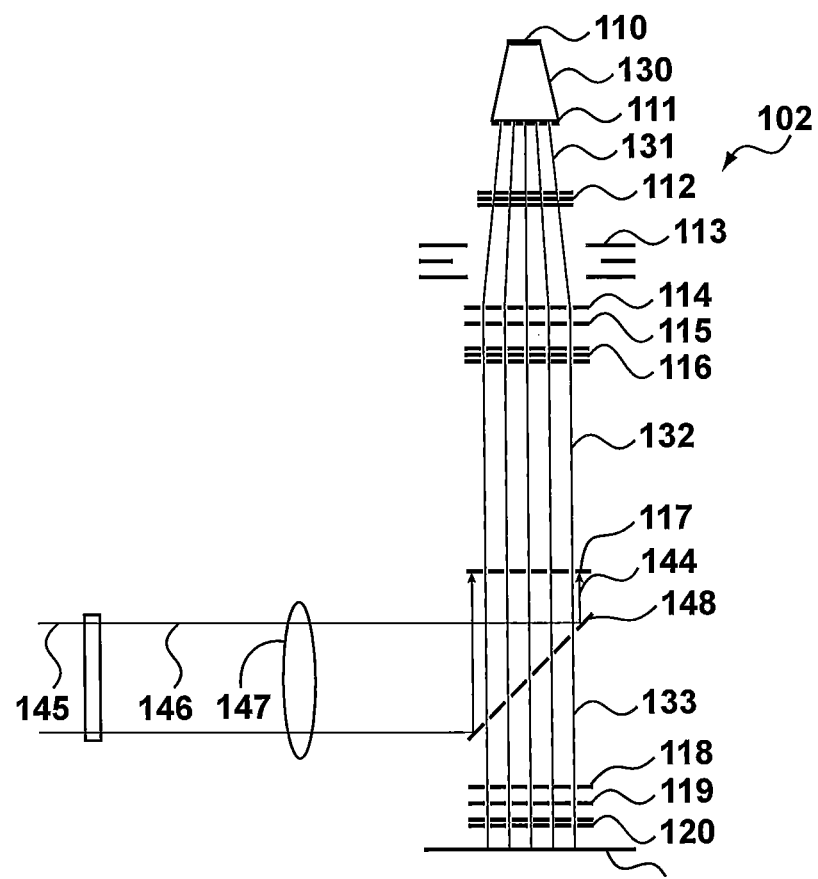
FIG. 2A is a simplified schematic drawing of an embodiment of a charged particle lithography system.

FIG. 2A shows a simplified schematic drawing of an embodiment of a charged particle lithography system 100 showing details of the electron optical column 102. Such lithography systems are described for example in U.S. Pat. Nos. 6,897,458 and 6,958,804 and 7,019,908 and 7,084,414 and 7,129,502, U.S. patent application publication no. 2007/0064213, and co-pending U.S. patent application Ser. Nos. 61/031,573 and 61/031,594 and 61/045,243 and 61/055,839 and 61/058,596 and 61/101,682, which are all assigned to the owner of the present application and are all hereby incorporated by reference in their entirety.

In the embodiment shown in FIG. 2A, the lithography system comprises a charged particle source 110, e.g. an electron source for producing an expanding electron beam 130. The expanding electron beam 130 impinges on an aperture array 111, which blocks part of the beam to create a plurality of beamlets 131. The system generates a large number of beamlets, preferably in the range of about 10,000 to 1,000,000 beamlets.

The electron beamlets 131 pass through a condenser lens array 112 which focuses the electron beamlets 131. The beamlets 131 are collimated by collimator lens system 113. The collimated electron beamlets pass through XY deflector array 114, a second aperture array 115, and second condenser lens array 116. The resulting beamlets 132 next pass through beam blanker array 117, comprising a plurality of blankers for deflecting one or more of the beamlets. The beamlets pass through mirror 143 and arrive at beam stop array 118, which has a plurality of apertures. The beamlet blanker array 117 and beam stop array 118 operate together to switch the beamlets on or off, by either blocking beamlets or letting them pass. The beamlet blanker array 117 can deflect a beamlet so that it will not pass through the corresponding aperture in beam stop array 118, but instead will be blocked. If beamlet blanker array 117 does not deflect a beamlet, then it will pass through the corresponding aperture in beam stop array 118. The undeflected beamlets pass through the beam stop array, and through a beam deflector array 119 and projection lens arrays 120.

Beam deflector array 119 provides for deflection of each beamlet 133 in the X and/or Y direction, substantially perpendicular to the direction of the undeflected beamlets, to scan the beamlets across the surface of target 104. This deflection is separate from the deflection used by the beamlet blanker array to switch the beamlets on or off. Next, the beamlets 133 pass through projection lens arrays 120 and are projected onto target 104. The projection lens arrangement preferably provides a demagnification of about 100 to 500 times. The beamlets 133 impinge on the surface of target 104 positioned on a moveable stage of the wafer positioning system 101. For lithography applications, the target usually comprises a wafer provided with a charged-particle sensitive layer or resist layer.

The representation shown in FIG. 2A is much simplified. In a preferred embodiment, a single electron beam is first partitioned into many smaller subbeams which are then split into an even larger number of beamlets. Such a system is described in U.S. patent application Ser. 61/045,243, which is hereby incorporated by reference in its entirety.

Figure 3:
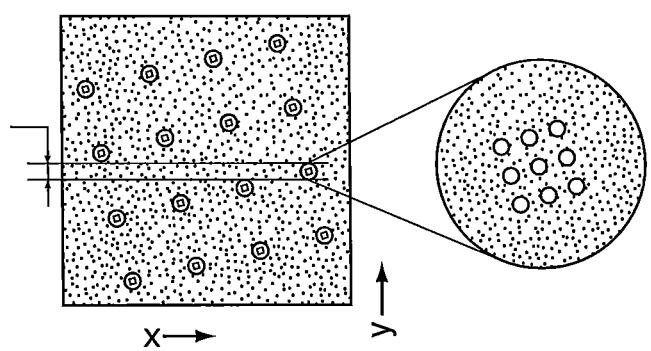
FIGS. 3 and 4 show a portion of a beamlet blanker array.
Figure 4:
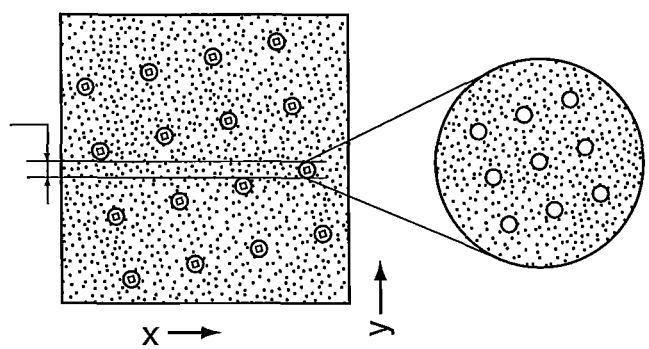

In this system each subbeam is split into a number of beamlets which can be considered a patterned beam. In one embodiment, each subbeam is split into 49 beamlets arranged in a 7×7 array. The beamlet blanker array preferably comprises one hole with an associated blanker electrode for each beamlet, to enable on/off switching of each individual beamlet. FIGS. 3 and 4 show a portion of a beamlet blanker array for an embodiment having 9 beamlets per patterned beam, each group of beamlets arranged in a 3×3 array. The arrangement of beamlets in a patterned beam and writing strategies are described for example in U.S. patent application 61/058,596, which is hereby incorporated by reference in its entirety.

The beam deflector array and projection lens array preferably include only one hole and lens for each patterned beam (e.g. one hole or lens for each group of 49 beamlets making up one patterned beam). Beamlets are typically combined (interleaved/multiplexed) in a group that writes a singe stripe.

Data Path Architecture

Figure 2B:
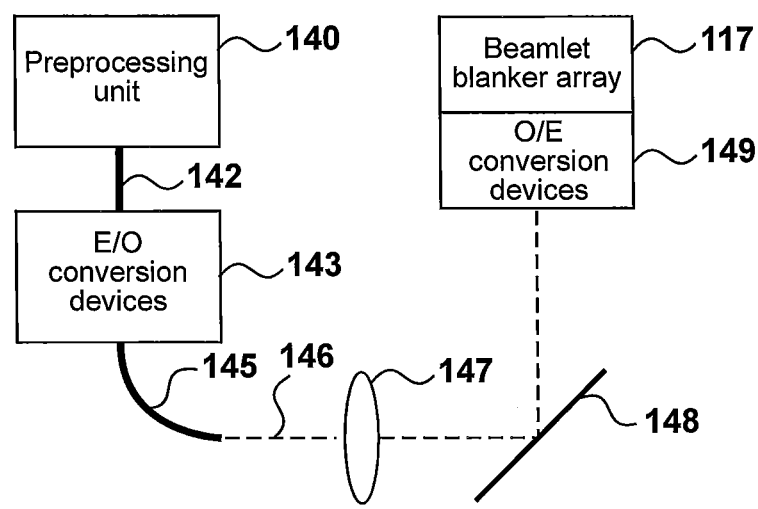
FIG. 2B is a simplified diagram of elements in a data path.

A simplified block diagram of one embodiment of a data path 103 is shown in FIG. 2B, and a portion of the data path also appears in FIG. 2A. The switching of beamlet blanker array 117 is controlled via the data path. A preprocessing unit 140 receives information describing the layout of the device to be manufactured by the lithography machine. This information is typically provided in a GDS-II file format. The preprocessing unit performs a series of transformations of the GDS-II file to generate on/off control signals to control the beamlet blanker array 117.

The control signals are transmitted to electro-optical conversion devices 143, such as laser diodes, to convert the electrical control signals into optical signals. The optical control signals are guided through optical fibers 145. The light beams 146 at the output of the fibers are guide through an array of lenses 147 onto a holey mirror 148. From the mirror, the light beams are reflected onto the underside of beam blanker array 117. The individual light beams are directed onto a plurality of optical-to-electrical conversion devices, such as photo diodes, on the underside of the beam blanker array 117. Preferably, for every optical fiber 145 there is a photo diode on the beamlet blanker array. The photo diodes operate to activate the individual beam blanker electrodes to control the deflection of beamlets 132 to switch the individual beamlets on or off.

The control signals for controlling the individual beamlet blanker electrodes are preferably multiplexed, so that each light beam 146 carries control signals for a channel comprising a number of beamlets that share one optical fiber and photo diode. The multiplex light beams are received by photo diodes and converted into an electrical signal. The beamlet blanker array 117 includes logic for demultiplexing the control signals received by the photo diodes to derive control signals for individually controlling a number of beamlet blanker electrodes. In a preferred embodiment, individual control signals for controlling 49 beamlets of one patterned beam, are time multiplexed for transmission over a single optical fiber, and are received by a single photo diode on the beamlet blanker array.

Figure 12:
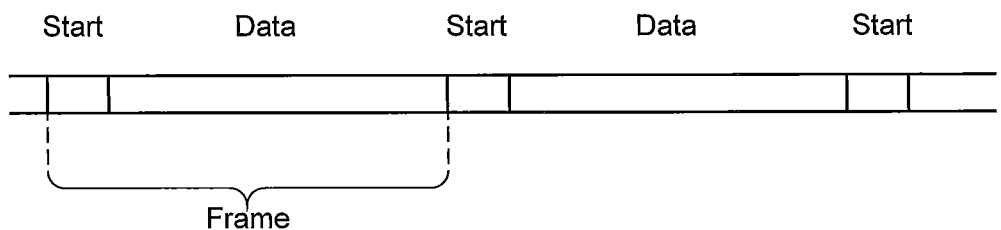
FIG. 12 is a diagram of a frame start indicator bit.

In addition to multiplexing, the beamlet control signals may also be arranged in frames for transmission and may have synchronisation bits and additional encoding to improve transmission, e.g. using an encoding technique to achieve frequent signal transitions, to prevent using the laser diodes and photo diodes in a DC-coupled fashion. By forcing transitions, the clock signal is automatically distributed in the optical signal. FIG. 12 shows an example of a beamlet control signal with framing, synchronisation bits, and multiplexed control bits for 49 beamlets (of one patterned beam).

Closer to the wafer the beam deflector array 119 is used to deflect the electron beamlets in the y-direction (and also a small deflection in the x-direction) to achieve scanning of the electron beamlets over the surface of the wafer 104. In the described embodiment, the wafer 104 is mechanically moved in the x-direction by the wafer positioning system 101, and the electron beamlets are scanned across the wafer in a y-direction substantially perpendicular to the x-direction. When writing data, the beamlets are deflected slowly (compared to the fly-back time) in the y-direction. At the end of a sweep, the beamlets are moved quickly back to the start position of the y-range (this is referred to as the fly-back). The beam deflector array 119 receives timing and synchronization information from the data path 103.

Channels

The data path may be divided into a number of channels. A channel is an electronic data path from the preprocessing unit to the lithography system. In one embodiment a channel comprises an electrical-to-optical converter (e.g. a laser diode), a single optical fiber for transmitting beamlet control signals, and an optical-to-electrical converter (e.g. a photo diode). This channel may be assigned to transmit the control signals for a single patterned beam comprising a number of individual beamlets (e.g. 49 beamlets making up one patterned electron beam). One patterned beam may be used for writing a single stripe on the wafer. In this arrangement, a channel represents the data path components dedicated to control of one patterned beam comprising multiple beamlets (e.g. 49 beamlets) and carrying the beamlet control signals for writing one stripe according to the pattern data. A subchannel represents the data path components dedicated to control of a single beamlet within a patterned beam.

Data Path Processing

The data path 101 transforms the layout data into on/off signals for controlling the electron beamlets. As mentioned above, this transformation may be performed in a preprocessing unit 140 performing a series of transformations on the layout data, typically in the form of a GDS-II or similar file. This process typically includes flattening/preprocessing, rasterization, and multiplexing steps.

The flattening/preprocessing step transforms the layout data format into a dose map. The dose map describes areas on the wafer in vector format and associated dose rate values. This step may include some preprocessing such as proximity effect correction. Because of the complexity of the preprocessing, this step is preferably performed offline. The rasterization step transforms the dose map into a stream of control (on/off) signals. The multiplexing step packages the beamlet control signals according to a multiplexing scheme.

The process for writing wafers in the lithography machine may be roughly described in the sequence of the following steps. A wafer 104 is installed on the stage of the wafer positioning system 101, the column 102 is maintained in vacuum conditions, and the beamlets are calibrated. The wafer is aligned mechanically, and per field alignments (offsets) are calculated. The wafer is moved in the +x-direction by the stage and the column starts writing the first field. When the leading row of holes of the beamlet blanker array passes a field boundary, offset corrections are installed for the next field. Thus, while the first field is still being written, the lithography system will start to write the next field. After writing the last field in a row, the stage will move to position the next row of fields on the wafer under the beamlet blanker array. A new run will start while the stage moves in the −x-direction. The direction of the scan deflection preferably does not change.

Corrections

The data processing performed by the data path may provide for a number of different adjustments to the beamlet control signals to make various types of corrections and compensations. These may include, for example, proximity correction and resist heating correction to compensate for effects occurring as a result of the properties of the resist used. The data adjustments may also include corrections which are designed to compensate for errors or failures occurring in the lithography machine.

In a preferred embodiment of the charged particle lithography machine, there are no facilities built into the lithography machine for adjusting individual electron beamlets to correct for errors in beamlet position, size, current, or other characteristics of the beams. Faults such as misalignment or failure of a beamlet, low or high beamlet current, incorrect deflection of the beamlet. Such faults can be the result of defects or tolerance variations in the manufacturing of the lithography machine, dirt or dust blocking beamlets or becoming charged and deflecting beamlets, failure or deterioration in the components of the machine, etc. The lithography machine omits corrective lenses or circuits for making individual corrections to beamlets to avoid the additional complexity and cost involved in incorporating additional components into the electro-optical column for making physical beam corrections, and to avoid the increase in size of the column necessitated by incorporating such additional components. However, manipulation of the beamlet control signals and/or additional scans of the wafer can compensate for these types of problems. Failures occurring in the data path may also be corrected by manipulation of the control signals in conjunction with rescanning the wafer. Various methods for making these corrections are described below.

Redundancy Scan

The embodiment of the charged particle lithography machine described above has a large number of optical fibers and laser diodes in the data path, a large number of electrostatic lenses and deflectors for each patterned beam, and a very large number of blanker elements in the beamlet blanker array. There is a significant chance that a failure may occur in some of these components or that they will deteriorate or be affected by contaminants so that they do not perform within specification. To extend the time between maintenance of the system as much as possible, a check may be performed periodically to identify failing or out of specification beamlets or data channels. This check may be performed before each wafer scan, before each first scan of a wafer, or at some other convenient moments. The check may include one or more beam measurements, including for example as described in co-pending U.S. application 61/122,591, which is hereby incorporated by reference in its entirety. The primary goal of the redundancy scan is to compensate for failures occurring in the EO column, since replacement of failed parts in the column is time consuming. However, the redundancy scan may also be used to cope with failures in the data path. For example, a failed optical fiber of laser diode in one channel may be corrected by switching that channel off and using another channel during the redundancy scan to write the stripes that would have written by the failed channel.

Where a failed or out-of-spec beamlet is detected, the beamlet may be switched off so that the stripe that would have been exposed by that beamlet is not written. A second scan, referred to as a redundancy scan, is then used to write the wafer stripe that was omitted during the first scan. In a patterned-beamlet system such as described above, the complete channel that includes the failed or out-of-spec beamlet may be switched off, and the complete stripe of the wafer field that would have been exposed by the beamlets of that channel will not written. After performing a first scan of the entire wafer, a redundancy scan may then be performed to fill in the missing stripe (and any other missing stripes for other channels with failed beamlets).

For the redundancy scan the wafer is returned to the starting position after the first scan, but also shifted to a position which ensures that properly functioning channels are available for writing the missing stripes. The pattern data for the redundancy scan is preferably prepared in the lithography system during the first scan to enable the redundancy scan to begin as soon as possible after completion of the first scan. There is preferably no significant delay between the end of the first scan and the start of the redundancy scan, so data for the redundancy scan is preferably available quickly on the appropriate node.

The lithography machine is preferably able to write successive in-line fields in one scan, and write in both directions in an x-direction parallel with the mechanical scan, i.e. −x and +x direction. The machine also preferably includes spare beams (or patterned beams), usually located at the edges of the column.

In order to write the missing stripes during the redundancy scan by properly functioning channels, the wafer may be shifted (offset) with respect to the column in the y-direction and/or x-direction an amount corresponding to a number of stripes until channels with properly functioning beamlets are positioned to write the missing stripe positions. This is preferably accomplished by a mechanical offset of the wafer on the stage. To deal better with all kinds of error positions (e.g. failure of both the first and last channel), an offset for both the first and the second scan may be required.

Multi-Pass Scan

A second scan can also be used to augment the first scan for functioning beamlets as well as defective beamlets in a "multi-pass scan" embodiment, while still achieving the redundancy scan function. In a multi-pass scan, the first scan of the wafer writes a portion of the field stripes and a second scan writes the remaining portion of the stripes, to result in writing all of the stripes of each field of the wafer. This principal can also be extended to three scans or four scans etc., although a greater number of scans increases the total time for exposing the wafer and reduces wafer throughput. Thus, a two-pass scan or dual scan approach is preferred.

It is possible to combine a second scan and redundancy scan because the failure rate of beamlets is typically low. A beam measurement may be performed before the first scan to detect failed and out-of-specification beamlets. Using this information, a first and second scan can be calculated that will result in every pixel of the wafer being assigned for scanning by functioning beamlets. As in the redundancy scan, preferably when a failed or out-of-spec beamlet is detected, the entire channel that includes that beamlet is switched off and another functioning channel (with all beamlets in-spec) is used to write the stripes that would have been written by the failed channel.

Various algorithms may be used to calculate the channels to be used for the first and second scans and the wafer offset required for each scan, to result in all stripes being written by functioning channels. For a two-pass scan, the algorithm looks for a 50/50 split of channels between each scan that does not use any channels. A "brute force" approach could be used to test various channels allocations and wafer offsets to find a suitable combination, or more sophisticated matching algorithms could be used.

Thus, the total exposure current for the wafer is divided between two (or more) scans. In a multi-pass scan, the second scan (or third scan or fourth scan etc.) may be used to scan stripes that were assigned to a failed channel in the first scan, as in the redundancy scan. The multi-pass scan can also be used in the absence of any failed or misaligned beamlets. Dividing the exposure current over two or more scans has the advantage that instantaneous heating of the wafer becomes less of a problem. Because the total beamlet current for each scan is reduced, the heating imparted to the wafer by each scan is also reduced. Although the total heat load remains substantially the same, it is spread over multiple scans resulting in less localized or instantaneous heat load.

Using multiple scans also reduces the required capacity in the data path. When using two scans for each wafer, the data transmission capacity of the data path is theoretically halved, because each scan only requires half of the amount of beamlet control data. This reduction in required capacity is significant because of the enormous data transmission capacity required and the associated high cost of the data path. For the embodiment described above with 49 beamlets per patterned beam comprising one channel, a transmission capacity of approximately 4 Gbit/sec per channel may be expected. A machine with 13,000 patterned beams, each patterned beam comprising 49 beamlets, would require 13,000 channels each of 4 Gbit/sec capacity. Thus, reducing the required capacity for the data path is significant.

Writing Strategy

Figure 5:
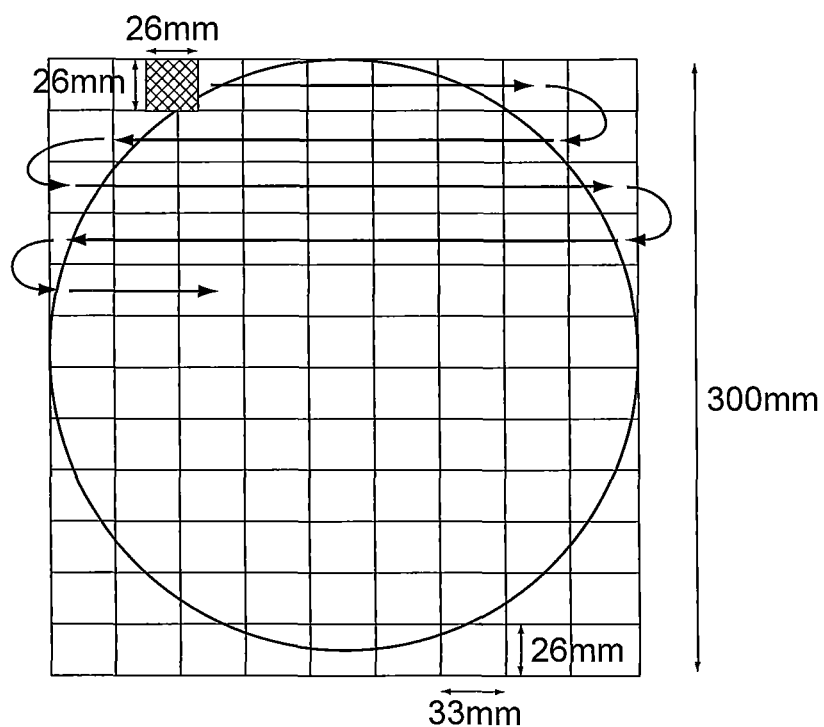
FIG. 5 is a diagram showing writing direction on a wafer divided into fields.

The current industry standard is a 300 mm wafer. The wafers are divided into fixed size fields with a maximum dimension of 26 mm×33 mm. Each field may be processed to produce multiple ICs (i.e. the layout for multiple chips may be written into a single field) but the ICs do not cross a field border. With a maximum size of 26 mm×33 mm there are 63 fields available on a single standard wafer. Smaller fields are possible and will result in a higher number of fields per wafer. FIG. 5 shows a wafer divided into fields, and the direction of writing the fields. A field is a rectangular area on a wafer, typically with a maximum size of 26 mm×33 mm. A GDS-II file describes the features of a field. It is also possible to write partial (incomplete) fields, for example by writing full fields into the partial fields and crossing the wafer boundary.

In a preferred embodiment of the lithography machine, the machine generates 13,000 subbeams and each subbeam is split into 49 beamlets, resulting in 637,000 beamlets (i.e. 13000×49). The beamlet blanker array contains 13,000 photo diodes and 637,000 holes in an area of 26×26 mm. Each photo diode in the beamlet blanker array receives a multiplexed control signal for control of 49 (7×7) blanker holes/beamlets. The 13,000 subbeams over a distance of 26 mm result in a stripe of width 2 μm in the y-direction (perpendicular to the mechanical scan) and as long as the field in x-direction. The 49 beamlets of each subbeam write a single stripe.

The wafer is preferably written on (exposed) by the lithography machine in both a backward and forward x-direction. The direction of writing in the y-direction (by the deflector) is usually in one direction.

When the size (height) of a field is chosen to be smaller than the size of the electron-optical (EO) slit (i.e. the size of the complete array of beamlets as projected onto the wafer) (e.g. smaller than the maximum size of 26 mm), then more fields can be placed on the wafer, but not all of the electron beamlets will be used to write on the wafer. The EO slit will need to scan the wafer more times and the overall throughput will decrease.

When a machine is writing patterns to a field, at some moment the beamlet blanker array enters the next field and starts writing patterns in it, so the machine should be able to write in two fields at the same time. If a field is sufficiently small, the machine should be able to write 3 fields at the same time.

A simplified version of a beamlet blanker array is shown in FIGS. 3 and 4, with only 16 photo diodes that each receive a multiplexed control signal for control of 9 (3×3) blanker holes/beamlets. A blanker hole with an associated blanker electrode is able to block or pass through a beamlet (electron beam). A beamlet passing through the blanker hole will write on the resist on the wafer surface.

In FIG. 3 an arrangement of blanker holes is shown for a parallel projection writing strategy, while in FIG. 4 this is shown for a perpendicular writing strategy. In FIG. 4 the blanker holes for the beamlets are distributed over the full stripe width, i.e. each beamlet is positioned equidistant from the neighbouring beamlets in a direction perpendicular to the writing (scan) direction. This is possible, but for low number of holes the efficiency of this arrangement in terms of the ratio between the beam and beamlet current will be extremely low. A measure for the efficiency is the fill factor, which is the ratio between the total area of the blanker holes and the area in which the holes for one patterned beam are grouped. The fill factor is useful for evaluating the efficiency of a particular grid geometry in terms of current in (beam current) and current out (sum beamlet currents). When the area of the group of beamlet holes is smaller, the fill factor will increase to more preferred values.

A writing strategy that works well for a small number of holes is the "parallel projection" writing strategy (see FIG. 3), where (in its simplest form) the individual beamlets are interleaved and write the full stripe width (as shown in FIG. 8B). Such a writing strategy is described in U.S. patent application 61/058,596, which is hereby incorporated by reference in its entirety.

Scan Line

The beam deflector array 119 will generate a triangular shape deflection signal for all beamlets in parallel. The deflection signal includes a scan phase and a fly-back phase, as shown in the schematic diagram in FIG. 6. During the scan phase, the deflection signal slowly moves the beamlets (when switched on) in the y-direction and the beamlet blanker array will switch the beamlet on and off according to the beamlet control signals. After the scan phase the fly-back phase starts. During the fly-back phase, the beamlet is switched off and the deflection signal quickly moves the beamlet to the position where the next scan phase will start.

A scan line is the path of a beamlet on the surface of the wafer during the scan phase. Without special measures the scan line would not write exactly along the y-direction on the wafer, but will be slightly skewed with a small x-direction component as well because of the continuous stage movement in the x-direction. This error may be corrected by adding a small x-direction component to the deflection field to match the stage movement. This correction may be dealt with in the EO column so that the data path does not need to correct for this error. This x-direction component is small because the stage movement is slow in comparison to the y-direction deflection scan speed (a typical x:y relative speed ratio may be 1:1000). However, the effect of this x-direction component is greatly increased in systems with patterned beams. Firstly, the deflection speed may be reduced in proportion to the number of beamlets per patterned beam. Secondly, due to the inclination of the array of beamlets (as shown in the examples in FIGS. 3, 4 and 9), a skew in the scan lines on the wafer will result in altering the distance between scan lines made by different beamlets. A large enough skew may result in scan lines overlapping or changing position with respect to each other.

A scan line (see FIG. 6 at the right) is divided into three sections: a start overscan section, a pattern section, and an end overscan section. Beamlets are deflected along the y-direction. The distance in which the beamlets are deflected is typically wider than its stripe should write. Overscan provides space for shifting and scaling the positions where the beamlet writes. Overscan is the single sided surplus. In case of a stripe width of 2 pm and an overscan of 0.5 pm (or 25%) this results in a scan line length of 3 pm. The overscan sections of the scan line bit frame hold the bits that are not used for writing a pattern (pattern section bits). Overscan bits are always switched off, but transmitted over the fiber. The pattern section of the scan line bit frame holds the bits that describe the rasterized pattern. In this section the bits are actively switched on and off for writing features.

Figure 6:
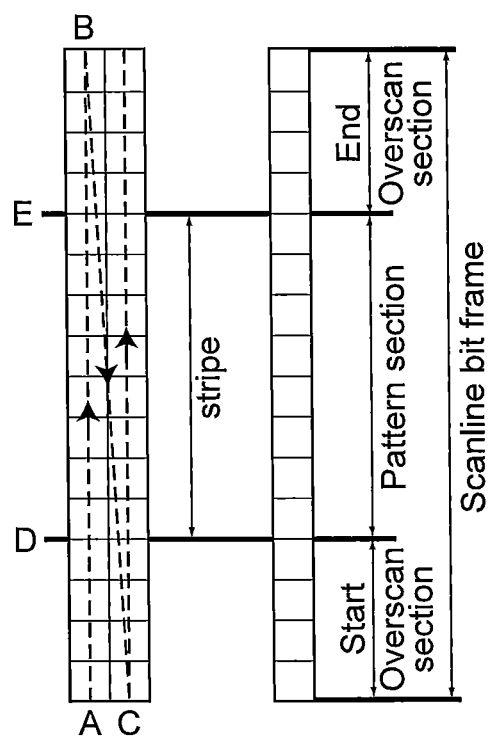
FIG. 6 is a diagram showing a scanline bit frame and beamlet deflection.

In FIG. 6 (at the left) a scan line is depicted for the situation where only one beamlet is writing a stripe. The path of the beamlet during a deflection cycle is A-B-C. AB is the scan line movement during the scan phase, while BC is the fly-back during which the beamlet is switched off. The stripe borders are marked D and E. At the right side in FIG. 6 the overscan and pattern sections are identified. The total set of bits of the beamlet control signal for switching the beamlet over the scan line is called the scan line bit frame.

During the entire scan line the beamlets are controlled by the lithography system. In the overscan section the beamlets will be switched off. In the pattern section the beamlets are switched according to the features required to be written in the wafer field. The bits in the scan line bit frame for both the overscan section and pattern section represent the data to be transferred to the beamlet blanker array. The bits/pixels in the overscan section seem to be useless and consuming bandwidth of the data path. However, the bit/pixels in the overscan section can provide room for corrections (such as pattern shift and pattern scaling), provide room for stitching algorithms, and provide room for differences in y-positions of blanker holes for beamlets when writing strategies are used where all beamlets write the full stripe width (parallel projection).

Assuming a fixed bit rate for the beamlet control signals which control the beamlets and a certain pixel size, the scan line can be mapped into a fixed length bit frame, the scan line bit frame.

Figure 7:
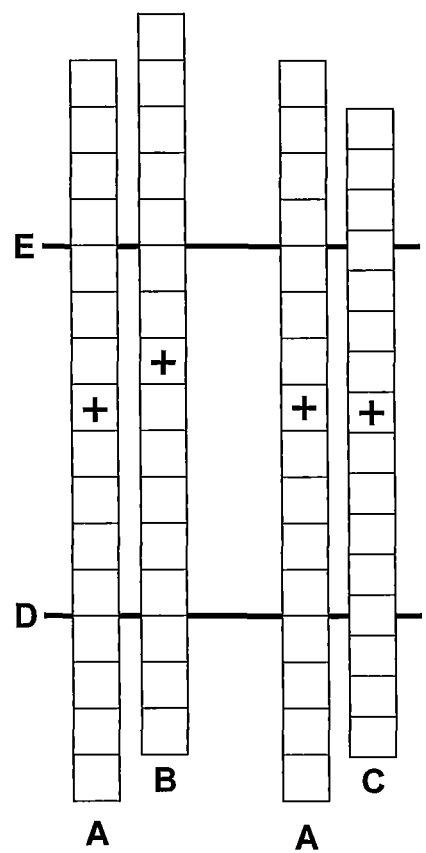
FIG. 7 is a diagram illustrating an example of pattern offset and pattern scaling.

In FIG. 7 an example is given for both pattern offset and pattern scaling. Scan line A is a normal scan line without offset or scaling, where the beamlet writing the scan line is correctly aligned and correctly deflected to expose the desired feature correctly on the wafer. Scan line B is not optimally aligned with the stripe, e.g. due to misalignment of the beamlet. This can be corrected by adjusting the timing of the beamlet switching, by shifting the data in the beamlet control signal by one full pixel. This can be accomplished by shifting the control bits inside the scan line bit frame.

Scan line C is not scaled correctly to fit within the stripe boundaries D and E, e.g. due to deflection of the beamlet that is locally weaker than normal. Therefore the pattern section consumes more bits of the control signal, while the overscan sections use less. The pattern to write the stripe needs more bits for the stripe width. From a bit frame point of view, shifting and scaling can only be done in full pixel resolution. However, the rasterization process is able to deal with subpixel resolution corrections (e.g. 0-1 pixel). Combining the two will give allow for shifts such as a shift of 2.7 pixels.

Beamlet Writing Strategy

In the embodiment described above, each subbeam is split into 49 beamlets and a channel combines 49 beamlets for writing a stripe. There are many different writing strategies for writing the stripe. The beamlet writing strategy defines in what way the beams are arranged for writing a stripe. The scheme could be combinations of stacking, interleaving or overlapping. Beamlets are deflected in two phases: scan and fly-back. During the scan phase, a beamlet is deflected (when it is switched on) along its scan line over the wafer. The pattern section of the scan line bit frame will be filled with the bit pattern for exposing the desired chip features.

Figure 8:
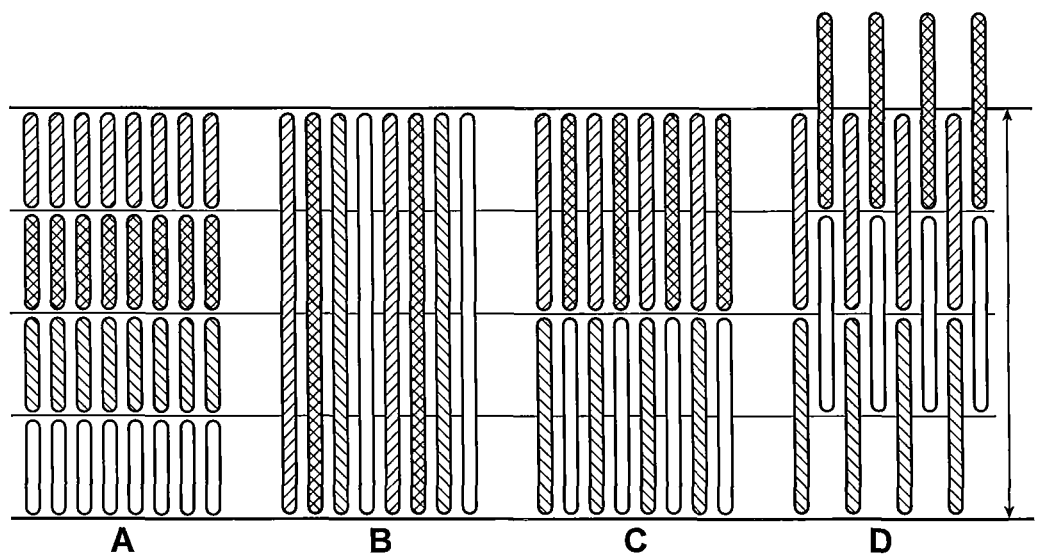
FIG. 8 is a diagram showing examples of possible interleaving schemes for writing a stripe using four beamlets.

In FIG. 8 several examples are shown as possible interleaving schemes for writing a stripe using four beamlets. These examples do not show how the beamlets write in real-time, but show which beamlet has written which part of the stripe when the writing has finished.

Example A shows stacking the beamlets. Every beamlet writes in its own substripe. For this configuration each beamlet only writes a small number of bits before it flies back. The frequency of the deflection signal is high and its amplitude is low. This writing strategy is suited to the case where the beamlets in a group are arranged so that the group width (number of beamlets N×projection pitch Pproj) is equal to the stripe width (perpendicular projection).

Perpendicular projection is a family of writing strategies. For the basic form of perpendicular projection all beamlets write small substripes. The width of the substripe is a fraction of the stripe width. The size of the grid of blanker holes is typically related to the stripe width.

In example B the beamlets are interleaved over the full stripe width. The frequency of the deflection signal is low and its amplitude is large. The write strategy that fits with the interleaving scan lines is the parallel projection write strategy. Especially for a relatively low number of beamlets in a group, this strategy allows for a smaller group size and an improved fill ratio. Because of the small number of beamlets, the size of the group on the wafer is significant smaller than the stripe because of a reasonable fill factor. For this write strategy (parallel projection) one can calculate a series of pixel sizes that is realized for a particular number of beamlets in a group and a certain beamlet pitch. So the pixel size is not an arbitrary value. Extra bits in the scan line bit frame may be added to compensate for the worst case offset between a beamlet blanker hole and the center of the stripe.

Parallel projection is a family of writing strategies. For parallel projection all beamlets write the full stripe width in an interleaved way. The grid of blanker holes is not related to the stripe width.

Example C is a combination of interleaving and stacking. For example D the successive interleaved layers are overlapping like a brick wall. Compared to example C, this configuration will provide better averaging between beamlets. At the stripe boundary there are beamlets that would write over the stripe boundaries.

FIG. 8 shows an example of how the scan lines fill the stripe. The writing strategy determines how the scan lines will be written using the pattern of holes for the beamlets on the beamlet blanker array. One advantage of the "parallel projection" writing strategy is its efficiency. One electron beam is used to make the beamlets. Its efficiency depends on the ratio of the total area of holes (beamlets output current) compared to the area of the group of holes (beam input current). For a relative small number of holes (49), the area of the beam (group of beamlets) must be small for an acceptable efficiency. For "parallel projection" the beam (group) size is smaller that the stripe width.

The pixel size is an important system parameter. The relation between the blanker grid (of holes) and the pixel size is explained below.

Figures 9, 10:
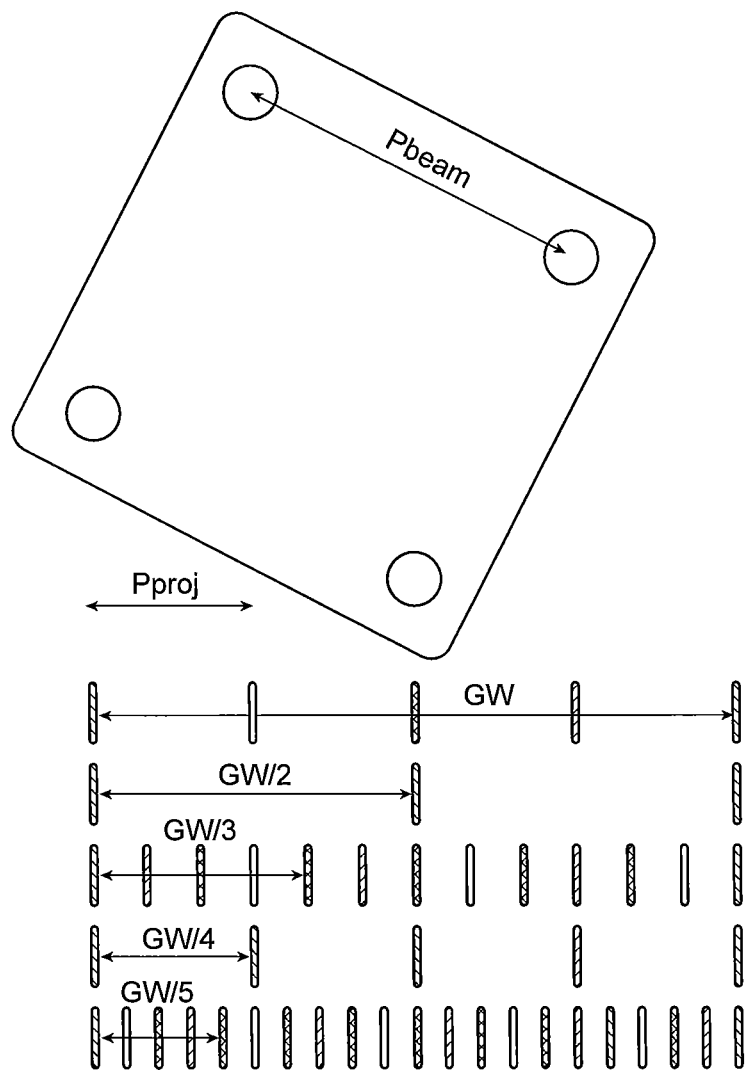
FIG. 9 is a diagram of a simplified four beamlet blanker array and scan line patterns.
FIG. 10 is a table of values for factor K and distance between scanlines.

FIG. 9 shows a simplified beamlet blanker array. For each beamlet there is a corresponding hole in the beamlet blanker array, and a blanker electrode at each hole. The blanker includes electronics to switch the beamlets off or on by energizing or de-energizing the blanker electrodes. As a simple example an array with only four holes is shown and the patterned beam consists of four beamlets.

Under the grid five rows of scan line patterns are drawn similar to the pattern in FIG. 8. The five rows are drawn for particular values of K in the range of 1 to 5. K is a factor relating to the distance between scan lines, e.g. caused by movement of the stage between scans. Different K factors can be achieved by adjusting the relative speed of stage movement in the x-direction and deflection speed (scan phase and a fly-back phase) in the y-direction.

In the row for K=1 of FIG. 9, the pattern is shown that will be written when the stage moves the distance of the group width. The distance between the scan lines is equal to the distance between the blanker holes for this projection, i.e. the projection pitch (Pproj). In practice the projection pitch will be much larger than the pixel size and is a constant (design parameter of the lithography machine). The other rows in FIG. 9 show what happens to the scan line distance in the x-direction when the stage moves only an integer fraction of the group size. K is this fraction.

Some values of K will result in overwriting previous scan lines. These values of K should not be used. Values of K avoiding this are defined by the equation GCD(N,K)=1, where GCD indicates the greatest common denominator, N is the number of holes in the beamlet blanker for one channel (i.e. the number of beamlets in each patterned beam), and K is the fraction of stage movement to group size. If the greatest common denominator of the number of holes in the grid and the value of K equals 1, then that value of K is acceptable. When using a value K=5, the distance between the scan lines will also reduce with the same factor. Using the "parallel projection" and selecting a proper value of K, one can determine the pixel size (at least in x-direction). A constraint is however that only a fixed series of pixel sizes result from this. The factor K links the deflection frequency and the stage speed.

Figure 65:
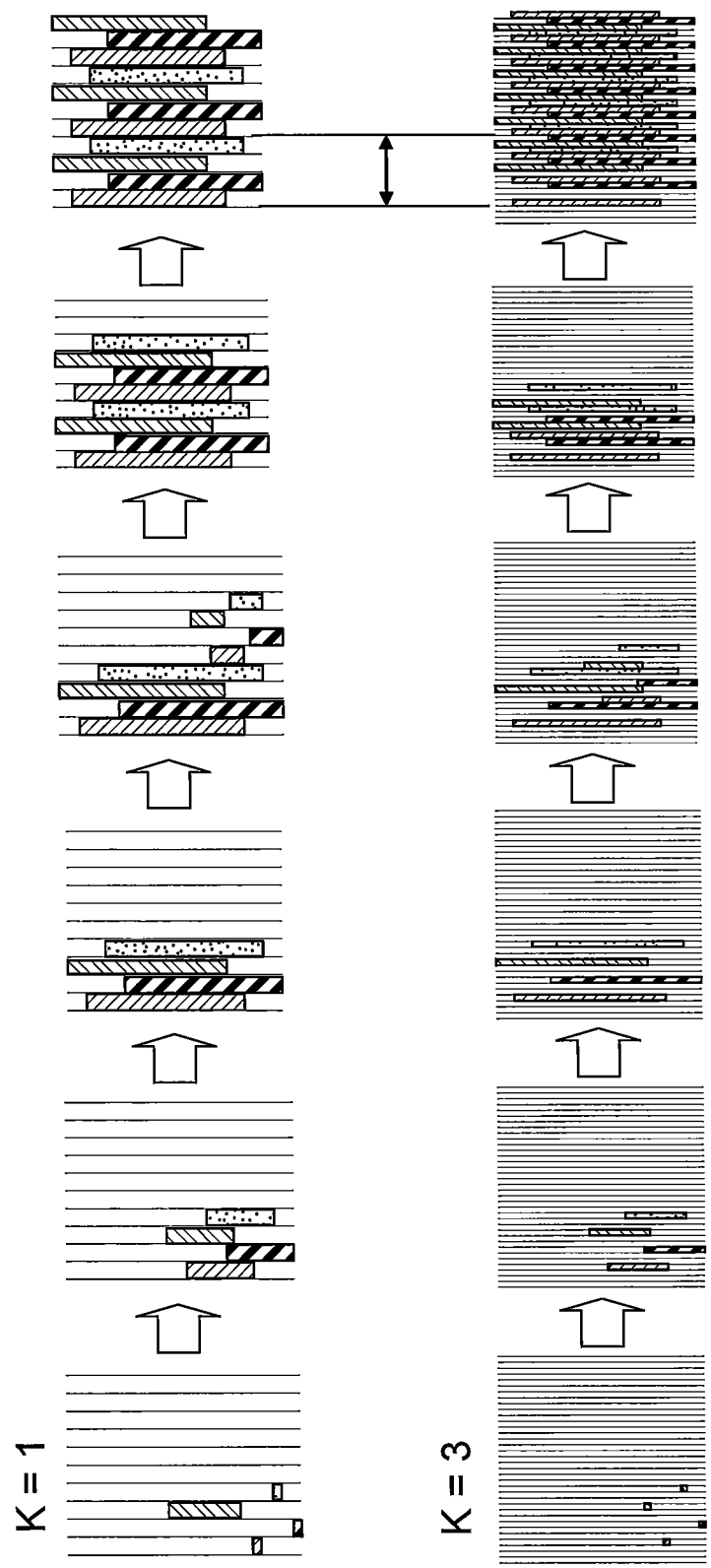
FIG. 65 is a diagram illustrating a writing strategy with factor K=1 and K=3.
Figure 66:
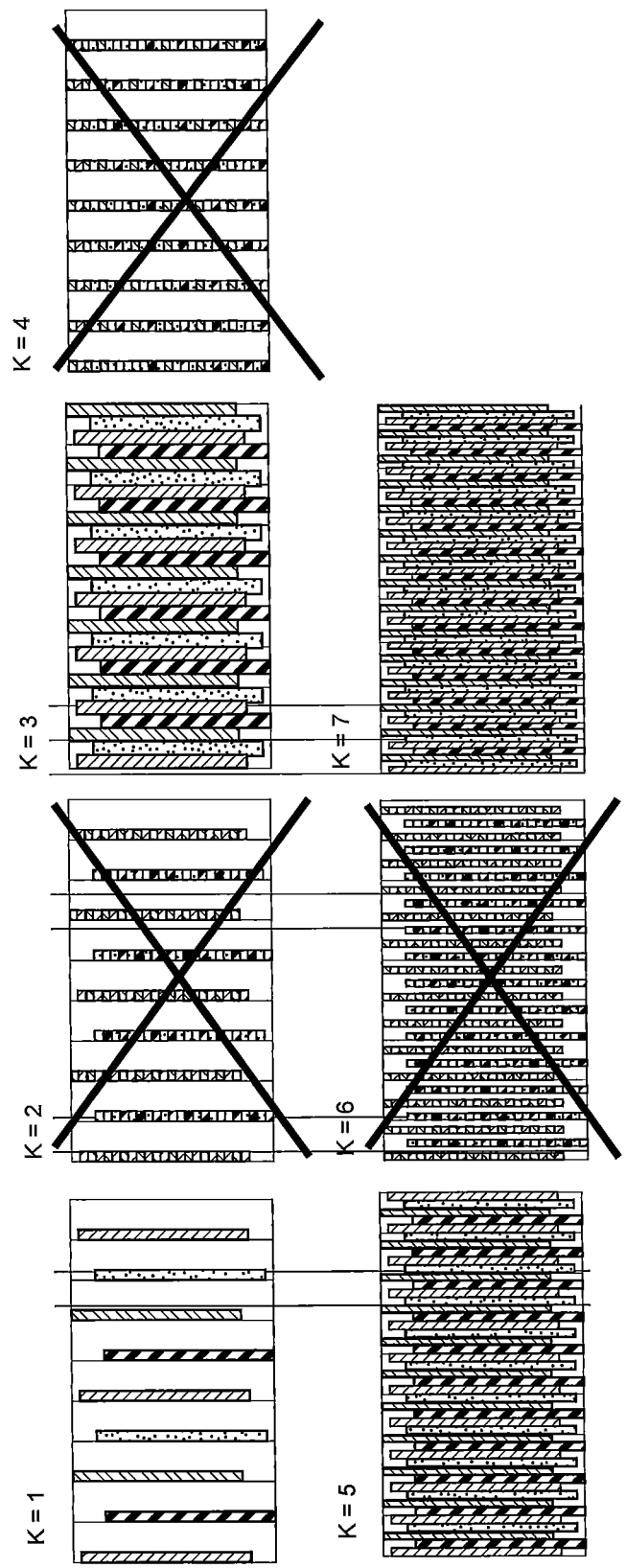
FIG. 66 is a diagram illustrating possible values of K for a patterned beam having 4 beamlets.

FIG. 65 illustrates a writing strategy with factor K=1 in the top example and K=3 in the bottom example. FIG. 66 illustrates the possible values of K for a patterned beam having 4 beamlets.

An example for a grid of 49 holes (e.g. a 7×7 array) is provided in the table in FIG. 10, which describes the pixel size (in nanometers) in the x-direction for several valid values of K assuming a beam pitch of 61 nm (which will give a 25% fill rate given a typical hole size). For these parameters the projection pitch Pproj will be 8.6 nm. The grid width for this geometry is Wproj=414 nm. Therefore the bitframe is able to handle a writing strategy shift of +/−207 nm.

Figure 11:
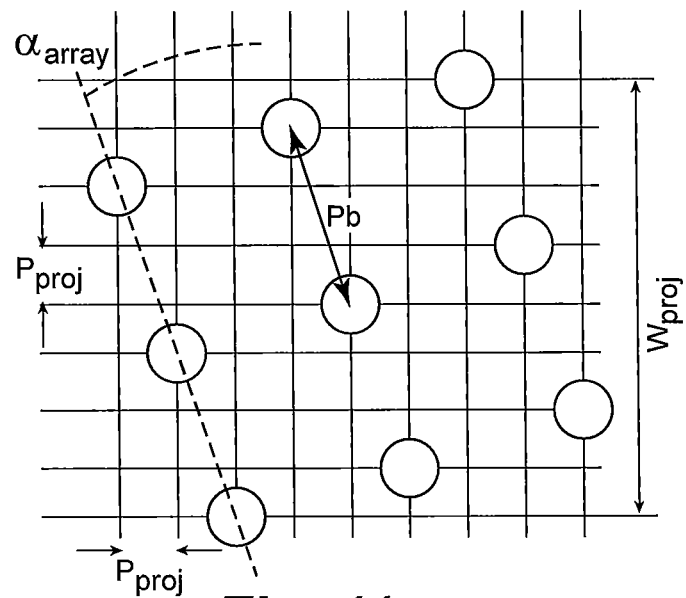
FIG. 11 is a diagram of an array of nine beamlets showing beam pitch $P_b$, projection pitch $P_{proj}$, grid width $W_{proj}$, and tilt or inclination angle $\alpha_{array}$.
Figure 63:
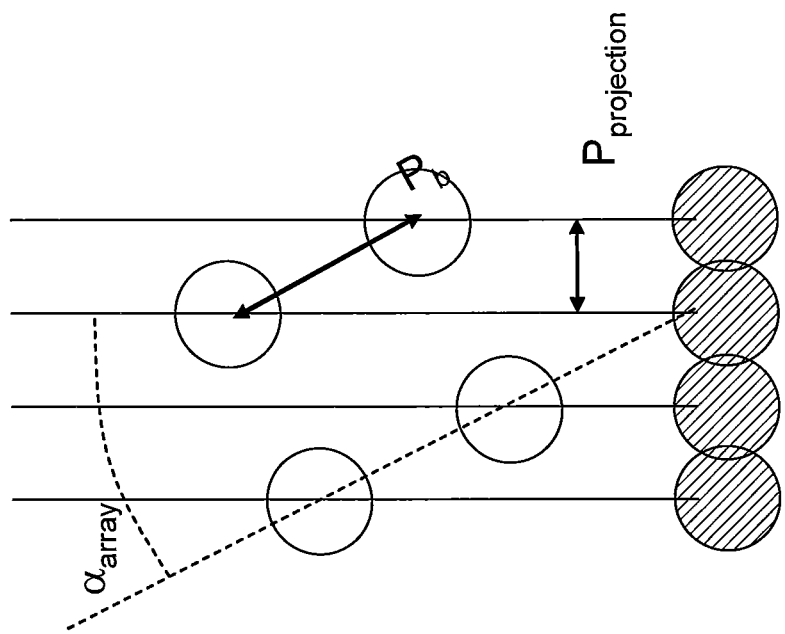
FIG. 63 is a diagram illustrating an array of four beamlets.
Figure 64:
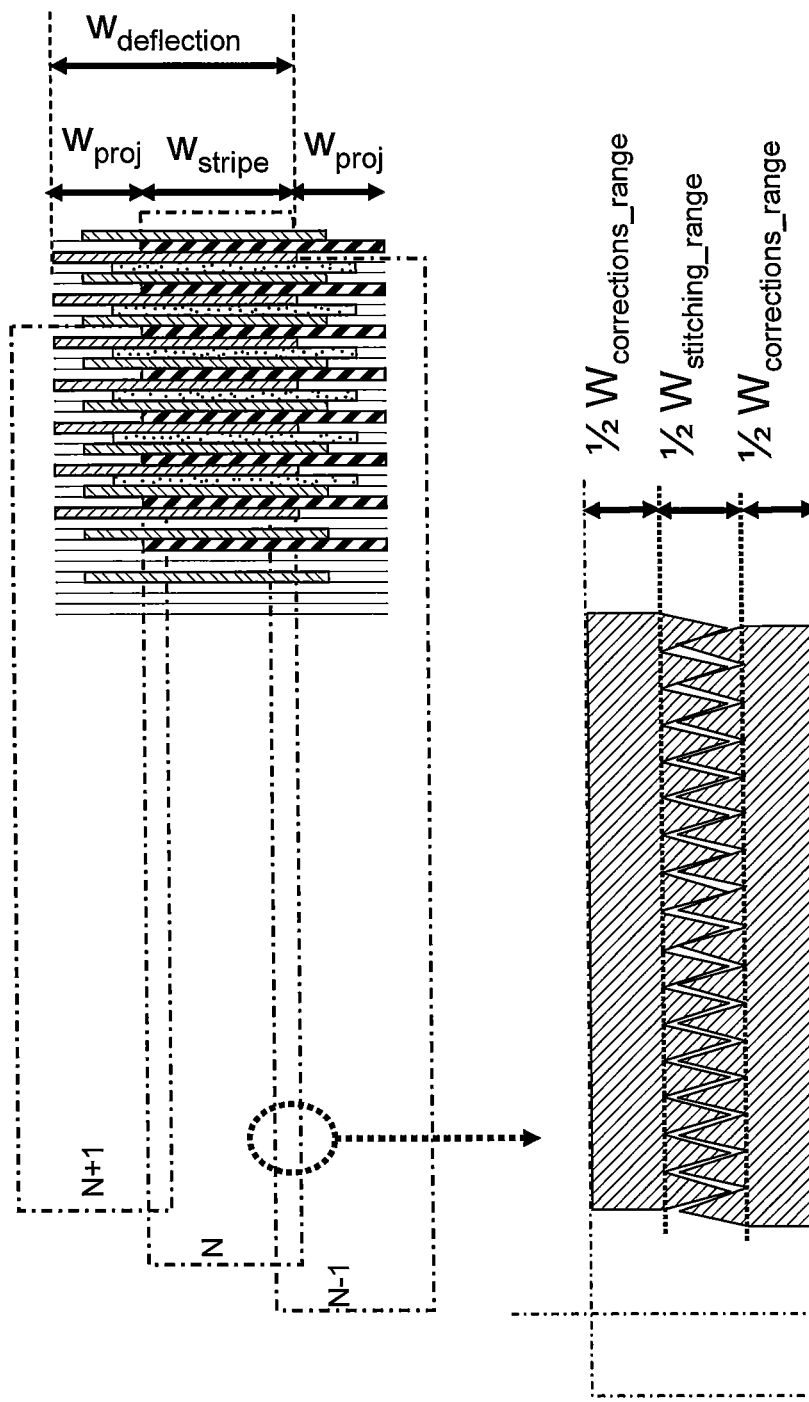
FIG. 64 is a diagram illustrating a stitching scheme.

FIG. 11 is a diagram of an array of nine beamlets showing the definitions of some of the terms used, including beam pitch $P_b$, projection pitch $P_{proj}$, grid width $W_{proj}$, and tilt or inclination angle $\alpha_{array}$. FIG. 63 is another example showing an array of four beamlets.

FIG. 57 shows a table of pixel size and grid width in dependence on the number of beamlets per patterned beam ($N_{pat\_beams}$), the array tilt angle ($\alpha_{array}$), the projection pitch ($P_{proj}$), and K factor. A large pixel size is desired in order to reduce the amount of control data needed to be generated and transmitted over the data path and to increase throughput. However, the size of the pixels are limited by the desired CD and the resist properties. In the table, an optimum pixel size ($L_{pixX}$) of 3.5 nm in the x-direction is assumed, and the fourth column form the left shows calculated values of K based on the projection pitch and optimum pixel size. The closest value of K which is acceptable given the number of beamlets per patterned beam, is shown in the fifth column from the left. The sixth and seventh columns show the pixel size and grid width in nanometers the will result for the given number of beamlets per patterned beam, array tilt angle, projection pitch, and K factor.

A higher K indicates a faster deflection scan speed (relative to stage movement), and results in a smaller pixel in the x-direction. At a constant data rate, the pixel will become bigger in the y-direction, so that the pixel shape changes from approximating a square to a rectangle.

Beamlet Writing Strategy Corrections

The beamlets are oriented at an angle to the EO-slit to be able to write non-overlapping scan lines. The tilt of the EO-slit with respect to the deflection direction causes a position difference in the y-direction, as shown in FIG. 11. This position difference may be corrected for. For every beamlet the value for the shift is a multiple of the projection pitch. In FIG. 11 the difference between the top hole and the center hole equals Wproj/2. These values will result in a full pixel shift component and a sub-pixel shift component. The full pixel shift component is preferably always compensated for, but the subpixel component can only be compensated for when using real-time rasterization.

Multiplexing, Framing, Coding, and Synchronization

Figure 55:
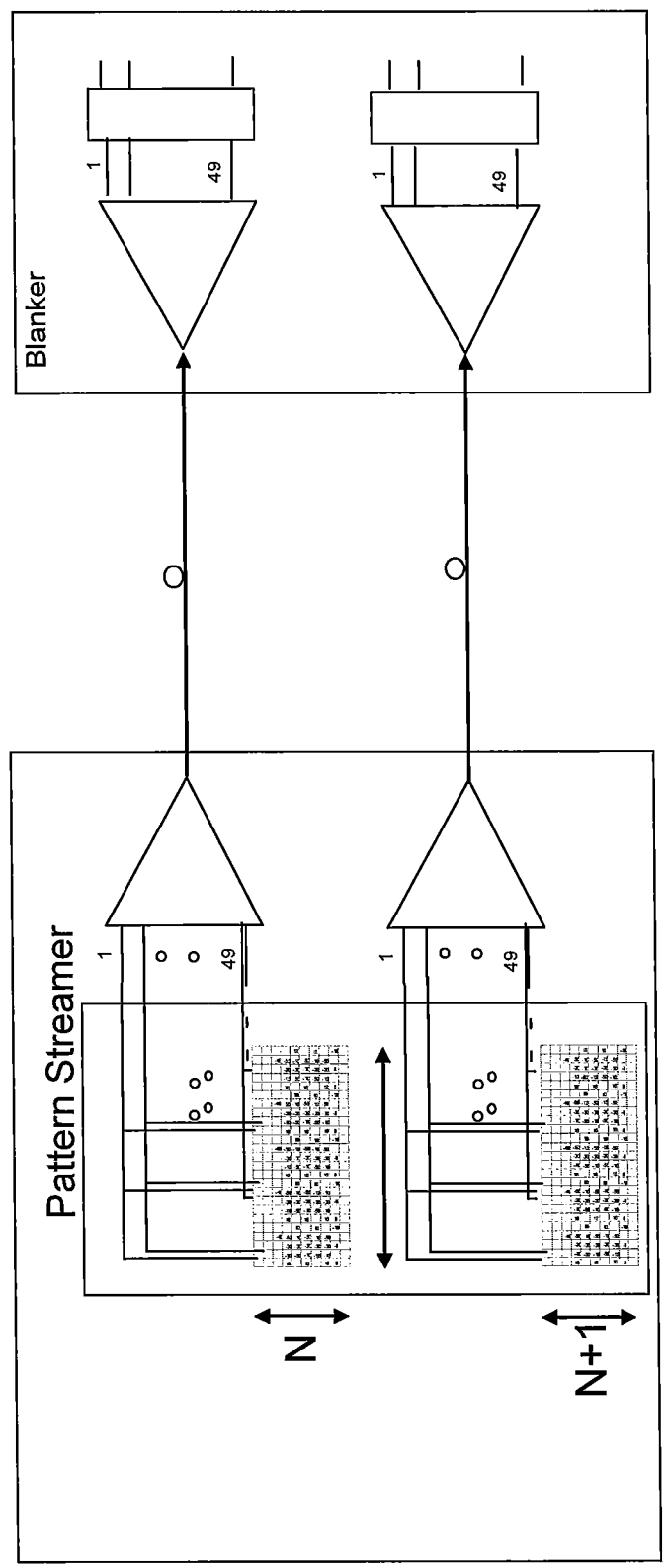
FIG. 55 is a schematic diagram of a data path with interleaved/multiplexed subchannels.
Figure 56:
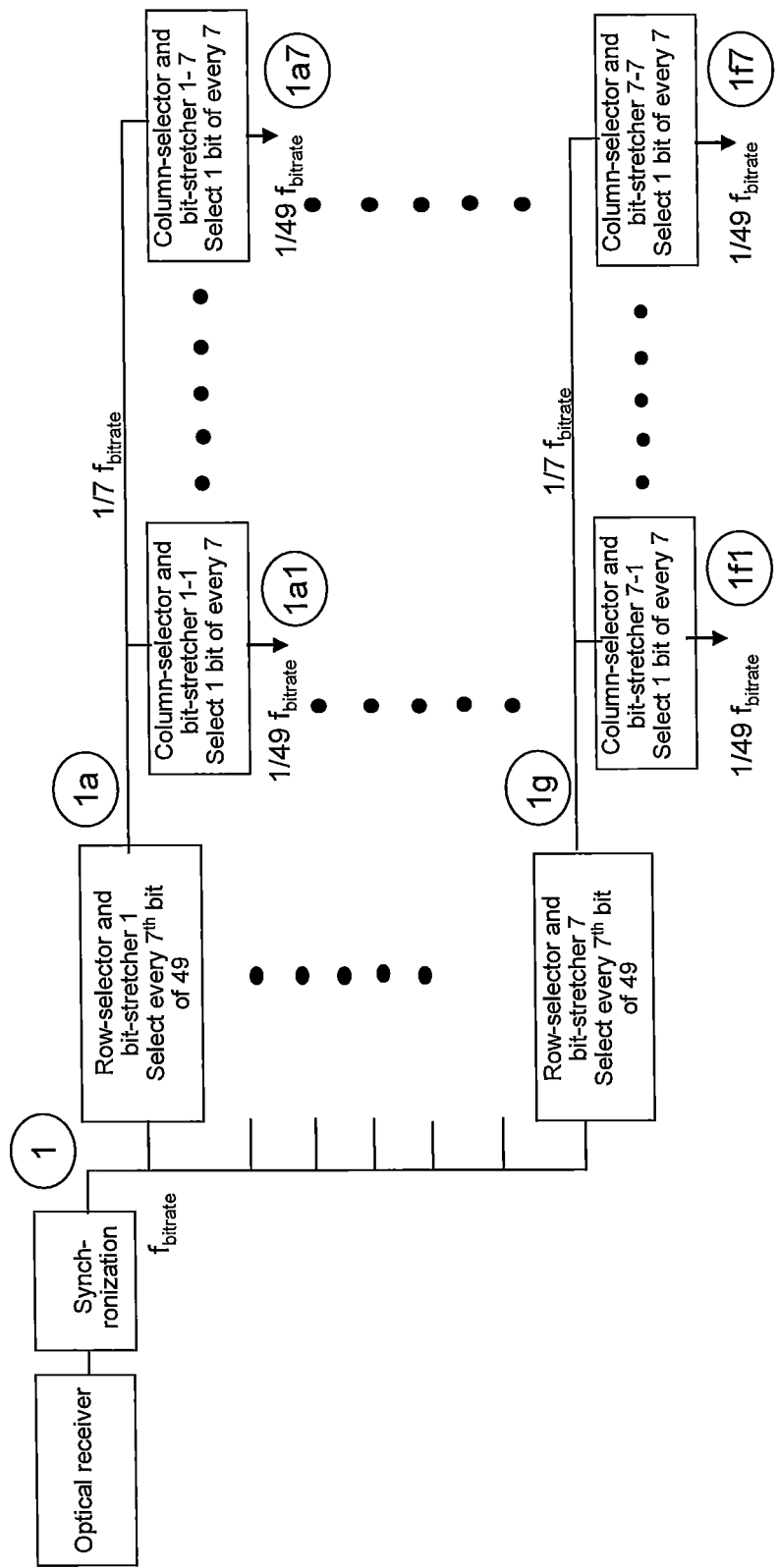
FIG. 56 is a schematic diagram of a demultiplexing scheme using row-selectors and column selectors.

To reduce system costs, one optical fiber may be used for controlling many (e.g. 7×7=49) blanker holes. In one embodiment, successive control bits sent over each fiber are used for controlling successive blanker holes of the beamlet blanker array (i.e. for controlling a series of beamlets). In one embodiment, each fiber comprises a channel transmitting control information for 49 subchannels, for control of 49 beamlets on a single patterned beam. This control information can first be buffered before being applied to the blanker electrodes for each beamlet, or the control information and be applied directly without buffering. A buffer could be provided on the beamlet blanker array for this purpose. A schematic diagram of a data path with interleaved/multiplexed subchannels is shown in FIG. 55, and a schematic diagram of a demultiplexing scheme is shown in FIG. 56, using row-selectors and column selectors to decode the multiplexed subchannel to separate the individual control bits for each beamlet.

For synchronization purposes and to indicate which bit in the control information stream belongs to which beamlet, some kind of framing is preferably used, as shown in the example in FIG. 12. In this example, frame start indicator bits (in this example 7 bits) are used in a recurring pattern to which a framer on the beamlet blanker will synchronize.

When a DC balanced sequence is required for the use of AC coupled optical transmitters and automatic threshold adjustment on the photo diode side, some kind of encoding is preferably used. One example is for instance 8*b*/10*b* coding. This will however result in a higher bitrate, with 8/10 bit coding adding 25% to the bitrate.

Framing and encoding of the signal can also be combined, e.g. by using specific encoded words to mark the start of a frame.

Each channel will carry data for a number of individual beamlets (e.g. 49 beamlets). The information will be transmitted in a serial manner from the data path to the blanker. Depending on the demultiplexing and synchronization implementation on the blanker, there may be a need to compensate for a "blanker timing offset" resulting from the blanker receiving control information for different beamlets at different times due to the serial data transmission. There are several beamlet synchronization options possible. The synchronization implementation mainly depends on the possibility for implementation on the blanker.

Synchronization of the beamlets may be performed in different ways, for example synchronize all beamlets to one synchronization signal, synchronize all beamlets in a column, synchronize all beamlets in a row, or do not synchronize the beamlets. For an embodiment with 49 beamlets per patterned beam arranged in a 7×7 array, to synchronize all beamlets to one synchronization signal the control data for 49 beamlets may be buffered and applied synchronously to each of the 49 blanker electrodes for switching the beamlets. To synchronize all beamlets in a column, the control data for 7 channels in a each column may be buffered and synchronously applied to the 7 blanker electrodes for that column of beamlets. To synchronize all beamlets in a row, the control data for 7 channels in a each row may be buffered and synchronously applied to the 7 blanker electrodes for that row of beamlets. When no synchronization is performed, the control data of all 49 beamlets may be directly applied to the blanker electrodes as the data is received by the blanker.

For column, row or no synchronization, individual beamlet pixel timing will be different. When there are timing differences between beamlets, the differences can be compensated for by shifting pixels in the y-direction. This shift will always be in the subpixel range. Compensation is only possible when rasterization is executed in real-time because the shift depends on the row-beamlet binding.

Stitching

Because a field is written by multiple beams, stitching is preferably used between parts of the field written by the different beams. A stitching error (shift of the pattern written by one beam with respect to the pattern written by the neighboring beam) results in two types of lithographic error: critical dimension (CD) error (lines too thick or too thin at the stitching boundary) and overlay error. For the overlay error, 5 nm is typically allowed. The stitching approaches are methods to get rid of the CD error resulting from stitching errors. Different stitching strategies may be used. These are, for example no stitching, ragged edges, soft edges, and smart boundaries.

For a no stitching strategy one expects that no special means are needed, except for good alignment of beams. One beam ends where the other beam starts. In case of misalignments, lines will appear where the dose was to low or too high. The beam spot will average this effect to some degree. However, no stitching is not preferred.

A ragged edges stitching strategy is described for example in US patent publication 2008/0073588, which is hereby incorporated by reference in its entirety.

Figure 58A:
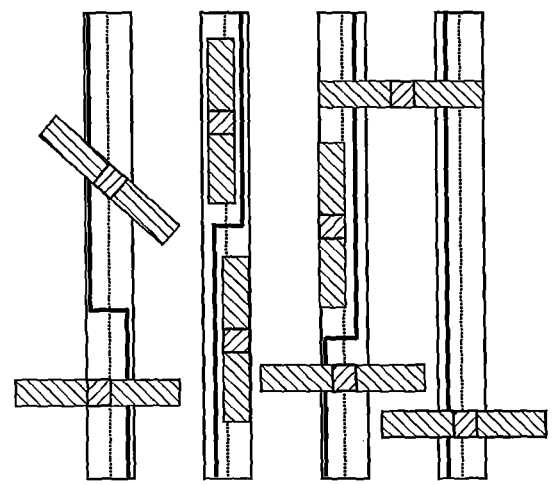
FIG. 58A is a diagram illustrating a smart boundary strategy.
Figure 58B:
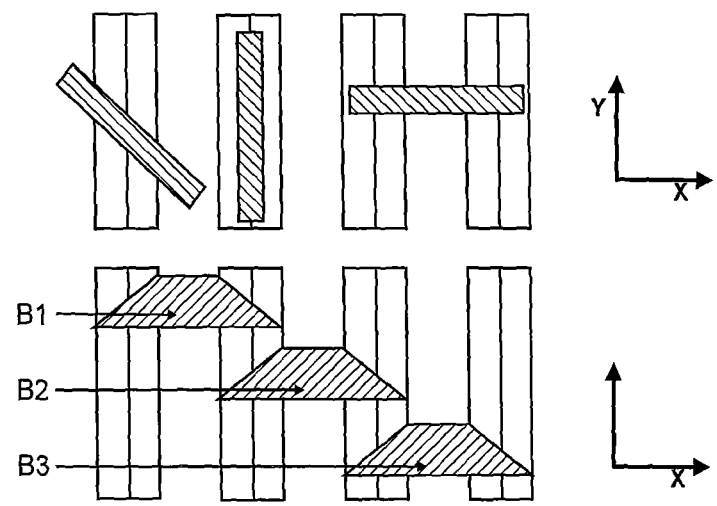
FIG. 58B is a diagram illustrating a soft edges strategy.

For a soft edges strategy the writing ranges of the beams will overlap. FIG. 58B shows a diagram illustrating a soft edges strategy. The patterns fade out (before dithering) at both ends where two beams write. This strategy has the effect that errors are spread over an area, shown as the 1 µm soft edge in the diagram. A side-effect of this strategy is that certain pixels could be written double (i.e. with 200% dose). Because of the relatively large beam size, the dose will be spread among several pixels.

The smart boundary strategy defines an overlapped write range, but only lets one beam write in this area. FIG. 58A shows a diagram illustrating a smart boundary strategy. In the example shown, a 100 nm overlapped write range is used, e.g. 25 pixels with 4 nm pixels. Critical parts of the features of the pattern data at or near the boundary between two stripes or fields will be identified and placed into one stripe or the other. This results in the actual writing boundary between two stripes being moved to avoid crossing a critical part of a feature, so that critical features will always be written by a single beam.

A soft edge stitching strategy is where both boundaries fade out smoothly into the area of the next stripe. For a soft edge stitching strategy, a maximum overscan length of 0.5 µm may be used. If a stitching error of 5 nm occurs, this results in a 100% dose error in an area of 5 nm×line width. If the stitching overlap is 1 µm, this 100% dose error is reduced to 100%×5 nm/1 µm=0.5%. The total dose error budget may be set to 3%, and 0.5% dose error is a reasonable budget to give to stitching errors from this dose error budget.

The stitching methods (soft edges or smart boundaries) and the overscan length may be selection per scan. Reducing the overscan length would result in a higher throughput of the machine. The user is preferably able to select either the soft edges or smart boundary stitching strategy and the size of the soft edge.

Reduction in Required Data Path Capacity

The use of a multi-pass scan with two scans results in the lithography machine writing at half its maximum capacity. This reduction of the writing capacity enables a significant decrease the amount of hardware required for the data path.

A channel is a unit of work in the data path. A channel is able to write one stripe during a scan. The elements of the data path involved in real-time processing are: fast memory, processing unit, laser, fiber, and blanker. Because only 50% of the channels are active for one scan, the number of processing units might be reduced by approximately the same factor.

Reduction of the processing units streaming fewer channels at the same time has the following advantages: less logic cells required per channel, hard limit on fast memory bandwidth required per node of channels, and a possible reduction of fast memory storage size required. Reducing the number of processing units also has disadvantages: there must be a way to connect the processing units and the laser for the appropriate channel, and a new constraint might let scans fail, especially in case of a large number of subsequent (cluster) channel errors.

Figure 13:
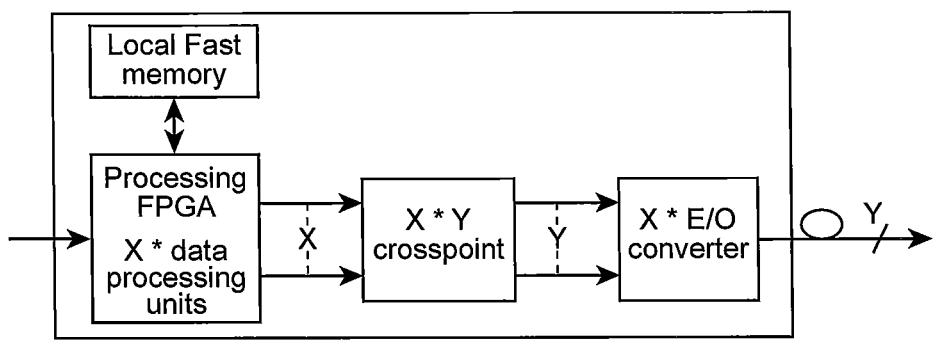
FIG. 13 is a schematic diagram of a node with X processing units.

The concept of a node is used in the following description. A node has Y (optical) channels connected and has available X processing units. FIG. 13 shows a model for such a node. The electrical to optical (E/O) converters that are commercially available typically contain 12 channels (i.e. Y=12). The E/O converter (e.g. laser diodes) convert the electrical control data form the processing units to optical data transmitted over optical fibers to the blanker of the lithography machine. The processing units (e.g. field programmable gate arrays, FPGA's) driving the E/O converters contain X number of channels. An X*Y crosspoint may be used to switch any of the processing units to any of the O/E converters. The X*Y crosspoint is a separate device or is integrated in the processing units. With the crosspoint it is possible to route any of the processing unit outputs (X) to any of the data path outputs (Y).

In case some optical channel(s) fail, first the possibilities for a shift between the first and second scan need to be determined where all stripe positions are covered by at least one proper working channel. When the possible shift positions are known, it is determined whether the available processing units are allocated between the scans and cover 100% of the stripes.

Figure 14:
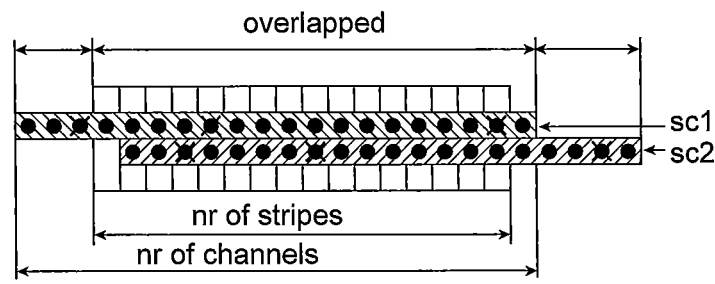
FIG. 14 is a conceptual diagram of channel positions per scan.

In FIG. 14 the channel positions per scan are shown in a conceptual diagram. The stripes as shown in FIG. 14 (blue) are written with this particular combination of channel errors and the two individual shift values. It is important to distinguish between overlapped and non-overlapped channel positions. For a stripe at an overlapped channel position to be written correctly, a working channel at this position for one of the scans must available. For non-overlapped channel positions, a shift of the wafer between the first and second scan will result in two regions where it is only possible to write the stripe in one particular scan. A failed channel in this region will break the sequence of good channels. The left most channel error (see red arrow pointing to it in the figure) forces the stripes to start at its right side. At the left the channels cannot be used. Typically shifting is used to get the overlapped region to be free of errors (using two scans) and some channels in the overlapped region may be used to reach the required number of stripes to write.

The probability of not being able to write a position in the non-overlapped region is relatively high compared to the probability of not being able to write a position in the overlapped region. Therefore typically the sequences of "good channels" in the non-overlapped region are short. Therefore covering 13000 stripes in two scans using 12870 channels will be difficult because it depends too much on the availability of relatively large sequences of good channels in the non-overlapped regions. Covering 13000 stripes in two scans using 13130 channels will be much easier because its success will not depend much on the non-overlapped regions. In practice it is likely that the full sequence of stripes is found in the overlapped region.

Figure 15:
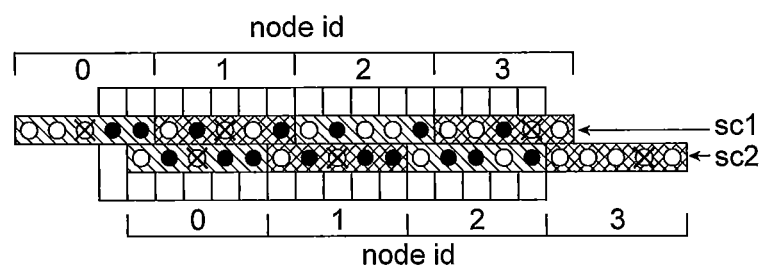
FIGS. 15 and 16 are conceptual diagrams of an allocation of processing units to channels for two scans.

When reducing the number of processing units a new constraint is introduced. Besides finding appropriate shifts, a successful allocation of processing units to channels for the first and second scan must be found. In FIG. 15 an example of this is shown. For this example we assume nodes that manage 5 channels and 3 processing units. The white dots indicate that channels are switched off, while black dots indicate channels that are used and a processing unit is allocated. The red cross indicates channel errors. One can verify that no node violates the constraint of having maximum three processing units active in a node for a particular scan.

Figure 16:
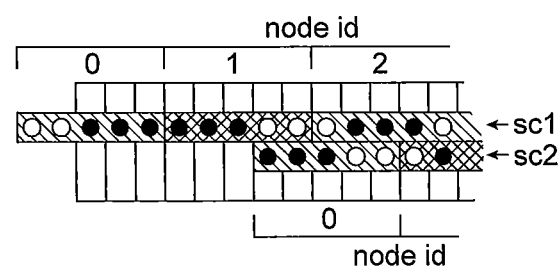

FIG. 16 shows a consequence of using less processing units than channels for the non-overlapped regions. The drawing shows the maximum sequence of good channels is obtained with the constraint of three processing units per five channels for a node. The maximum length equals two times the number of processing units per node. For other shift values (the shift of FIG. 16 is the ideal one) the useful sequence in the non-overlapped region will be substantial smaller (see what happens when the shift is increased by one). Thus the channels in the non-overlapped region are even less useful than before (not considering reducing the amount of processing units).

Besides a worse utilization of channels in the non-overlapped regions, another weakness based on the same constraints turns up in the overlapped region. In the overlapped region, reducing the number of processing units per node translates in sensitivity for sequences of errors (error clusters). For a configuration of 7 processing units per node of 12 channels, clusters of twice the number of processing units plus one will result in a failing allocation. In case the cluster is mapped on a single node, the allocation will fail for clusters of size processing units plus one. Whenever handling clusters is a real bottleneck, there is still a possibility of scaling up the node size (e.g. 24 channels and 14 processing units). This will reduce the sensitivity for big clusters. It is important that the system is robust against channel errors up to a certain level. Also in case of reducing the processing units, the robustness against channel errors is maintained at a reasonable level.

Key parameters for the concept of a redundancy scan are the number of stripes, number of channels, expected number of error channels, expected size of error clusters, number of channels per node, and number of processing units per node. After identifying channel errors, the system will find possible shift combinations that result in 'good' sequences of a length equal or greater than the number of stripes needed. A 'good' sequence consists of either 'good' channel positions in non-overlapped regions or positions in the overlapped regions where at least one of the channels is 'good'. This process will result in a list of shifts and the start and size of the 'good' region.

In case of a one-to-one relation between channels and processing units (i.e. no reduction in data path capacity) a successful wafer shift is the condition for success. In case of less processing units than channels a successful allocation is an additional requirement. An allocation is successful when all stripe positions are written by one of the two scans using only 'good' channels. Per scan, nodes can not allocate more processing units than available.

A possible allocation strategy first allocates channels that must write certain stripe positions. These positions typically are positions in non-overlapped regions and positions in overlapped regions of one scan that correspond to error channels in the other scan. In case any node needs more processing units than available, the allocation attempt will fail.

Starting from one side, the allocation proceeds iteratively through the stripe positions. Processing units are allocated from nodes that will leave scope the earliest. In case such a node is fully allocated, the node from the other scan should allocate a processing unit for writing the position. In case any node needs more processing units than available, the allocation attempt will fail. Other strategies may be used that deliver better results, finding allocation possibilities in cases previously rejected.

Typical reasons for failure of an allocation scheme are failing constraints in the non-overlapped region, no spare processing units, and large clusters of errors. Particular shift values in combination with error channels in particular locations often result in a failing allocation. For a dual-pass scan, spare processing units are processing units in excess of half of the number of channels a node should serve, e.g. a configuration of 12 channels per node and 6 processing units has no spare processing units.

Large clusters of errors will eventually exhaust the number of processing units in particular nodes. The impact of a cluster depends heavily on its position because it determines if either one or two nodes should allocate processing units for writing in the error positions. For 7 processing units per node of 12 channels, one node could absorb 7 errors at max, while two nodes could absorb 14 errors at max.

FIGS. 17-23 are graphs illustrating the result of simulation experiments to determine the effect of varying the capacity of the data path in relation to the capacity of the lithography machine. The graphs show the number of successes out of the 50 experiments. A success means a successful shift and allocation has been found. Because much of the simulations is about varying a single parameter, a default parameter set is defined which are used unless specified otherwise: number of stripes=13000; number of channels=13130; number of processing units per node=7; and number of channels per node=12.

Figure 17:
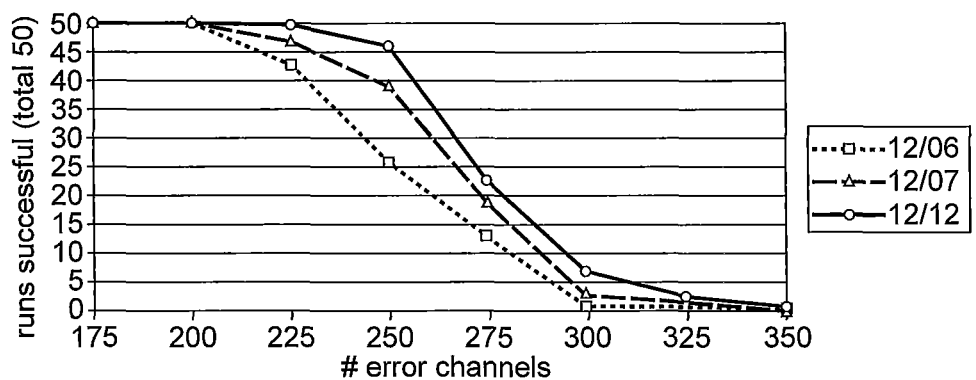
FIGS. 17-23 are graphs illustrating results of simulation experiments of varying the capacity of a data path in relation to capacity of a lithography machine.

Nodes of 12 channels using 7 processing units are referred to as a 12/7 configuration. In FIG. 17, the effect of different number of processing units per node is shown, assuming no large error clusters (only small natural clustering). The 12/6 configuration is the lower limit considered for the reduction because the configuration of 5 processing units per 12 channels will always fail. The 12/12 configuration effectively is the configuration without any reduction of processing nodes. Its success only depends on finding a successful shift (no allocation restriction). The simulation results show that the robustness will slightly decrease for the 12/6 and 12/7 configurations compared to the 12/12 configuration.

Figure 18:
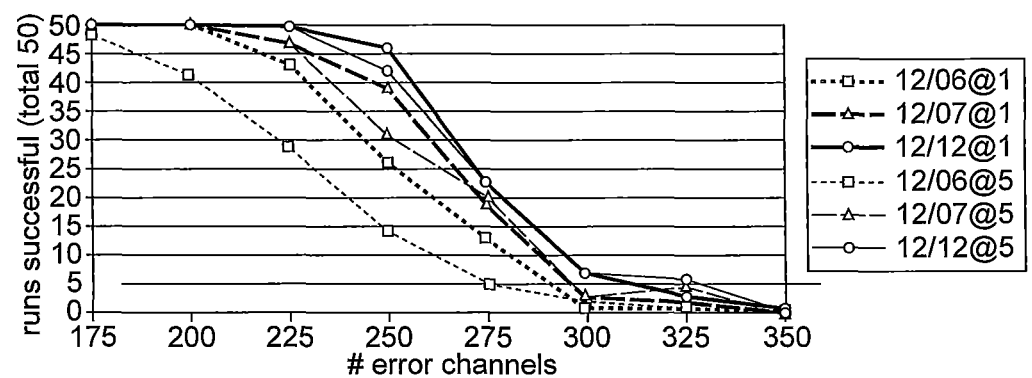

FIG. 18 focuses on the effect of error clusters on the same configurations as in FIG. 17. The 12/6 configuration is particularly sensitive for error clusters of size 5, caused by the lack of spare processing units in the nodes. One error at a critical location will cause the failure of the run. The 12/7 and 12/12 configurations do not show a particular sensitivity for clusters of size 5.

Figure 19:
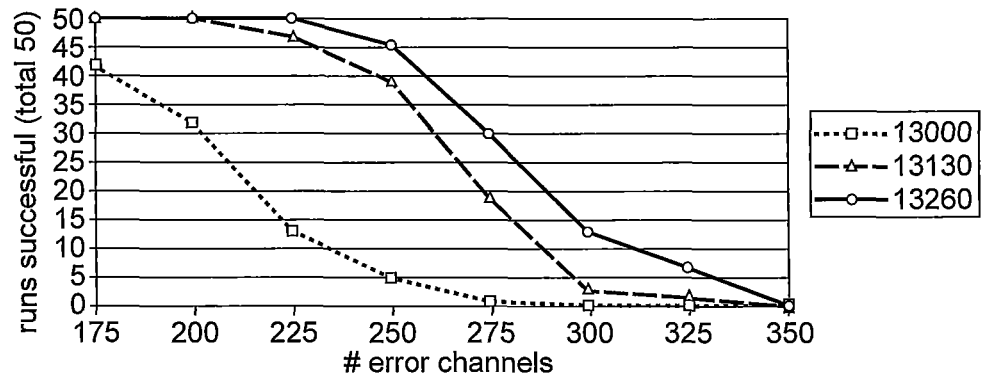

The effect of varying the number of channels is shown in FIG. 19. Non-overlapped regions are almost useless in case of reducing the number of processing units. This explains the poor result for using 13000 channels. Configurations with more channels will deliver more shift opportunities with 'good' sequences mainly because of a wider overlapped region. The simulation experiments show that 13130 channels with 200 errors will result in on average 26 successful shifts, while 13260 channels would result in on average 41 successful shifts for the same number of errors. Using 13000 channels only provides 14 successful shifts on average. Increasing the number of channels increases robustness for the typical 12/7 configuration.

Figure 20:
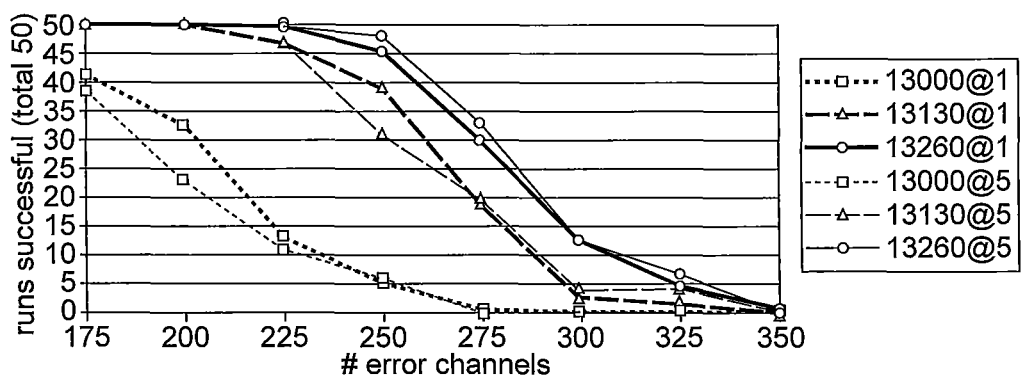

FIG. 20 shows the results when the previous simulation is extended with the effect of error clusters of 5. No significant effect is observed in combination with varying the number of channels.

Figure 21:
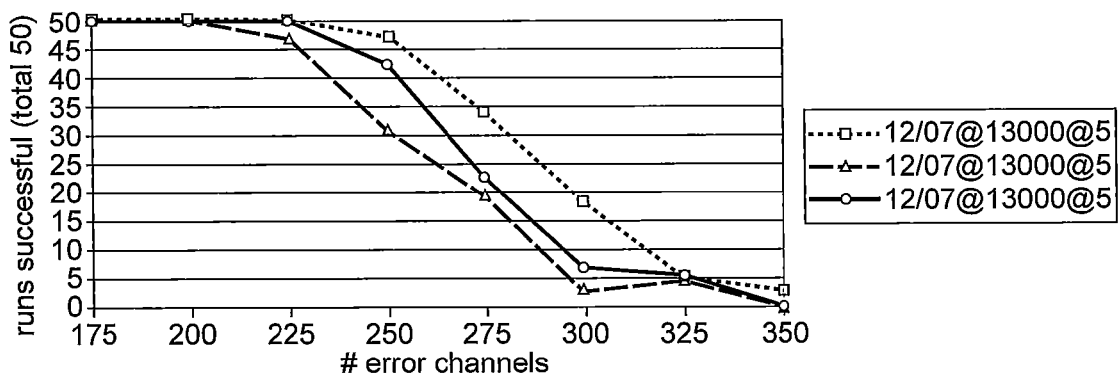

As mentioned earlier, robustness decreases when reducing the number of processing units from 12 to 7, and increasing the number of channels improves robustness. FIG. 21 presents the results when trying to compensate for the loss of robustness due to the reduction of processing units by using more channels. As can be seen, the loss of robustness when changing the configuration from 12/12 to 12/7 can be compensated by increasing the number of channels by only about 1% (e.g. increasing the number of channels from 13130 to 13280).

Figure 22:
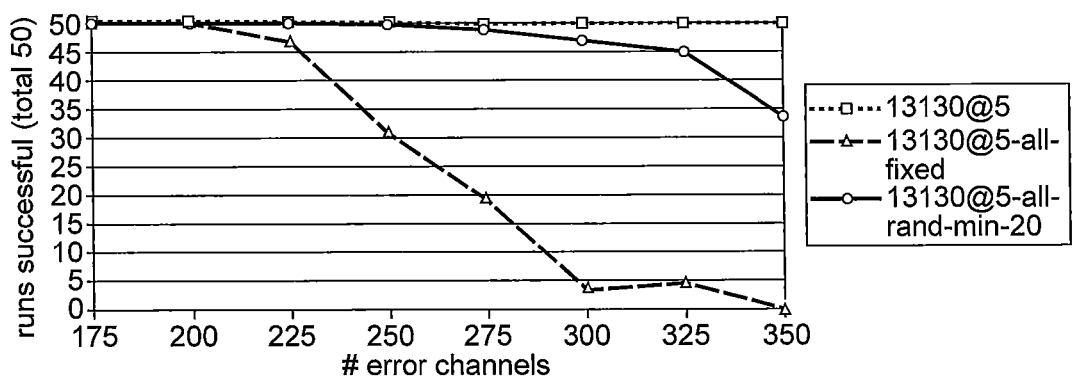

Note that the clusters used in the simulations were all 'single clusters' of a particular size, which seems to be the worst condition. Other clustering strategies tend to give more positive results. FIG. 22 shows a comparison of three strategies: inject a single cluster only; inject as many as possible similar clusters at regular distances (65 from start position to start position); and inject as many as possible similar clusters at random positions (however maintaining a minimum distance of 20 good channels in between them). Note that the fixed distances between the error clusters create a lot of correlation and will result in a large amount of successful shifts.

Clusters bigger than the size of 5 will have a serious impact on robustness when reducing the number of processing units. This can be seen in FIG. 23 where the difference in robustness between the 12/07 with cluster size 5 (12/07@5) and 12/7 with cluster size 8 (12/07@8) is apparent.

Figure 23:
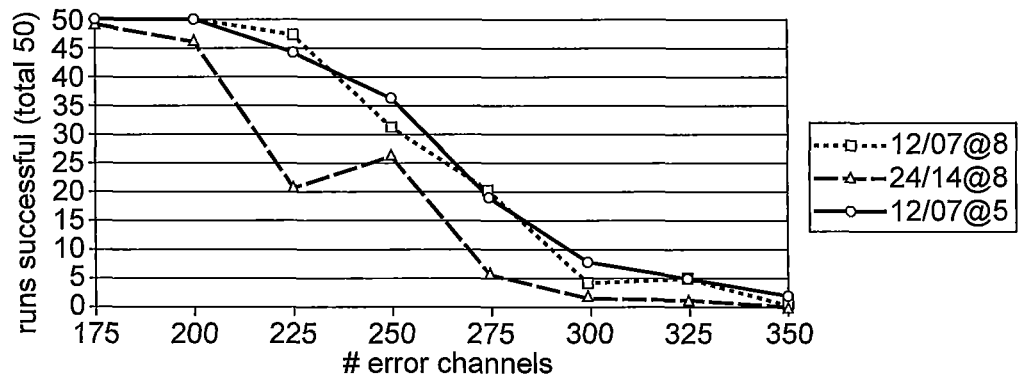

If error clusters bigger than 5 occur more frequently, alternative approaches can be used in combination with reducing the number of processing units to decrease cluster sensitivity. Increasing the node size and using comparable ratios such as a 24/14 configuration is one such alternative. The effect of this can be seen in FIG. 23, showing a greater robustness with a 24/14@8 configuration than a 12/07 @8 configuration.

Randomizing channels over the nodes, or systematically distributing the channels widely among the nodes, are other alternatives. These will result in an error cluster corresponding to many different nodes, rather than being concentrated in one or two nodes. Writing all the mirror positions of the cluster errors will in this configuration not be the responsibility of 1 or 2 nodes, but many of them. However, randomizing or dispersing channels might however have other negative side effects because the concept of a neighbor (and potentially sharing information) disappears.

Allocation strategy optimization: besides checking allocation constraints, an important task of the allocation functionality could be to minimize the number of stitches between the scans.

Conclusions that can be drawn from the above simulations are as follows. Reducing the number of processing units per node could significantly reduce the amount of hardware. Reducing the number of processing units per node will slightly decrease robustness. The 50% (e.g. 12/6 configuration) is the lower limit for reducing the number of processing units per node for a dual-pass scan. Configurations close to 50% are particular sensitive for small clusters of errors (size=5). A 12/6 configuration is thus less preferred than a 12/7 configuration, which does not show this sensitivity. The 12/7 configuration seems to be a reasonable lower limit for the number of processing units per 12 channels. The number of channels is preferably larger than the numbers of stripes (+1%) for a good robustness. Increasing the number of channels increases the robustness significantly. Loss of robustness because of reducing the number of processing units per node may be easily compensated by using an additional 1% channels. Large error clusters (>5) will decrease the robustness dramatically.

Data Path Requirements

Figure 24:
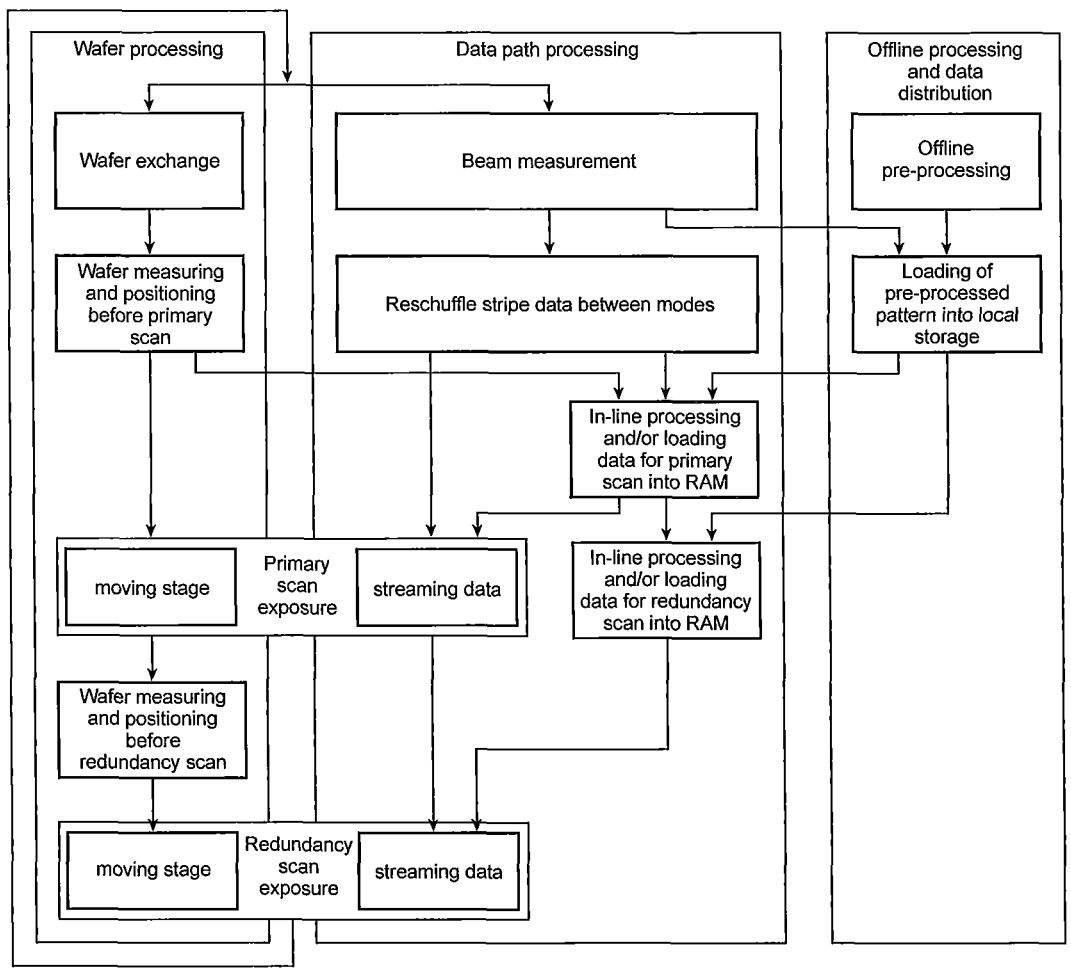
FIG. 24 is a flow diagram showing dependencies of processes in a lithography system.

The flow diagram in FIG. 24 shows an overview of the processes involved in the lithography system and their dependencies. Understanding the dependencies permits an analysis of performance (in terms of duration) and reveals opportunities for parallel execution to increase throughput. An important principal is that pattern data for a scan may be processed and/or loaded into RAM while the previous scan is executed.

Different dependencies and different therefore possibilities or limitations may occur for different architectures. For example, the dependency between the processes E1 (wafer measuring and positioning) and C1 (in-line processing and/or loading data for primary scan into RAM). For architecture option A (offline processing) this dependency does not exist. For option C it might exist, while for real-time rasterization it will exist (real-time binding of beamlet and scan line).

Typical performance requirements concerning the process: downloading a new pattern from server onto local storage of the streamer nodes <60 min; number of patterns to store in the local storage of the streamer nodes >=10; time the machine is offline due to loading a new image is <60 seconds; if rasterization will be performed once per wafer the maximum time between updating the correction parameters and being ready to write is 36 seconds (10% of 6 minutes); and scan exposure duration is <3 min.

Timing and Synchronization

The clock and synchronization signal may be distributed to the other sub-systems (such as deflector and wafer stage) over an optical fiber. This has the advantages of galvanic isolation between the sub-systems and insensitivity to electromagnetic influence. Clock variation can be used to vary dose. However, as dose-variations can be compensated for by changing the pixel size, clock variations are preferably avoided to simplify the implementation of the physical part of the data path responsible of transmitting the data to the blanker and eliminate the time needed to re-synchronize after a change in clock frequency.

The advantage of using a fixed clock rate is that the clock no longer needs to be distributed between the different components of the data path. With the use of standard phase locked loops (PLLs) (inside FPGAs) the variations in local clock frequencies may be compensated for. When larger variations are required (such as ±10%), special provisions are required to be able to synchronize the data path sub-systems.

The data path preferably operates as the clock master for the complete lithography system and will provide timing and synchronization signals to the other sub-systems such as the electron-optical column (deflector) and wafer positioning system.

Corrections

In the embodiment of the charged particle lithography machine described above, these are no facilities built into the lithography machine for adjusting individual electron beamlets to correct for errors in beamlet position, size, current, or other characteristics of the beams. The lithography machine omits corrective lenses or circuits for making individual corrections to beamlets to avoid the additional complexity and cost involved in incorporating additional components into the electro-optical column for making physical beam corrections, and to avoid the increase in size of the column necessitated by incorporating such additional components.

Thus, adjustments to correct for variations in beamlet position, size, current, etc. are made by making corrective adjustments to the control signals provided by the data path. Several types of corrections are made, necessitated for various reasons. These corrections include corrections to compensate for:

Variations in beamlet position. Due to variations in manufacture of the column, such as variations in the exact positioning and size of holes in the aperture array or beamlet blanker array, or differences in the strength of the electrostatic fields generated by the condenser lenses or projection lenses or deflection electrodes, the beamlets may be misaligned. Such misalignment may be corrected with "pattern shifting".

Mechanical position errors. These may result in the complete wafer field being shifted in the x and/or y direction. This type of field shift may also be corrected with "pattern shifting".

Delay errors in the data path (caused, for example, by differences in the length of optical fibers in the data path). This error may be corrected by shifting in the y-direction.

Blanker timing offset. As a result of multiplexing the beamlet control signals, many beamlets are controlled over one channel and the beamlet control signals are received serially, i.e. the control signals for different beamlets are received by the beamlet blanker array at different times. Depending on the blanker design, different offsets will be experienced for switching the beamlets on and off, e.g. the beamlets may be switched in units of rows or columns, or individual beamlets. Depending on the strategy by which the control bits are put into effect (the beamlets are switched) this may result in a particular beamlet being switched at a later time than another beamlet. The effect of this error is in the subpixel range. The result is an offset per beamlet.

Variations in beamlet blanker array hole position. Each beamlet passes through a hole in the beamlet blanker array and is switched by a blanker electrode at the hole. Variations in the manufacture of the beamlet blanker array may result in a mechanical offset in both x and y direction in the position of a hole and thus of the corresponding beamlet, when compared to a reference position. The effect of this error is typically many pixels, and the result is an offset per beamlet. The full pixel (integer) part of this error will typically be compensated for at runtime. The remaining subpixel (fractional) part can be compensated for by real-time rasterization.

Variations in deflection strength. These may be dues to spatial differences in the strength of the electrical deflection field of the beamlet deflectors, this has to be corrected for "pattern scaling", "dose correction". There may also be a beamlet offset component in deflection differences, which may be corrected by "pattern shifting".

Variation in control signal pulse duration. Because of different timing behavior for switching beamlet blanker array electrodes on and off, the effective dose rate will differ between beamlets. When not multiplexing the control signals, this effect is significant (e.g. 10%). In the case of multiplexing control signals for 49 beamlets in one channel, its significance diminishes because the transition effect is the same, but the minimum pulse width is 49 times larger compared to the non-multiplexed case (assuming 10%/49=0.2%). Furthermore, this error depends on dose rate. It will be small for writing 100% dose rate, while the error is maximal at writing at 50% dose rate.

Global Pattern Shifting

When a pattern is written on a wafer, it is unlikely that the beamlets writing the pattern are all perfectly aligned. To correct for this misalignment and enable the beams to write aligned stripes, the pattern data is adjusted to compensate for the alignment errors. in This adjust may be made using software or hardware, and can be done at different stages during processing of the pattern data. For example, the corrections can be made to the pattern data in vector format, or in multi-level gray scale format, or in the two-level B/W bitmap.

Offsets may occur in the x-direction (direction of stage movement) or y-direction (direction of beamlet scan deflection) or both. Offsets may occur in a full pixel shift and/or subpixel shift. A full pixel shift may be achieved by shifting a number of pixels after rasterization. A subpixel shift can be achieved as part of the rasterization process.

Global pattern shifting (i.e. a shift of all beamlets in a channel) may be used for stripe position correction (in x- and y-direction) and field position correction (in x- and y-direction). An example of an x and y pattern shift for stripe position correction is shown in FIG. 25. On the left of the drawing, a stripe is shown with the desired pattern overlaid in the intended position. On the right of the drawing, a stripe is shown with a pattern overlaid as it would be written if no correction was made. As can be seen, a global pattern shift is required to cause all beamlets of the channel to write in a position shifted up and to the left.

Beam offsets are typically done frequently after calibration (once per wafer or field). It can be assumed that beamlets are aligned perfectly with respect to the other beamlets in the same channel, so that all beamlets in a channel get the same pattern offset.

Typical requirements for pattern shifting are individual X and Y shift settings per channel for global shifting, and a parameter update once per field. A typical maximum shift range may be +200 nm to −200 nm, with a shift accuracy of 0.1 nm. This correction is per channel for global shifts because it is expected that all beamlets in a patterned beam use the same offset values. For a global pattern shift, the channel pattern is shifted as a whole independent of the beam interleaving strategies.

Blanker Timing Offset Correction

The beamlet control signals for many subchannels are preferably multiplexed over a single channel. Depending on the blanker design, this will result in the individual beamlets switching to the next pixel at different times. Blanker timing offset correction requires correction in Y per subchannel, typically with maximum shift range less than one pixel, and shift accuracy of 0.1 nm. The shift parameter is static, since the blanker timing offset depends on the blanker design.

Blanker Hole Offset Correction

Because of blanker geometry, different holes have different offsets from a certain reference point. The offset in X of the hole is used to generate the interleaved pattern (see FIG. 9). Its predictable timing delay will be accounted for in real-time and is not seen as part this correction. The offset in Y relative to a reference (e.g. mid stripe) is compensated for. The error is split up in a full pixel and sub-pixel component. The full pixel shift should always be compensated for, while only real-time rasterization is able to deal with the sub-pixel component. Blanker hole offset correction requires correction in Y for the subpixel component per subchannel, typically with a maximum shift range of +/−Wproj/2 or +/−210 μm (i.e. (N−1)*Pproj), and shift accuracy of 0.1 nm. The correction parameter is static, because blanker hole offset is a function of the blanker geometry.

Dose Correction

Because of manufacturing tolerance variations in the lithography machine, the effective dose varies per beamlet. Variations in beamlet scan deflection strength can also result in a variation of dose intensity. The dose rate may be corrected using a dose factor: Resulting dose rate=dose rate map*dose factor. This formula describes the correction mathematically, but the dose correction is preferably realized in the dithering process by adjusting pixel white values and/or threshold values. For example, when a beamlet is calibrated with a dose factor of 90%, its intensity is 100%/90%=111.1%. Thus, the white value used for dithering would be 111.1 if 100 were the default, and dithering threshold value would be 55.6 if the default was 50.

Dose correction is performed per beamlet, with correction parameter update once per wafer. Typical requirements/values for dose correction are a pattern dose map of 50%-100%, pattern dose accuracy of 0.2% step size, beam dose factor of 80%-100%, and beam dose accuracy of 0.2% step size. The resulting dose rate should be rounded to the nearest value.

Pattern Scaling

Beams are deflected during each scan in the y-direction and write a pattern from one side of the stripe to the other side. The deflection distance preferably covers both the stripe width and two times the overscan distance. In case the deflection is not perfectly uniform, one beam is deflected stronger than others and therefore deflection distances will be different. Differences in the strength of the scan deflection occur over the surface of the scan deflection array due to voltage drops occurring across the array. These voltage drops result in a weaker deflection field at the far ends of the array, and the deflection distance will be shorter for beamlets experiencing the weaker deflection fields.

This is compensated for using pattern scaling. An example of pattern scaling is shown in FIG. 26. On the left of the drawing, a stripe is shown with the desired pattern overlaid with the intended scaling of the pattern feature between the dashed lines. On the right of the drawing, a stripe is shown with a pattern overlaid as it would be written if no scaling correction was made. As can be seen, a pattern scaling correction is required to reduce the deflection of all beamlets of the channel to write the feature with the correct scaling.

Scaling may be accomplished by adjusting the bit rate of the data signal transmitted to the blanker, spreading the exposure pattern over a different number of pixels. Due to synchronization considerations, changing the bit rate is not preferred. To avoid this, scaling may be done by spreading the pattern over a different number of bits/pixels. It is assumed that the beamlets of the same group have the same deflection strength. This is because they are deflected by the exact same deflector. The pattern scaling factor is thus the same for all beamlets of a certain group.

Pattern scaling requires correction per channel, with correction parameter update preferably once per redundancy scan reshuffle. Maximum range is typically 1 to 1.1 (e.g. 2 μm becomes 2.2 μm), and accuracy of 0.1 nm/1 μm=1/10,000. Deflection strength is assumed to be the same for all beamlets in a channel because the beamlets share the same deflector array, and are more or less in the same position in this deflector.

FIG. 27 is a table summarizing various types of corrections and typical parameters and ranges. Note that when both a first scan and a second (or redundancy) scan are used, dose corrections are preferably performed before both scans.

Dynamic Pattern Shifting

Dynamic pattern shifting may also be provided, to compensate for wafer heating. This can be accomplished using an X and Y offset table per channel with values varying as function of time. Maximum slope of 0.1 nm per 1 ms (equals ~10 μm in X) may be used, and an offset table with 30,000 entries per 300 mm (wafer size).

Pattern Sizing Correction

Because of differences in the strength of the beamlet scan deflection across the surface of the scan deflection array, the deflection distance of beamlets will vary. This may be compensated for using pattern scaling (discussed above) or pattern sizing correction. Requirements for pattern sizing correction are generally the same as for pattern scaling.

Data Path Architecture

The data path receives pattern layout data in a specified format and processes this data so that it can be written onto a wafer using electron beams. The data path also performs adjustments to the pattern data to compensate for errors in the lithography machine, and provides synchronization signals to the other sub-systems.

FIG. 28 shows a functional block diagram of a data path showing the flow from GDS-II pattern data file to bit stream transmitted over the fiber. The drawing also shows corrections occurring in the appropriate functional blocks. Depending on the architecture options, corrections may be made at different points within the data path processing.

Input Data Format

The input for the data path sub-system will be a pre-processed format (usually derived from an industry standard file format such as GDS-II or MEBES) containing the information of the layout to be "written" onto the wafer. On this industry standard file format pre-defined system compensations are applied in the offline process. After offline processing the data will be saved for the next stage of the data path. The data may be saved in a file format convenient for subsequent processing, e.g. one file per individual channel.

Dose Map Data Format

The dose map defines areas of a single dose rate, typically using a vector format. The dose rate is a radiation intensity per unit of area. It is essential to write the patterns with the proper dose rate, otherwise the written patterns will not appear correctly in the resist. The range of the dose rate may be, for example, 50-100% in steps of 0.2%, and the spatial resolution of the dose map may be 10-15 nm. The areas are non-overlapping, so the lines of a polygons describing the areas do not cross. The areas may be defined in vector format using lines at angles of 0°, 45° or 90°. In case of real-time rendering, the offline process may break up complex polygons into simpler ones, e.g. polygons could be simplified so that a scan line only intersects a boundary a maximum of two times. This simplifies rendering in hardware.

Preprocessing

The preprocessing functional is typically performed once per design. This step needs a large amount of computational power to complete. The following functionality is usually included in the preprocessing: (a) Reading the GDS-II chip design and extracting the information needed for a specific step in the chip manufacturing process. This typically results in a map of polygons for the features required in this step. (b) Applying resist heating corrections to the dose map. This correction typically results in an adjustment for the feature positions. (c) Applying proximity corrections on the polygons. This correction will result in a dose map with many more polygons with different dose rates attached. (d) Output the dose map for each field in vector format.

Channel Splitting

A channel is preferably used as the unit for further processing. To enable this, the field dose map is split into a dose map per channel. Polygons are reduced to the stripe area written by one channel. The stripe area preferably extends beyond the borders of the stripe, to account for stitching strategy and dithering startup artifacts. If a "smart boundary" stitching strategy is used, where critical features are assigned to a single channel/stripe, then the critical features polygons on the stripe boundary are assigned to a particular channel when splitting up the dose map.

Channel Rendering

Figure 29:
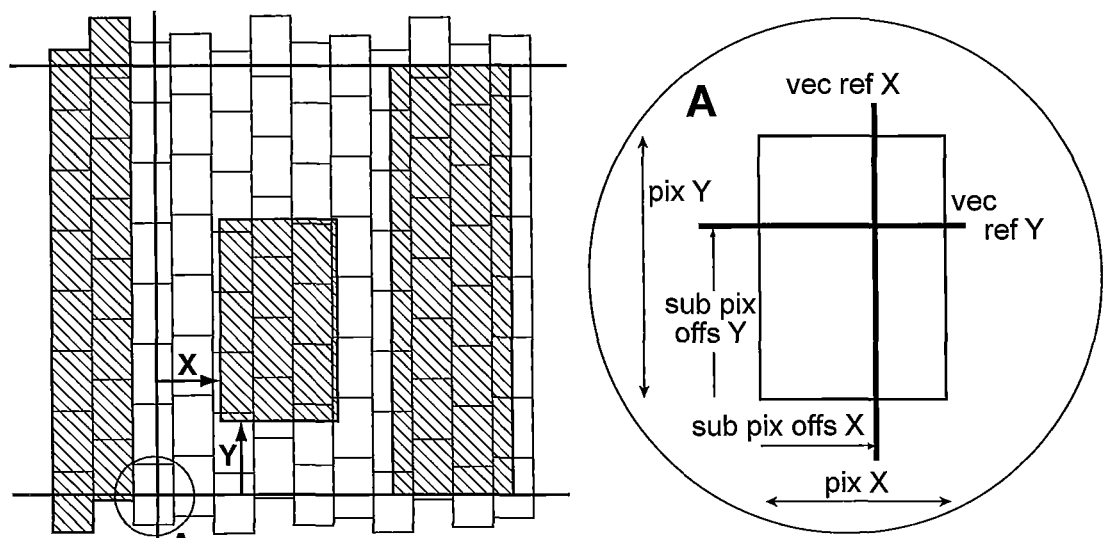
FIG. 29 is a diagram of layout pattern features overlaid on a stripe.

Rendering is the first step of the rasterization process. Shape information and dose information is rendered in pixels. FIG. 29 shows layout pattern features overlaid on a stripe to illustrate a rendering process. The shape information and dose information are described in vector format in the dose map and are usually field based. The pixel boundary values in X are fixed by the starting point of the machine (assume also that the first row will be written by beamlet 0). This will determine the relation between all pixel X coordinates (pix X idx in FIG. 29) and the corresponding beamlet (beamlet idx in FIG. 29) that will write the scan line. A scan line is a row of pixels in the Y direction.

From the typical X position of a field on a wafer and its X offset determined from a runtime metrology process, one can determine the first scan line (first field pixel row) of a particular field. Pixels and the field origin in this example are not aligned. Therefore "sub pix offs X" defines the offset from the left pixel X boundary where the field origin starts (as a reference for the vector format).

The pixel size in Y, the stripe width, overscan and pattern scaling will result in an integer number of pixels which are needed. One extra pixel may be added to allow for sub pixel shift. The pattern scaling factor will be the same for all beamlets and therefore all pixels will be of the same Y size.

A shift can always be split into an integer part (full pixel shift) and a fractional part (sub pixel shift). Full pixel shifts can be realized by shifting pixels in the bit frame. Subpixel shifts cannot be realized this way, but can be done by the rendering/dithering process. Shifts in Y direction are global (i.e. a global pattern shift in Y direction) or dedicated per beamlet (e.g. beam position or blanker timing offset correction). The rendering process should know which beamlet writes a scan line and shift (subpixel) the appropriate scan line pixels. Before rendering, the pixels is shifted so they are aligned with the "stripe vec ref Y" (see zoom-in A in figure) line which is the baseline in y direction for the vector format descriptions of features and dose.

Because the relation between the beamlets and the pixel X index is only fixed when starting the scan, subpixel shifts can only be dealt with real-time rendering. Offline rendering will always assume subpixel shifts of zero.

Channel Dithering

Figure 30:
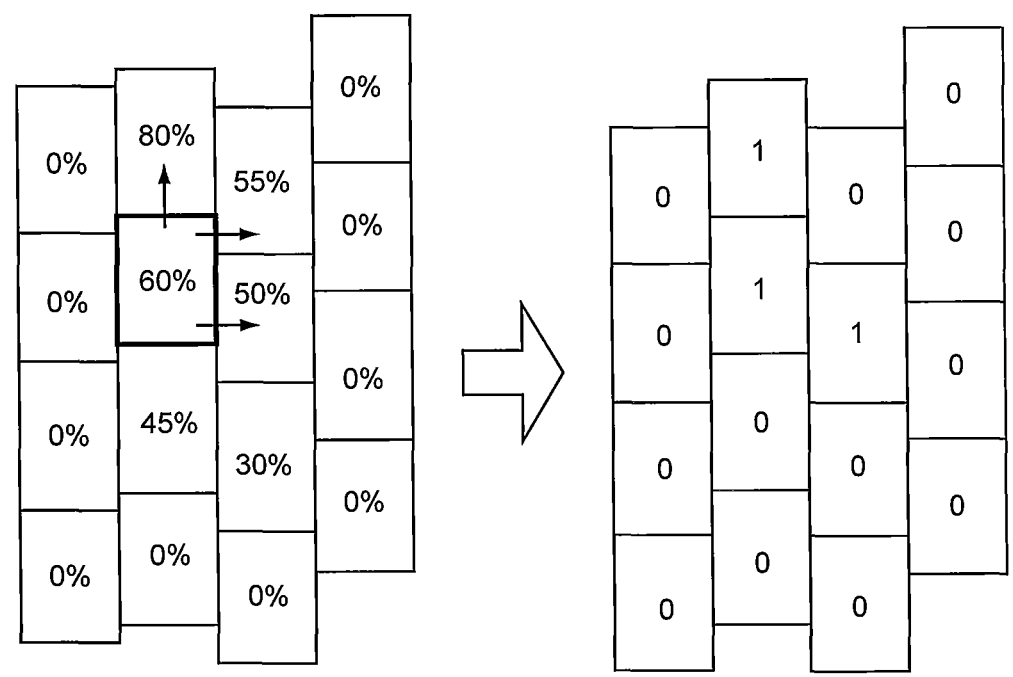
FIG. 30 is a diagram of a dithering process.

Dithering is the second step of the rasterization process. With dithering, a particular dose rate is realized by a switching sequence for a subchannel. Dithering essentially quantizes the multi-level grayscale pixels into two-level black/white pixels, and propagates the quantization errors in each pixel to neighboring pixels and force locally a particular average dose rate. FIG. 30 illustrates this process. Dithering techniques are typically used for realizing grayscales or color variations when printing. Some well known algorithms are error diffusion (2×2 matrix) and Floyd Steinberg (2×3 matrix).

Dithering is performed in one or two (serpentine) directions. Dithering algorithms typically need some pixels to warm up. Therefore the stripe width is extended with small margins for a better result.

For lithography purposes some improvements may be made. One improvement is that error propagation is preferably not propagated to zero-valued pixels. The error value should either be propagated in another direction or discarded. It is not useful to propagate a quantization error to pixels where a dose of zero is wanted. One should see this also in the light of reasonable values for CD and pitch. In case of a transition from a gray value to a zero value this guaranties that more zero pixels will follow.

The dithering process translates the grayscale pixels into black/white pixels. Because the dithering process must propagate the quantization error to its neighbor pixels, it also deals with the subpixel shift per scan line. FIG. 30 illustrates this process. To propagate the quantization error in an accurate way, error propagation to another scan line is not trivial because the scan lines are not aligned. The quantization error may be propagated on the basis of the amount of overlap between the neighboring pixels, so that pixels with a greater overlap receive a greater proportion of the propagated quantization error. An alternative and simpler strategy is to propagate the error only to the neighbor that has the biggest overlap.

The dose that is used for the dithering process preferably results from the dose rate from the rendering process, the dose factor per beamlet, and the scaling factor for the channel. The dose factor is preferably set per beamlet. Therefore the dithering module should also know the scan line to beamlet binding ("subbeam idx" in FIG. 30).

The dithering process will result in an on/off state for all pixels of the stripe. Before further processing the optional margin pixels are removed. Margin pixels are not needed in case of soft edges because there is already a smooth fade in and out at the stripe borders.

Depending on the architecture option, corrections are known or are unknown during the dithering process. For offline dithering subpixel shift cannot be done and the pixels will be aligned in Y direction.

For the dithering process the threshold is preferably always half of the 'white value', because the white value will deviate from the default because of beamlet dose corrections.

Channel Framing and Multiplexing

This process performs various tasks after dithering. The dithered pixel bits are projected into the scan line bit frame. Beamlet specific full pixel shifts may be performed in this operation. The appropriate bits are then assembled for a single deflection scan.

Figure 31:
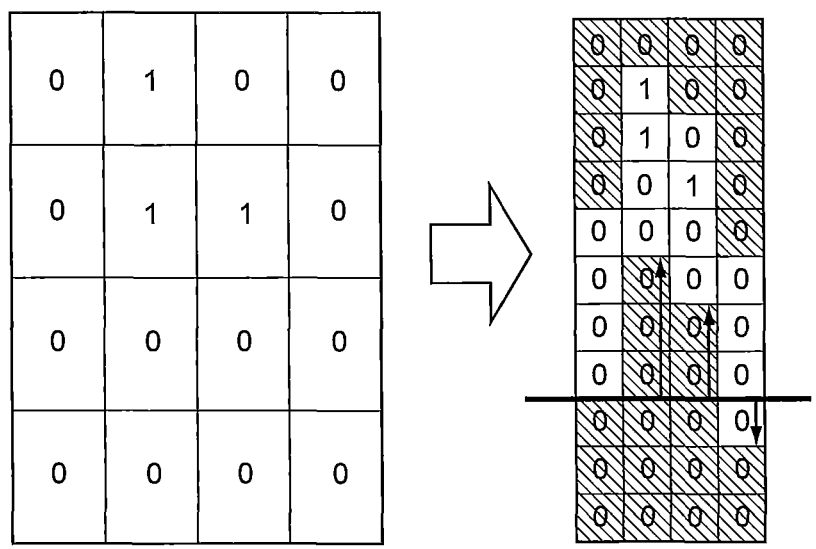
FIG. 31 is a diagram of bit shifting in a bit frame.

As mentioned earlier for the rendering process, the full pixel shift in Y direction may be done at a later stage. The pixels of the b/w bitmap are placed in their scan line bit frame. This bit frame is typically wider than the bitmap width because it makes allowance for shifting space. FIG. 31 illustrates this process. The vertical arrows indicate the full pixel shifts relative to a line of zero shift. If the pixels start on this line (like the left most scan line in the scan line bit frame in FIG. 31) its full pixel shift is zero and the pixels are perfectly centered in the scan line bit frame.

Figure 32:
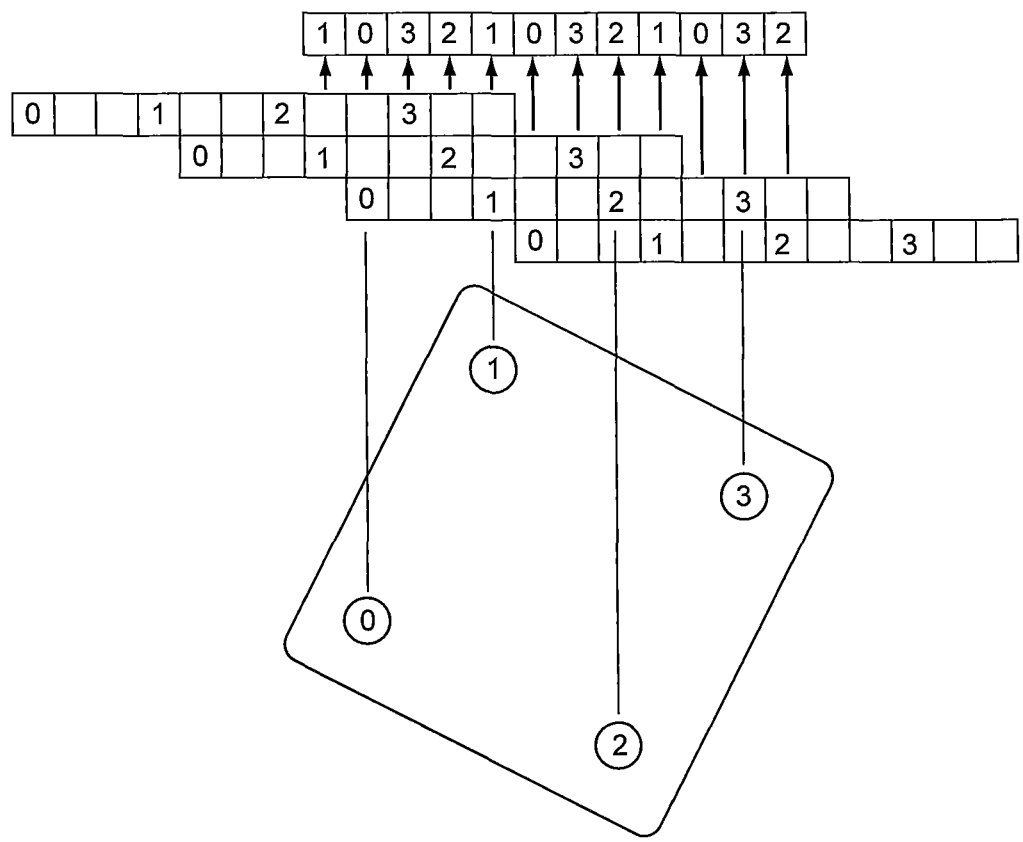
FIG. 32 is a diagram of beamlet positions for parameters N=4 and K=3.

The next step of assembling the bits of the deflection scan frame is shown in FIG. 32. This step is necessary to adapt to the correct writing strategy and present the bits that the blanker needs at the right moment. As an example, FIG. 32 shows the different beamlet positions in the bottom left part of the drawing for parameters N=4 and K=3. The locations are shown for different subsequent deflection scans: n, n+1, n+2 and n+3. At this step the scan line to beamlet mapping alone is not good enough. For this step we should know both the beamlet index and the deflection scan index. All bits for a particular deflection scan index are packed into a single deflection scan bit frame. In FIG. 32, the two bottom rows are filled with characters to trace the pixel position in the deflection scan bit frame.

Channel Encoding

As a last (optional) step, the deflection scan bit frame will be encoded to improve transmission of the data.

Data Flow

Figure 33:
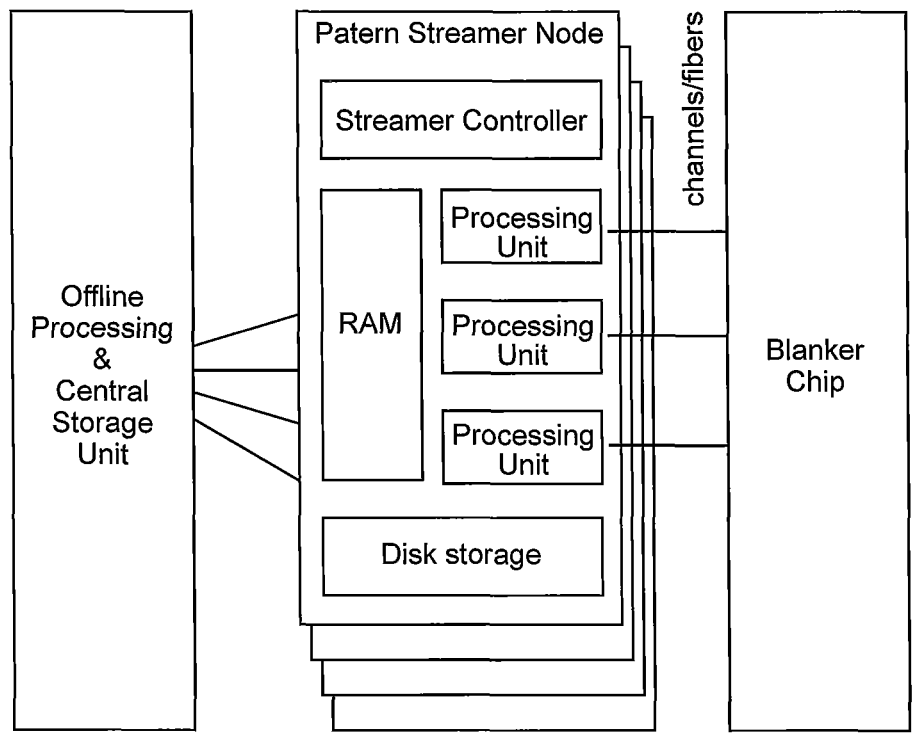
FIG. 33 is a schematic block diagram showing data processing and storage elements of a data path.

FIG. 33 is a schematic block diagram showing major data processing and storage elements of a data path, comprising an Offline Processing & Central Storage Unit (server), several Pattern Streamer Nodes, and a Blanker Chip (beamlet blanker array).

The Offline Processing & Central Storage Unit processes the input layout data (e.g. in GDS-II format) and generates input files for the stripes. According to the allocation of channels to stripes for each scans, the stripe data needs to eventually end up at the correct Pattern Streamer Node.

The Pattern Streamer Nodes contain both disk and RAM storage. The disk storage is used to store the input data for planned patterns, and the RAM stores the data needed by the Processing Units, which are streaming the current pattern.

Depending on the architecture option, the input data from the server is the same as the input data for the processing units. This is true for offline and real-time rasterization. For offline rasterization, a bitmap is received from the server and forwarded to the Processing Units. For real-time rasterization, input data in vector format is received from the server and forwarded to the Processing Units. The Processing Units will convert the vector format into bitmaps. For the inline architecture option, the input data in vector format is converted into bitmaps for the Processing Units.

Architectural Options

The functional units of the data path are shown in FIG. 28: (1) preprocessing, (2) channel splitting, (3) channel rendering, (4) channel dithering, (5) subchannel mapping and (6) channel multiplexing and encoding.

Preprocessing and channel splitting are preferably executed offline, and subchannel mapping, and channel multiplexing and encoding are preferably executed in real-time. However, the rasterization (comprising channel rendering and channel dithering) may be executed offline, inline, or in real-time. The architecture options discussed below are: (A) offline rasterization, (B) inline rasterization and per field offsets, (C) inline rasterization and aligned fields, (D) real-time rasterization.

In one embodiment of a lithography system the following requirements of the lithography system are defined which influence the data path architecture: Max field size of 26 mm×33 mm (y, x) and writing time per field of 2.5 seconds, plus another 2.5 seconds for second pass; 13,000 fibers/channels/stripes and 637,000 electron beamlets (13,000×49 beamlets per channel); Stripe width of 2 µm and overscan width (single sided) of 1.15 µm (comprised of 0.2 offset range (+/−200 nm)+0.2 scaling range (10% of stripe width)+ 0.5 soft edge (0.5 µm single sided)+0.25 writing strategy (assuming Wproj=420 nm: single sided Wproj/2=210 µm));

Max. deflection width of 4.3 μm (deflection frequency depends on writing strategy and drive speed); Typical pixel size of 3.5 nm, and pixel size range of 2 nm-6 nm (⅓ to 3×(typ. pixel size)$^2$); Dose grid resolution of 10-15 nm; Smallest pitch of 64 nm, smallest CD for lines of 22 nm, and smallest CD for holes of 32 nm; Input resolution of 0.25 nm and rasterization resolution of 0.1 nm.

Data pattern storage size on pattern streamer >10 patterns; time to update new correction parameters and be ready to start writing a new wafer 36 sec; upload time from server to pattern streamer <60 minutes; image from local storage into fast memory <60 sec (separate process step) and <6 minutes (during writing); and processing node of 12 channels with 7 processing units.

The lithography system is preferably able to deal with both positive and negative resist. The characteristics of the resist are preferably dealt with in the offline processing of the data path and the remaining part of the data path should not need to know about it. For writing a single wafer two passes may be used, a primary pass and a second or redundancy pass. The combination of the two will write all 13,000 stripes on the wafer.

Option A: Off-Line Rasterization

Figure 59:
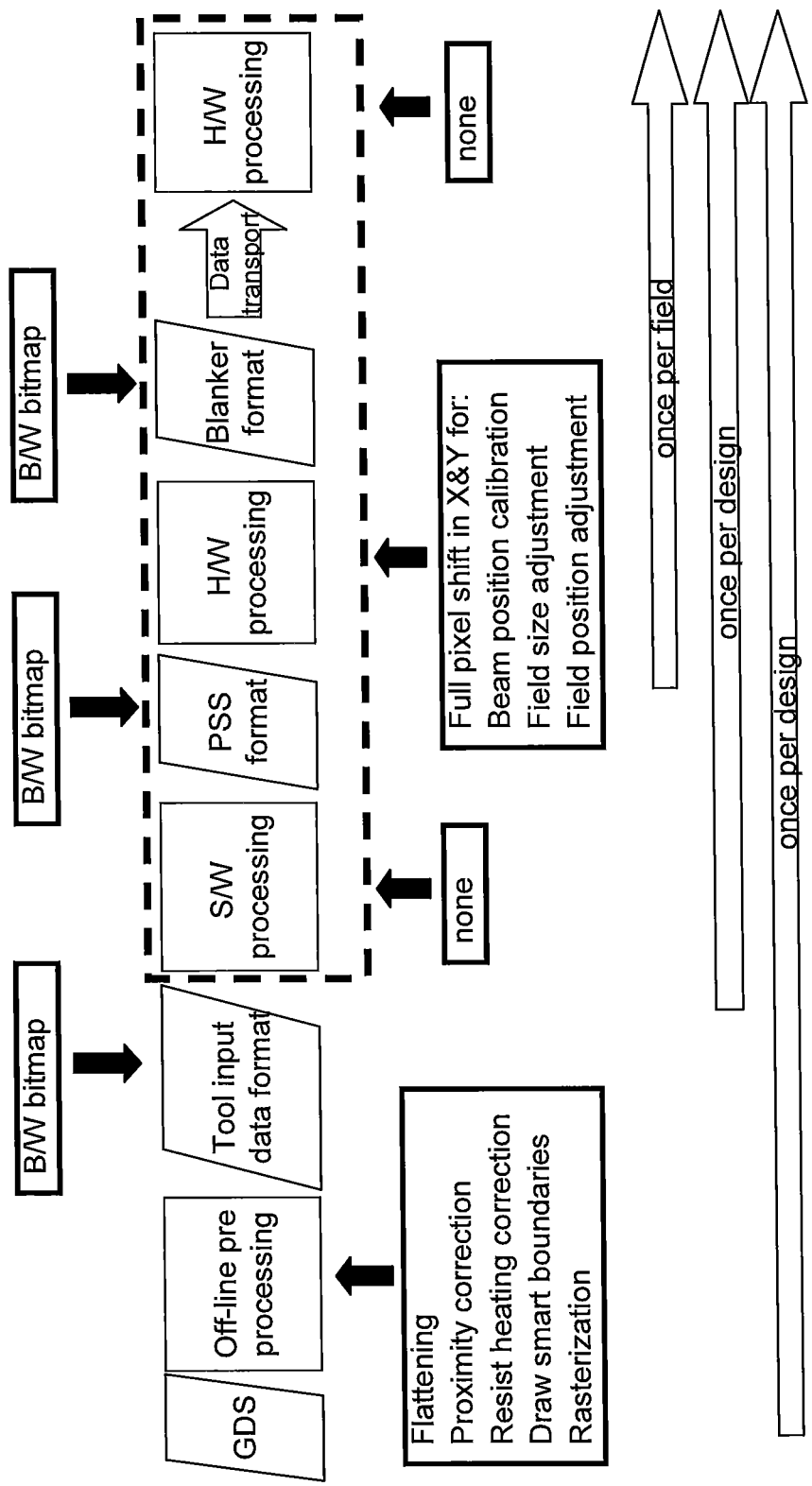
FIG. 59 is a functional flow diagram of an embodiment of a data path using off-line rasterization.

FIG. 59 shows an embodiment using off-line rasterization. The GDS-II format pattern data undergoes off-line processing, including proximity effect correction and resist heating correction. If smart boundaries are used, the boundaries are calculated at this stage. Rasterization (rendering and dithering) are performed to convert the vector pattern data to a two-level black/white bitmap, which is the tool input data format for this embodiment (i.e. the data format for transmission to the lithography system). This off-line processing is performed once for a given pattern design, for one or more batches of wafers.

Next, in-line processing of the tool input data is performed to generate the pattern system streaming (PSS) format, which is also in B/W bitmap format. The in-line processing is typically performed in software. The Pattern streamer then processes the PSS format data to generate blanker format data, ready for transmission to the beamlet blanker array. This processing is typically performed in hardware, and may include corrections involving a full pixel shift in the X and/or Y direction for beam position calibration, field size adjustment, and/or field position adjustment. This processing may be performed per field. The blanker format pattern data is then transmitted to the lithography system for exposure of the wafer.

In this architecture option much of the work is done off-line. Rasterization will be executed offline and once per design. For this option input data for the lithography system is a stripe pattern description in a black/white (B/W) bitmap format. The bitmap is processed in real-time. Therefore only the corrections provided by stage 5 (channel framing and multiplexing, see FIG. 34) are available. The corrections of stage 5 are the full pixel shift corrections, which may include global pattern shifting in X and Y directions per channel, blanker timing offset (Y direction), and blanker hole offset (Y direction).

The X offset has influence on beamlet to row mapping (blanker hole offset and blanker timing offset). The appropriate Y offsets will be added and rounded to the nearest full pixel.

As a consequence of only full pixel corrections, a relatively small pixel size (~2 nm) is desirable to meet accuracy specifications. The disadvantage of using small pixels is that more bandwidth is needed than may be available for the channel, which may result in a lower throughput or require using multiple fibers per channel.

Figure 35:
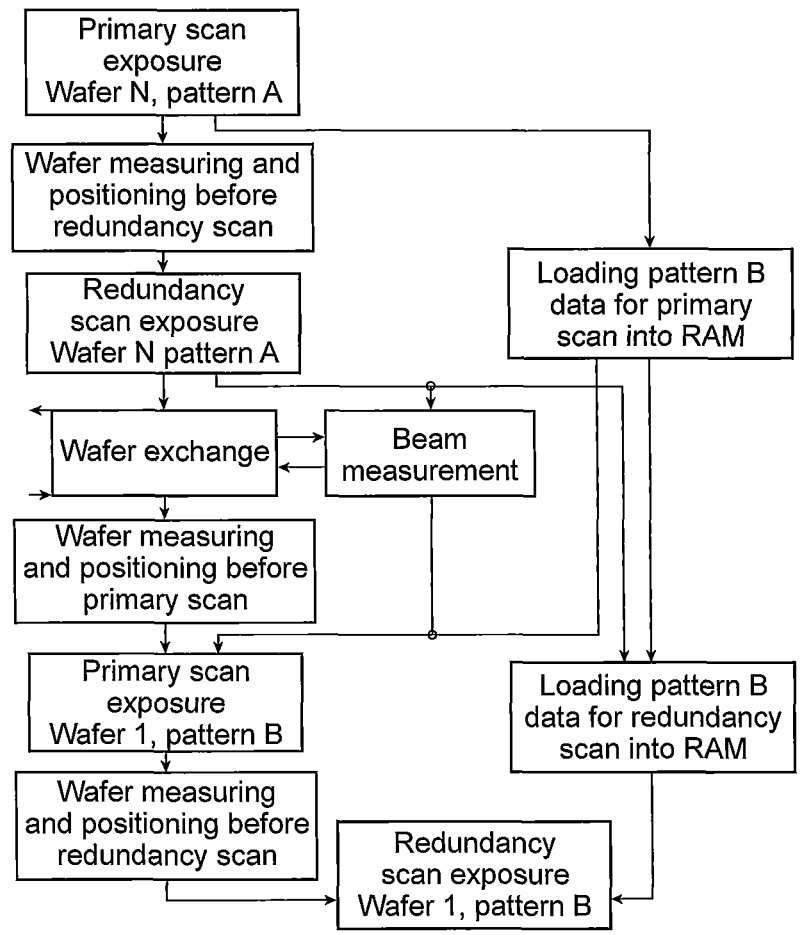
FIG. 35 is a flow diagram showing dependencies of processes for the data path of FIG. 34.

In FIG. 35 the process flow for this architecture option is shown. The focus is on the moment of changing batches. The process flow may be analyzed to find the intervals in the cycle of the lithography system that may be used for loading pattern data, so that these processes may run in parallel to maximize throughput. At the central bar the batch changes from pattern A to pattern B. For this diagram it assumed that there is no reason to reshuffle beams and stripes (because of failing beams). Loading the primary part of the new pattern (the stripes written in the primary scan for pattern B) can start right after the last primary scan is finished. The diagram also shows that loading the second scan/redundancy scan part of the new pattern can start relatively late and should finish when the second scan/redundancy scan for the new pattern should start.

The duration of both scans G and F are typically 2.5 minutes. A total duration for the processes H and D in parallel may be about 1 minute. Thus, the time available for loading the total pattern equals the time for both scans and the wafer exchange (about 6 minutes), assuming that no reshuffling of stripe data among nodes is necessary. A stripe data reshuffle might be necessary when new failing channels are found with process D.

Figure 36:
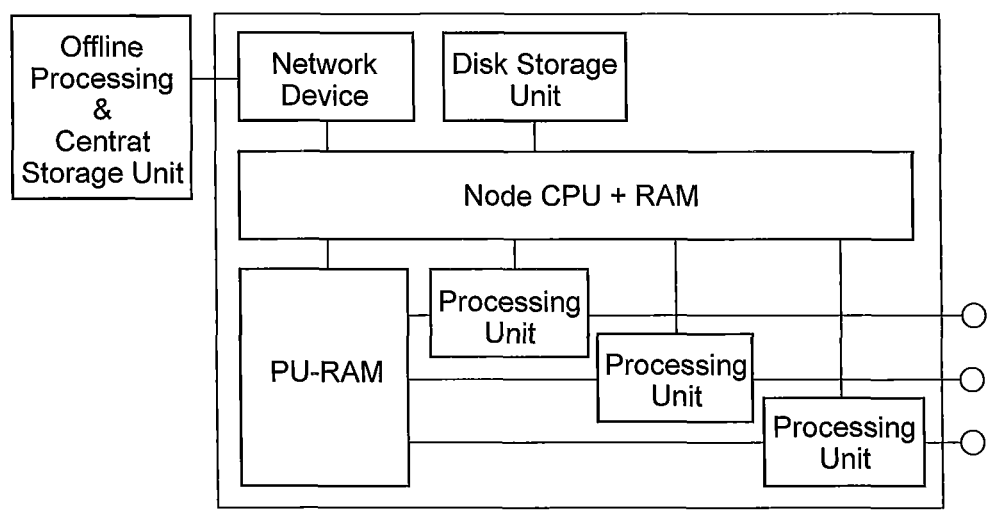
FIG. 36 is a block diagram of elements of a pattern streamer node.

FIG. 36 is a block diagram of major elements of a Pattern Streamer Node for an offline rasterization architecture (option A). In FIG. 36, each node comprises several elements. A node CPU coordinates the processes on the node and moves data around. A network device communicates with the server (Offline Processing & Central Storage Unit) and receives the layout data to stream.

A disk storage unit stores the bitmaps for the processing units. There may be several versions of the bitmaps available on disk. Reliability and read performance may be improved by using an array of disk in certain RAID modes. The read speed of disk drives is increased by striping (RAID 0, distributing the data over an array of disks). Reliability may be improved by storing data in a redundant way (RAID 5, N disks: storage size=N−1×disk size).

Processing unit memory (PU-RAM) store pattern data. When scanning, the processing units read their pattern data from this RAM. The CPU loads the pattern data into the RAM before the scans. The processing units stream the pattern data and generate the optical signals for transmission to the blanker.

Figure 37:
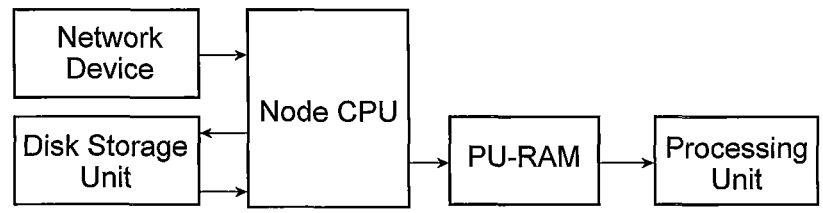
FIG. 37 is a functional diagram showing data flow between elements of the pattern streamer node of FIG. 36.
Figure 38:
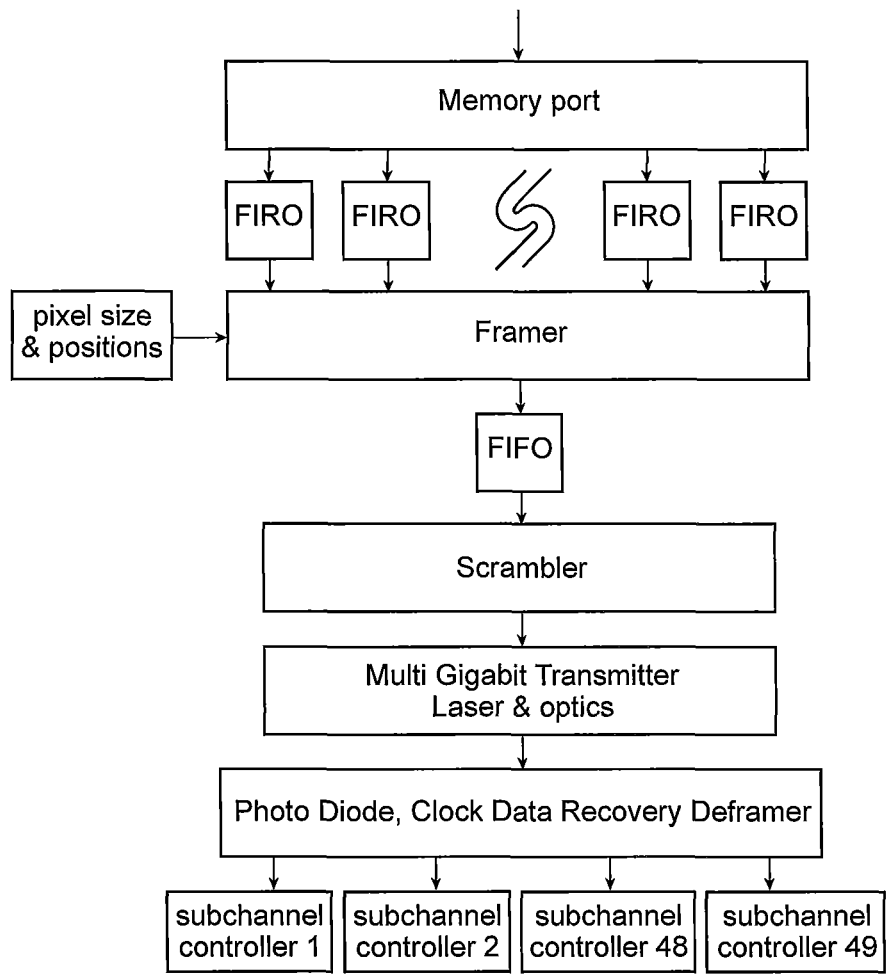
FIG. 38 is a block diagram showing detail of processing and transmission elements of a data path.

The typical dataflow for this configuration is shown in FIG. 37. Pattern data is received by the Node CPU from the network device (1) and stored on disk (2). Whenever pattern data is needed for a scan, the node CPU reads the data from disk (3) and stores it in the PU-RAM (4). While scanning, the processing units read their pattern data from the PU-RAM (5).

Important characteristics of this architecture are the size of the PU-RAM, the PU-RAM load time, the disk load time, and disk size. The PU-RAM load time (the time to load all stripe data in the PU-RAM) will mainly depend on the performance of the disk storage unit. Regarding the disk load time, bitmaps for new scans need to be downloaded from the server, and the server may be a bottleneck for communication. The disk load time may be improved by increasing the bandwidth from server to node or compressing the bitmap data on the server. For the disk size, it is assumed that to overcome the distribution bottleneck (the server bandwidth), multiple patterns (e.g. 10) may be stored in the disk storage unit. Depending on requirements concerning availability or read speed, disks may be configured for a particular RAID level.

In the offline and inline concepts, the reordering and mapping of the preprocessed pixels may be performed by a processing unit comprising a field programmable gate array (FPGA). This processing unit will allow full pixel shifts and can reorder the data from memory to be multiplexed towards the blanker.

Compression may also be used for architecture option A. Possible configurations include: no compression, compressed dithered images, or compressed grayscale images.

For no compression, the pattern streamer node will store (non-compressed) dithered images on disk. It is also possible to compress this image on the server before distribution. In this situation the pattern streamer should decompress the image anyway after receiving, but this does not seem to be a bottleneck because there is a reasonable amount of time for this process.

Figure 39:
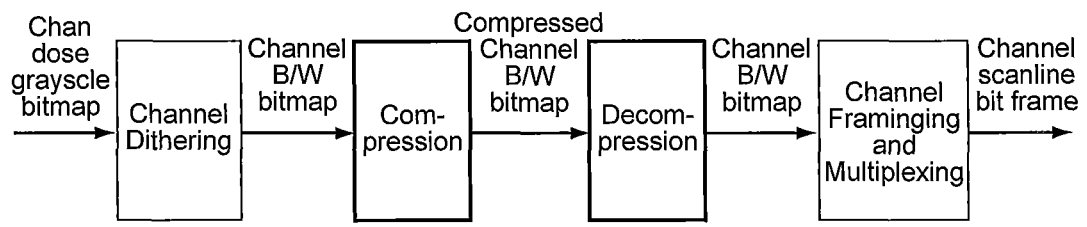
FIG. 39 is a functional block diagram of a portion of a data path including compression and decompression functions.

For compressed dithered images, compression lowers the distribution effort (communication time) and lowers the RAM size requirement. For this solution the offline process must compress the dithered image, while the FPGA should decompress the image internally and process it. Therefore the image in RAM is much smaller. In terms of the functional units of FIG. 34, compression and decompression functions have are inserted after dithering as shown in FIG. 39.

Figure 40:
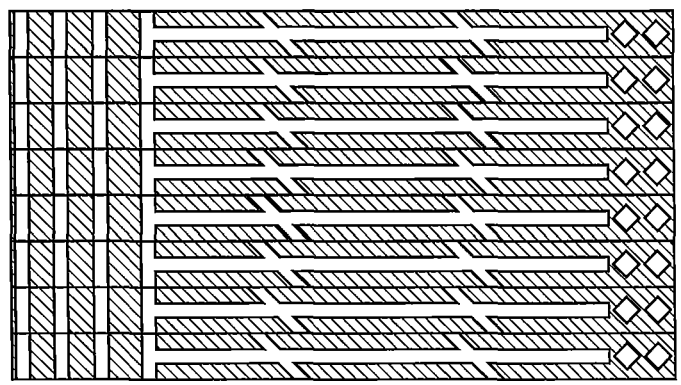
FIG. 40 illustrates an example of a dithered monochrome test image.

Compression may be less effective for the dithered images because they contain a lot of zero values, and the non-zero areas may be hard to compress due to variations in dose values. FIG. 40 shows a dithered test image, using a monochrome (1 bit per pixel) image. The image (FIG. 40) is 8 times the dithered version of FIG. 42 while changing the dose level every repetition. By changing the dose every repetition, the compression tool is not able to utilize the repetition and is less efficient. GZIP and Optipng are possible compression methods. Compression of dithered images is not easy and will approximately deliver a compression ration in the order of 1:4 (mainly compressing sequences of zeros). Using a compression ratio of 1:4, the size of a typical stripe image using 2 nm pixels would result in 4352 MB uncompressed and 1088 MB compressed per stripe, and 61 GB uncompressed and 15.2 GB compressed per streamer (i.e. 14×). In this scenario, compressing the dithered image will reduce the RAM size to 16 GByte, providing an advantage for load time (disk->RAM of about 2 minutes for a single disk) and distribution time (server->disk of about 1.5 hour). The 2 minutes load time fits into a time window for loading in the process flow. The downside is that the FPGA is enhanced with decompression per channel that keeps up with the real-time data rate of about 5 Gbit/s. In addition, the server preferably compresses all data initially.

Figure 34:
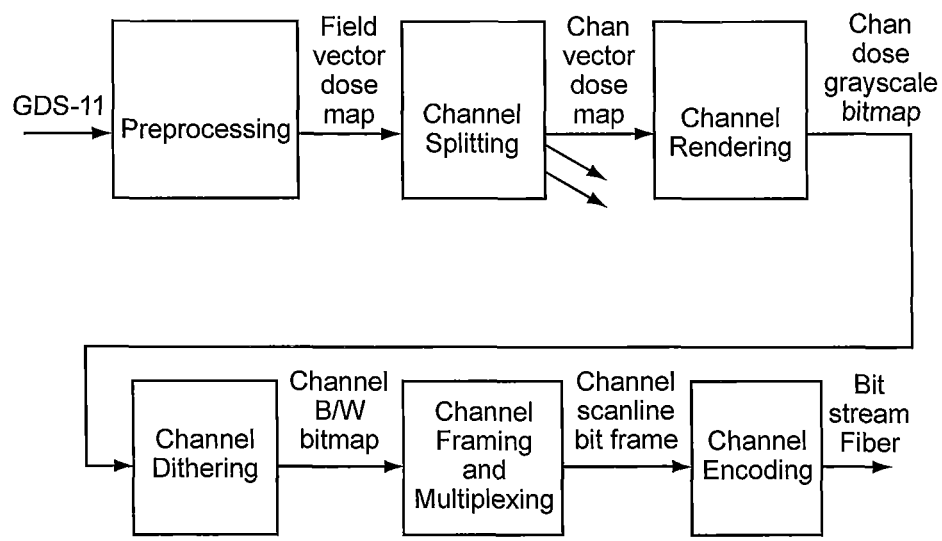
FIG. 34 is a functional block diagram of a second embodiment of a data path.
Figure 41:
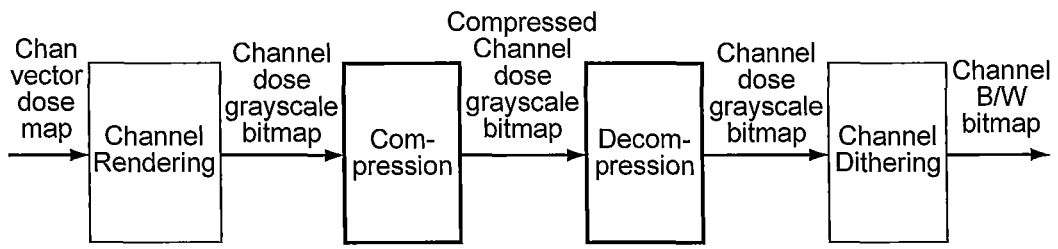
FIG. 41 is a functional block diagram of a portion of data path including compression and decompression functions after channel rendering.

For compressed grayscale images, in terms of the functional units of FIG. 34, the compression and decompression functions should be inserted after dithering as shown in FIG. 41. After rendering, the offline process should compress the grayscale image, and the FPGA decompress, dither and process the image.

Figure 42:
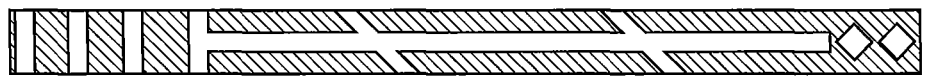
FIG. 42 shows an example of a rendered bitmap of a cell.

FIG. 42 shows an example of a rendered bitmap of a cell (64×1000 nm@ 2 nm pixel). For compressions GZIP and optipng (both open source compression tools) are used. Both methods are lossless. GZIP is a general purpose compression tool, while optipng is specialized in compressing 2D images. PNG compression consists of two stages, a 2D predictor filter and a GZIP compressor, so that optipng provides superior compression ratio. Depending on the patterns found in real designs, there may be more repetition in a larger image.

Using a compression ratio of 1:40 (PNG) and 2 nm pixels, the compression rate shrinks the image to a size comparable to the vector format. Using this approach however requires PNG decompression to be integrated in the Processing Unit FPGA. When the bitmap size grows with a factor of 4, the compressed images grow only a factor 1.3 for GZIP and a factor 2 for PNG. Compression works well in combination with small pixels.

Figure 43:
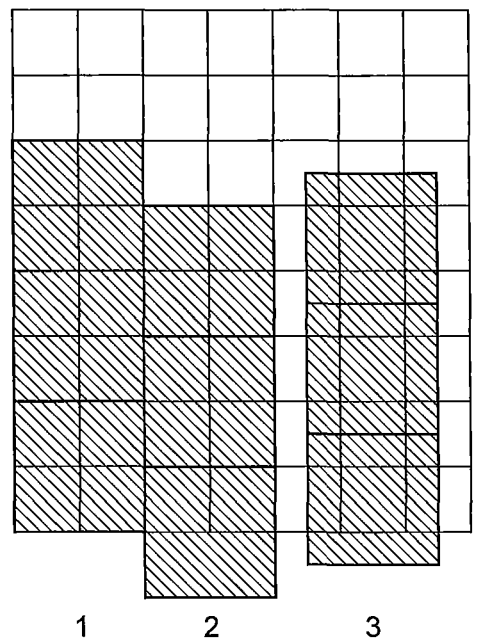
FIG. 43 is a conceptual diagram of a small grid of input pixels and big output pixels.

An interesting observation for this approach of using grayscale pixels is that it potentially allows for shifting and constructing bigger pixels for streaming to the blanker. Values of bigger pixels could be calculated from the smaller pixels by using a linear combination of the values of the smaller pixels. The input images could be considered oversampled. FIG. 43 shows this concept of the small grid of input pixels and the big output pixels. The example is given where the ratio in pixel size is 1:2, however other ratios are also possible. The FPGA will uncompress the bitmap and combine several small pixels to form a big pixel for streaming to the blanker. The advantage is that this approach will limit the bandwidth on the fiber (big output pixels), even while using small input pixels. The bandwidth on the fiber is considered a bottleneck, and may require the use of two fibers per channel for streaming 2 nm pixels to the blanker.

Remarks regarding this architecture:
A dose map is preferably still added to the input bitmap and used by the FPGA
Dose corrections are possible because dithering happens in the FPGA
Shift in X and Y when constructing a blanker pixel from the input pixels, accuracy depends on actual pixel sizes.
Decompression and dithering in FPGA is required.
Compression is added to the offline process. It is expected that compression will increase the processing effort significantly.

The RAM size is decreased with a compression ratio of 1:40. For this scenario, the FPGA is equipped with real-time unzip logic that is able to keep up with the rate a grayscale is expanded (» 5 Gbit/s).

Option B and C: Inline Rasterization

Figure 60:
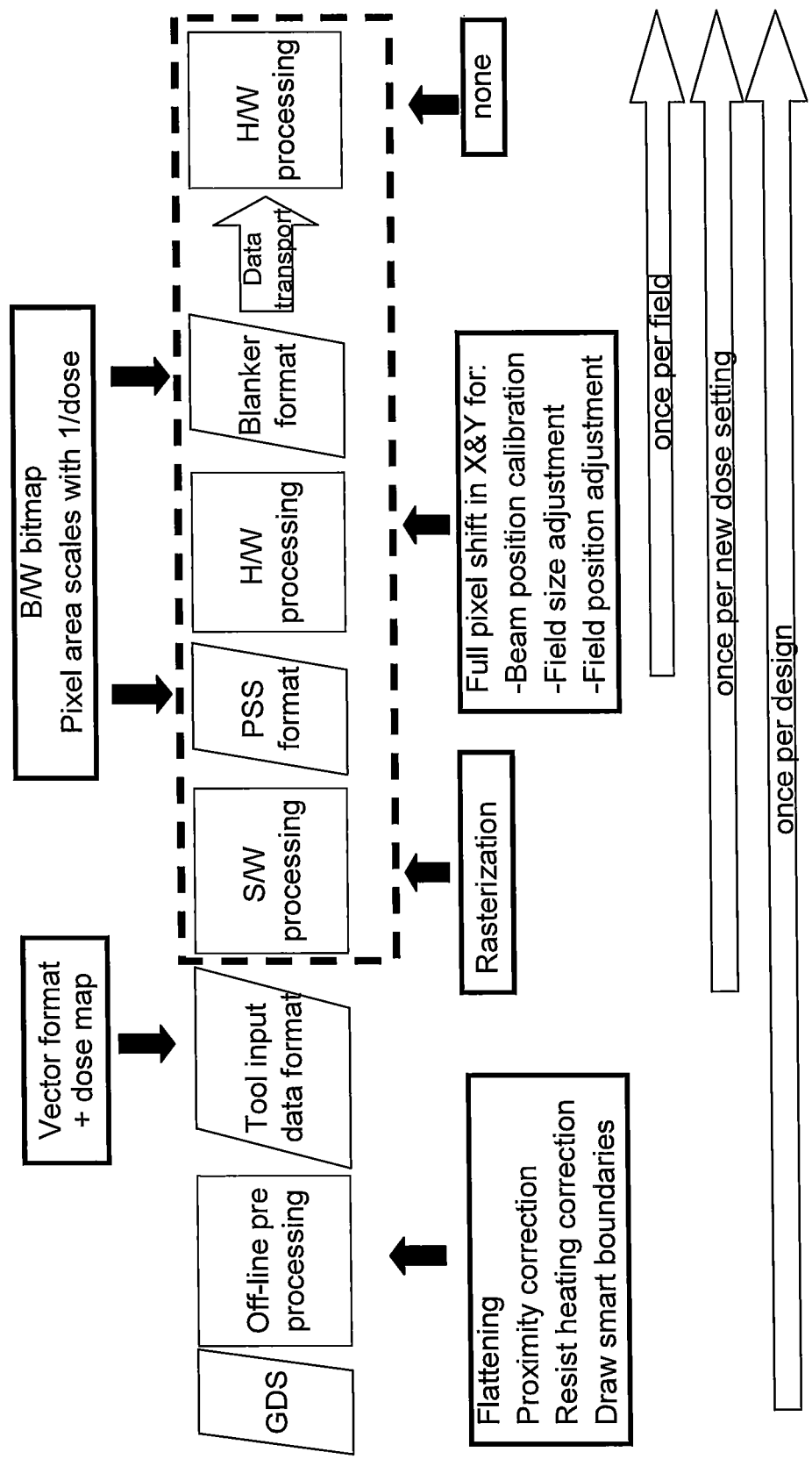
FIG. 60 is a functional flow diagram of an embodiment of a data path using in-line rasterization.

FIG. 60 shows an embodiment using in-line rasterization. The GDS-II format pattern data undergoes off-line processing as for the off-line embodiment of FIG. 59, including proximity effect correction, resist heating correction, and smart boundaries if used. The corrected vector pattern data and dose map is the tool input data format for this embodiment. This off-line processing is performed once for a given pattern design, for one or more batches of wafers.

Next, in-line processing of the vector tool input data is performed to rasterize the vector data to generate B/W bitmap data, which is the pattern system streaming (PSS) format in this embodiment. This processing is typically performed in software, and may be performed when a new dose setting is set. The Pattern streamer then processes the PSS format data to generate blanker format data as in the FIG. 59 embodiment, including corrections involving a full pixel shift in the X and/or Y direction for beam position calibration, field size adjustment, and/or field position adjustment as before on the bitmap data. This processing may be performed per field. The blanker format pattern data is then transmitted to the lithography system for exposure of the wafer.

Figure 61:
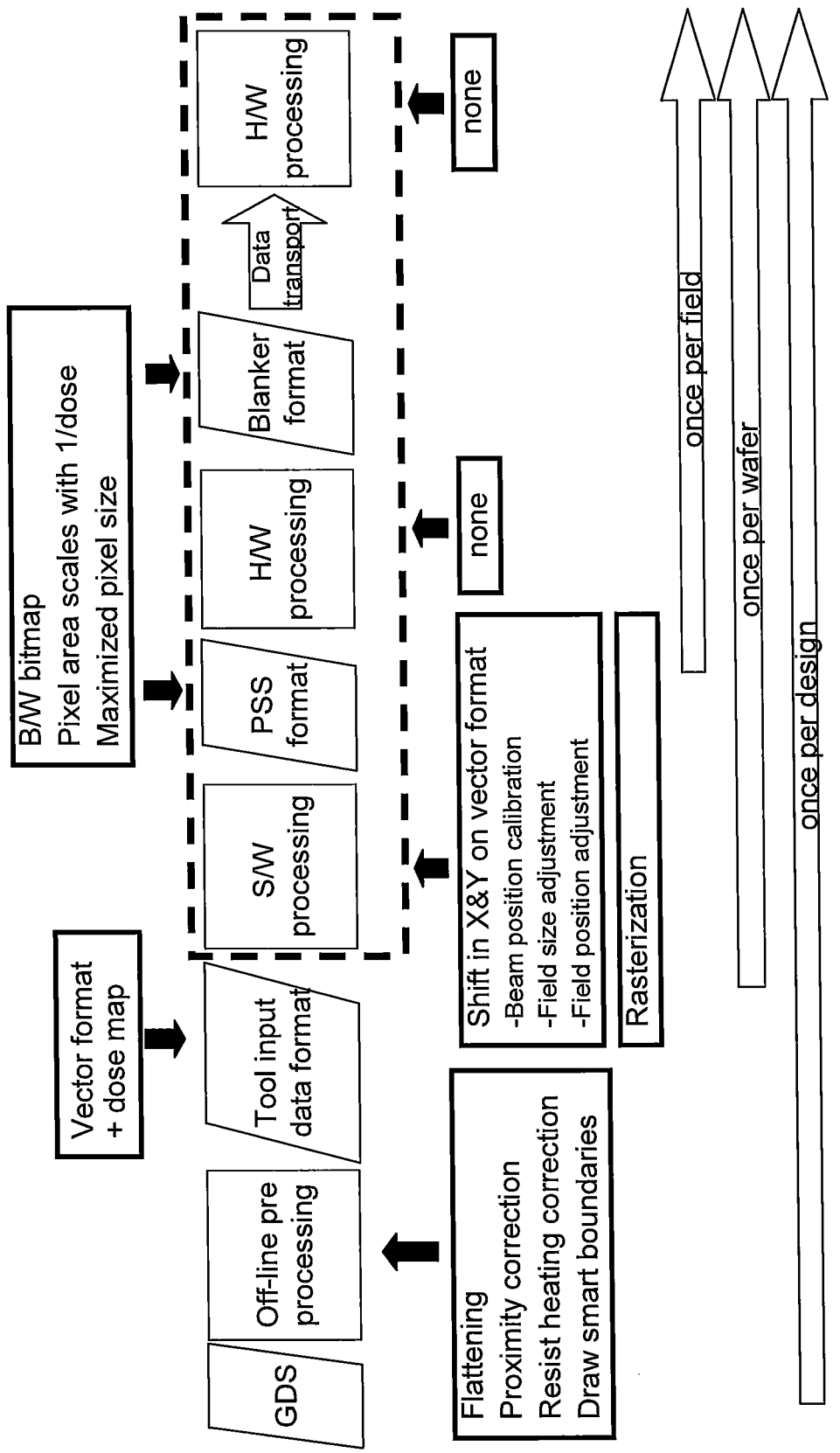
FIG. 61 is a functional flow diagram of another embodiment of a data path using in-line rasterization.

FIG. 61 shows a second embodiment using in-line rasterization. This is similar to the FIG. 60 embodiment except corrections for beam position calibration, field size adjustment, and/or field position adjustment are made on the vector tool input data. Because these corrections are made on vector data, both full pixel shifts and subpixel shifts in the X and Y direction can be made. These corrections are typically performed in software, and may be performed per wafer. After the corrections have been made, rasterization is performed to generate the PSS format data for input to the pattern streamer.

Figure 44:
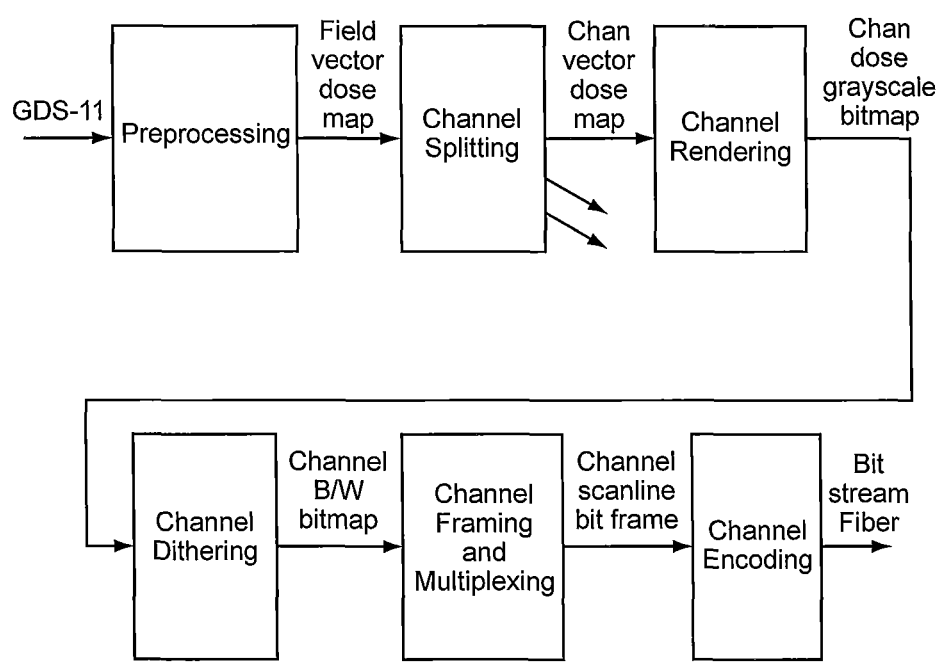
FIG. 44 is a functional block diagram of another embodiment of a data path.

FIG. 44 shows inline rasterization functional units assigned to process steps. For this architecture the functional units 3 and 4 (rasterization) are executed inline. For this option input data for the lithography system will be a stripe pattern description in vector format. The rasterization will be done on demand (per wafer, per several wafers, per series of wafers). Changes in global offsets or in the global dose can trigger the inline rasterization.

An appropriate dose is set by changing the pixel area. The pixel area may be changed by changing both the X and Y pixel size. The X size can however only be changed to certain values (as discussed with reference to FIG. 10). For fine tuning of a global dose, changes to the Y size may be used. Assuming a fixed bitrate, the Y pixel size is set by changing the deflection frequency and using a different pattern scaling factor.

Because the rasterization results will be used for all fields, field specific subpixel offsets cannot be accounted for. Offsets per field are preferably eventually rounded to full pixel, which is accounted for in real-time by stage 5 (channel framing and multiplexing).

Corrections may include:
Field pattern shifting in X and Y (full pixel shifts only). Parameters updated once per field.
Global pattern shifting in X and Y (at subpixel resolution). Parameter update once per wafer scan or more.
Global dose change through pattern scaling. Parameter update once per wafer scan or more.

Both dose corrections per beamlet and subpixel shifts cannot be dealt with. The root cause is the capability of shifting in X direction which controls the row to beamlet mapping. To limit errors, this option will typically lead to using a relative small pixel size (about 2 nm). This option is a special case compared to architecture option B in the sense that a beamlet will write the same line of every field. In other words, the row to beamlet mapping is fixed and the same for every field. Therefore we can compensate for beamlet specific corrections. Because subpixel corrections is rendered properly, the beamlets will write the pattern with greater accuracy. Therefore the pixel size is larger (~3.5 nm), which does not result in a higher optical channel count towards the blanker.

All corrections are supported, however fields are located at ideal positions, and therefore there is no offset in X and Y between fields. The process flow might be different from architecture option A. For architecture options B and C new bitmaps need to be generated frequently from the vector input files per wafer or several wafers.

Figure 45:
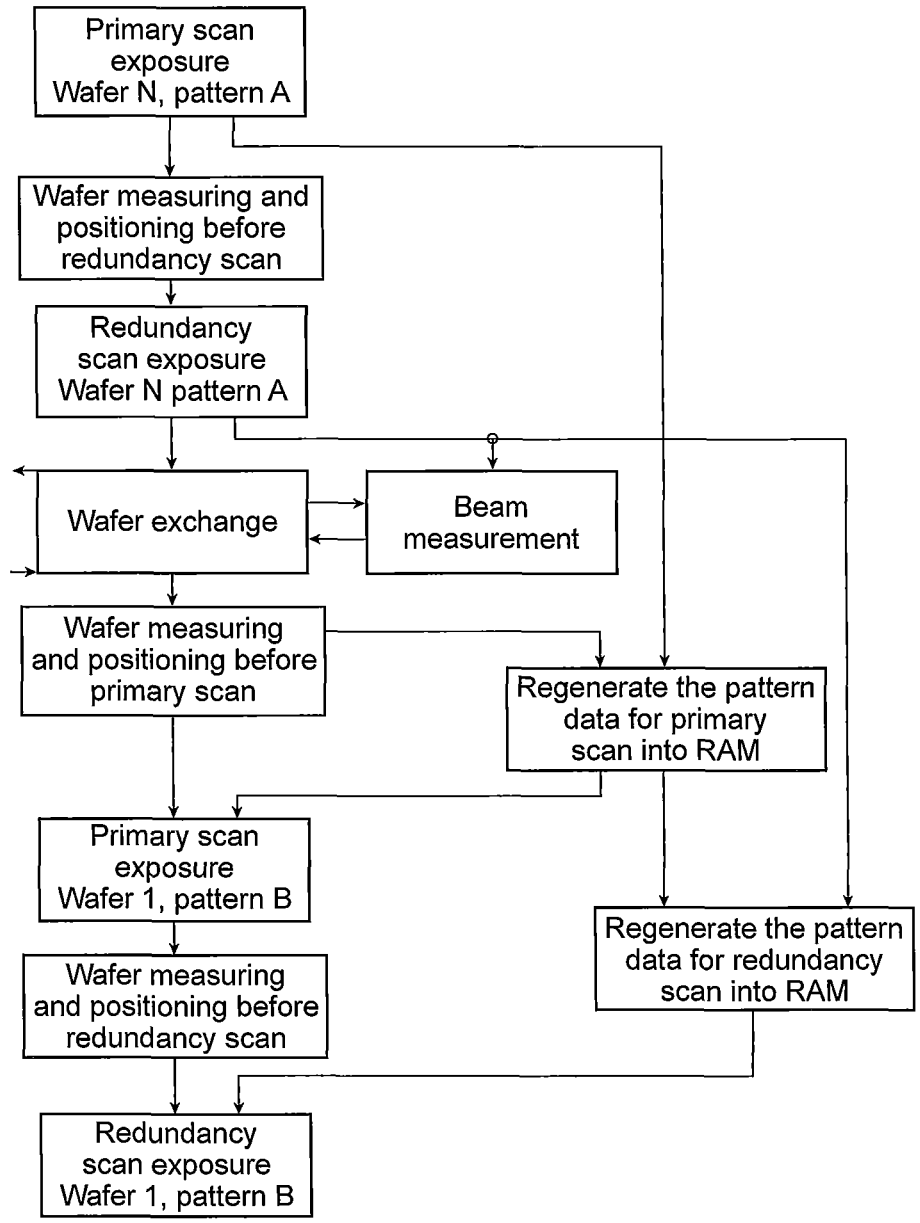
FIG. 45 is a flow diagram showing dependencies of processes for the data path of FIG. 44.
Figure 46:
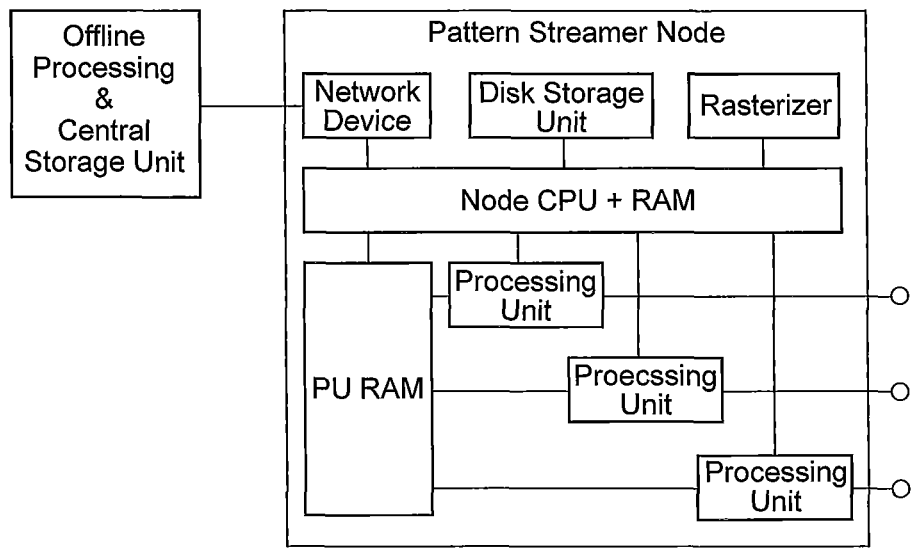
FIG. 46 is a block diagram of elements of a pattern streamer node.

F) Primary scan In case the regeneration of the new pattern bitmap there might be a dependency on the measuring of the wafer (E1). FIG. 45 shows the process flow in case of a dependency. When this dependency is not there the process flow will be similar to the process flow of FIG. 35. The dependency is also not there when the information needed for the regeneration is estimated effectively (slow varying process parameter). So the regeneration can start early, but has to be verified after the real measurement. In case of an unexpected mismatch, the regeneration is restarted and we will lose some throughput. Finally a consideration is that in case enough RAM is available, processing could start earlier but after the primary scan. This would again add 2.5 min to the timeframe for processing A solution that supports inline processing will need an extremely powerful processing unit to meet reasonable timing requirements. For worst case conditions (2.00 nm pixel, max stitching), the number of pixels to render will be 35 Gpixels per stripe. The size of the vector data will be 606 MByte per stripe. In FIG. 46 the architecture for in-line processing is shown The architecture shows a block "rasterizer". This block will be responsible for the inline processing task of rendering the vector format into a B/W image of the stripe. Options for implementing an in-line rasterizer are:

Offline, processing and control

Using FPGA logic. For the real-time rasterization FPGA logic is used for the same purpose. For real-time rasterization a lot of resources on the FPGA must be used for meeting the performance requirements. Using FPGA technology for an in-line rasterization solution could be implemented with fewer resources than the real-time version.

Using a GPU technology. A Graphical Processing Unit of GPU is a processor that is typically used for video processing. These processors is found in consumers systems (desktop and laptop) for rendering 3D graphics (games, Vista). GPUs are utilizing massive parallelism. The G80 architecture utilizes 128 thread processors, while the state of the art card GTX280 utilizes 240 thread processors. The performance of a thread processor is roughly a fifth of an Intel core CPU. The performance of a GPU depends clearly on the degree of parallelism in its tasks. Rendering is a task that is relatively easy to parallelize. The dithering (in one direction) task is parallel to a certain extent (diagonal).

Using state of the art multicore CPUs. Today's multicore CPUs are very powerful. An example is Intel's new architecture: the Core 17 technology. The FPGA solution is obviously a relatively cheap solution. Compared to architecture option D (rasterization real-time in FPGA), the performance requirements for this solution are much more relaxed (2.5 sec for 7 stripes compared to 6 min for 14 stripes). Therefore the FPGA is much smaller (and cheaper). Still the feasibility depends on the feasibility of the implementation of the render algorithm in VHDL.

When evaluating software solutions, the GPU technology would come out best because the rendering task will benefit from the high degree of parallelism available in a GPU. The downside is that the GPU technology is evolving rapidly. This problem of fast evolving hardware has been solved (at least by NVIDIA) by providing the stable CUDA (Compute Unified Device Architecture) API. This API fits a large range of graphic card model and versions. Today there is even a product line for high performance computing (Tesla). This product line focuses on scientific calculations instead of gaming graphics.

Figure 47:
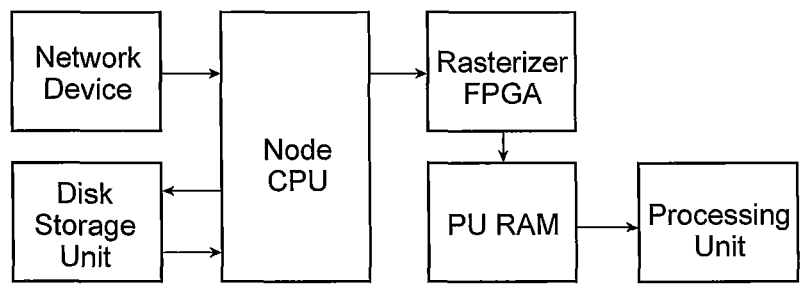
FIGS. 47 and 48 are functional diagrams showing alternative data flow between elements of the pattern streamer node of FIG. 46.
Figure 48:
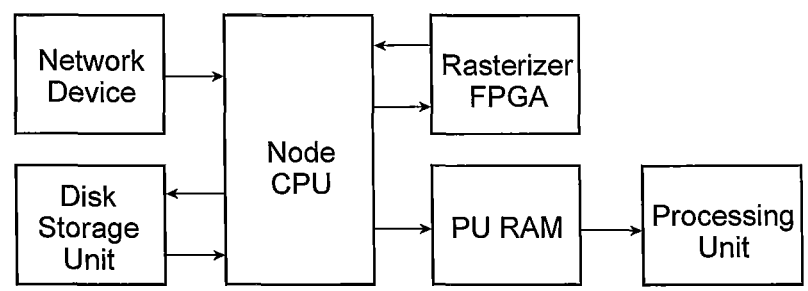
Figure 49:
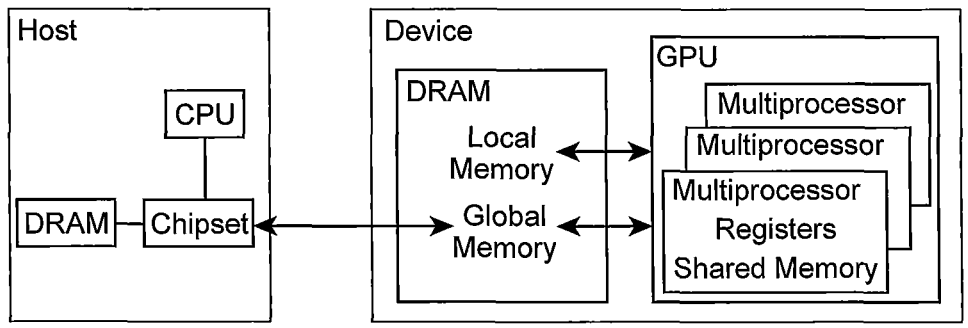
FIG. 49 is a schematic diagram of communication between elements of a data path.
Figure 50:
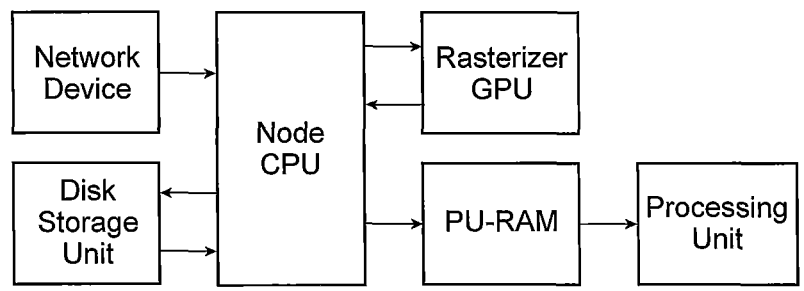
FIG. 50 is a functional diagram showing alternative data flow between elements of the pattern streamer node.
Figure 51:
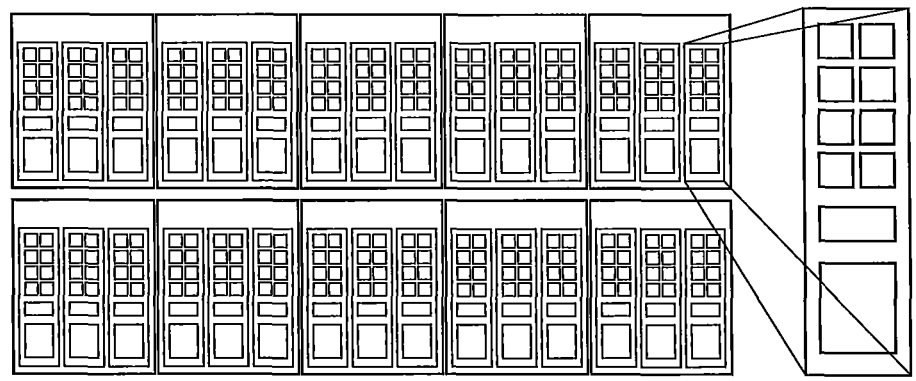
FIG. 51 is a diagram of an internal architecture of a GPU for a data path.

For this architecture the process is described in the following steps:

Vector format input files are transferred from the server to the hard disk. Before starting the initial scan or after a parameter change, the rasterization module should process the input files to produce a new bitmap. The bitmap is stored in the RAM memory of the processing units. When scanning, the processing units read the bitmap data from their RAM. This process is similar for architecture options A, B and C. The rasterizer is implemented using FPGA technology. The logic would be similar as used for the real-time rasterization option. Compared to the real-time solution the inline solution is much more lightweight. Therefore fewer logic cells will be needed. For the FPGA solution there are two options for the dataflow. In FIG. 47 the dataflow is shown where the FPGA stores its output directly in the PU-RAM. This solution is appropriate in case the logic of the rasterizer is combined in the same FPGA as the processing units. In that case the components share the same memory controller. According the process diagram of FIG. 45 the processes is able to run in parallel. Potential interference is however an argument to separate the FPGAs. Another possibility is shown in FIG. 48 where the Node CPU will be responsible for fetching the results from the FPGA and storing it in the PU-RAM. In FIG. 49 the communication between a host and a GPU is shown. The host stores the program (kernel) and the data in the DRAM of the GPU and triggers the program. The multiprocessors fetch the data they need from the DRAM and write back the results into the DRAM. On completion of the total operation the host will fetch the data from the DRAM of the GPU. The interface between the host and the GPU is typically a PCIe×16 bus and DMA is involved in data transfers. When using standard GPU hardware the interface between the CPU node and the GPU card is PCI-Express/16. The internal architecture of a GPU (see FIG. 51) shows that it is completely focused on parallelism. This particular GPU contains 30 multiprocessors and 8 thread processors per multiprocessor. This adds up to 240 thread processors. A multiprocessor follows the SIMD (Single Instruction Multiple Data) pattern and uses on-chip (fast) shared memory for its 8 thread processors. To utilize the performance of an GPU architecture its tasks is partitioned in many parallel tasks. The rasterization task consists of two subtasks: rendering and dithering.

The nature of the rendering task is that it is relatively easy to parallelize. Rendering a scan line or even a pixel could be seen as independent processes. The nature of the dithering task is more serial because the quantization error is propagated in two directions (on the same lin in the direction of the dithering movement and to the next line). However, when dithering in only one direction, dithering is parallelized along a diagonal. Dithering the next line should lag by one or two cells to process the quantization error of the previous line correctly.

Disadvantages of using a GPU include: GPUs are not cheap; considerable power consumption when it is running (e.g. TDP=200W); and creating parallel code for the GPU that leverages its power is not a trivial task.

Figure 52:
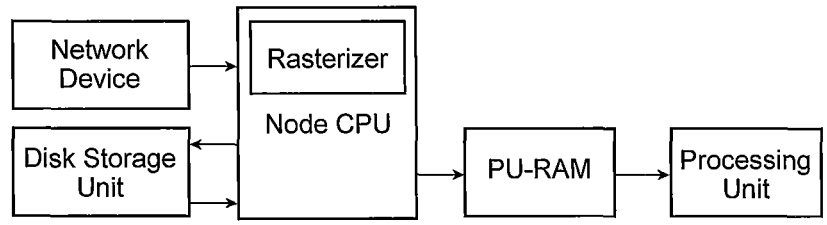
FIG. 52 is a functional diagram showing an alternative data flow between elements of the pattern streamer node.

Multicore CPU solution: When using a powerful multi-core CPU as the node CPU, the node CPU would be able to execute the rasterization task. FIG. 52 shows the typical dataflow for this configuration. The CPU reads the vector input data from the harddisk (3). The CPU will perform the rasterization task and stores the bitmap into the PU-RAM (4). While scanning the processing units reads the bitmap from PU-RAM (5).

Disadvantages include: expense of the processor; considerable power consumption (Intel Core 2 Extreme quad-core processor: TDP=130W); and relatively low degree of parallelism (4 cores for the Intel Core 2 quad-core processor).

For inline rasterization different solutions are available. Inline rasterization however exposes some common characteristics: PU-RAM size. Inline rasterization requires the bitmaps to be stored in the PU-RAM like for offline rasterization. Architecture option B needs small pixel sizes (e.g. 2.00 nm, see appendix A.1) and therefore needs to store around 61 GByte of bitmap data (not compressed). For architecture option C a larger pixel is used (e.g. 3.50 nm). For a 3.50 nm pixel 20 GByte would be appropriate. RAM load time. For this solution it is assumed that only vector input data is stored on disk (total size 8.5 GB). Whenever a new bitmap is needed, the vector input data is read from disk and rasterized and stored in PU-RAM. The disk rata rate seems not to be the bottleneck in this case. The bottleneck for this solution will be the rasterizer. Its performance depends on many factors and cannot easily be predicted. An alternative would be to perform the rasterization in an earlier stage. The bitmaps could be either stored in PU-RAM or on disk. Storing the intermediate bitmaps on disk has the disadvantage that it will be a clear bottleneck for the load time (see architecture option A).

Disk load time: Vector input data for new scans need to be downloaded from the server. The server will obviously be a bottleneck for communication. Options for improving the disk load time are to increase the bandwidth from server to node or to compressing the bitmap data on the server. Disk size. Storing 10 versions of bitmaps on the disk storage unit would imply a storage capacity of 85 GB. Improving reliability (and read performance) suggests to use a mirror configuration (RAID1) and use two disks of 100 GB.

Assuming that the main algorithms is parallelized to a great extent, a rough performance comparison between CPU and GPU is made based on the following characteristics: the Intel CPU core outperforms the thread processor with a factor 5; the Intel CPU contains 4 cores; and the GPU contains 240 thread processors.

Again assuming full utilization of parallelism, the performance ratio (Intel:GPU) boils down to quad-core:GPU=(4*5):240=1:12. In practice several factors will lower this "ideal" rate. Factors are: Differences in cost of execution (an integer division is rather costly for this brand of GPU) Degree of parallelism. To what extent can you write parallel code. How many threads can run in you limited amount of local memory. Because of the use of SIMD (Single Instruction Multiple Data) processors. There are typically 8 thread processors in a SIMD group. This means that the execution path expands because both sides of the branch are always (serially) executed.

On the other hand multi-core solutions like the Intel processors use a shared cache. Depending on several factors the performance per core will degrade when more cores are active. In this chapter an estimate is made of the performance of rasterization (rendering and dithering) using an Intel CPU.

To estimate the performance the render and dither modules have been implemented in C++. Only the OO feature of C++ is used, not any performance critical instructions like: new, delete or any advanced data structures like lists or queues. A 64*1000 nm cell us used as a unit for rendering and dithering. It has been verified visually by comparing the vector format input and the bitmap output that the rendering and dithering is as expected. The Visual C++2008 compiler has been used with optimizations for speed enabled.

The algorithm used for rendering is the scan line approach. An active edge table is used to maintain the set of edges that cross at least one of the scan line (line of pixels). The pixel size used is 3.5 nm (architecture option C). While the maximum of 64 edges is specified, 52 (81%) are used as a reasonable average per cell.

For measuring a machine with a modern CPU has been selected. The CPU is a Core 2 Duo (6400), running at 2.14 GHz with 2 GB of RAM running a Windows XP Operating System.

The input vector format used is a specification of a set of closed polygons in the cell. The dose grid is left out, but the processing incorporates an Y dependent dose factor. Shifting in y-direction for rendering is always 0, but the algorithm incorporates the operations for a scan line dependent shift value.

Optimization of the code is done by measuring code improvements. Normal profilers did not work because of their limited time resolution. Instead the "QueryPerformanceCounter" in the Win32 API has been used. This counter uses the CPUs time stamp counter in ns resolution. The code has been optimized by hand based on the results of the QueryPerformanceCounter. After optimization, the load is distributed over the application in the following fractions: rendering 55%, dithering 27%, and input processing 18%.

A single core of the described machine could executed 100,000 cell render cycles in 8.7 sec. This translates into 11,494 cycles are executed per second. Also execution with two cores almost scaled in a linear way (8.7 single core 100,000 cells->8.8 two cores 200,000 cells). A full stripe consists of 2,200,000 cells.

Therefore one core will spend 194 sec on 1 stripe. Assuming linear scaling, this means that 14 stripes are rendered within 6 minutes when using 7.5 cores. The Core 2 Duo (6400) is not the top model of the Intel CPUs anymore. Therefore it would be fair to increase the core performance with some factor (e.g. 30%). On the other hand we know that using more cores never scales in a linear way. We assume these two factors will cancel each other.

The performance results are the sum of: the algorithms used; the scale (size render cell); completeness of the algorithms; the particular optimizations used; the total time spend on optimizations; cache/memory use in real configurations compared to the prototype; and relative performance of the CPU that will be used in the final configuration.

As discussed for option A, it would be possible to compress the images that are kept in the PU-RAM. The rasterizer should compress its dithered or grayscale image, while the Processing Unit FPGA should uncompress and optionally dither it. Architecture B would really benefit from compression and oversampling techniques. Using 2 fibers per channel is no longer necessary. Architecture C already uses a relative big pixel size and will only benefits from compression. This means a smaller PU-RAM and smaller load times. Decompression logic should however be added to the Processing Unit FPGA. Decompression will however have a significant impact on the in-line processing effort.

Option D: Real-Time Rasterization

Figure 62:
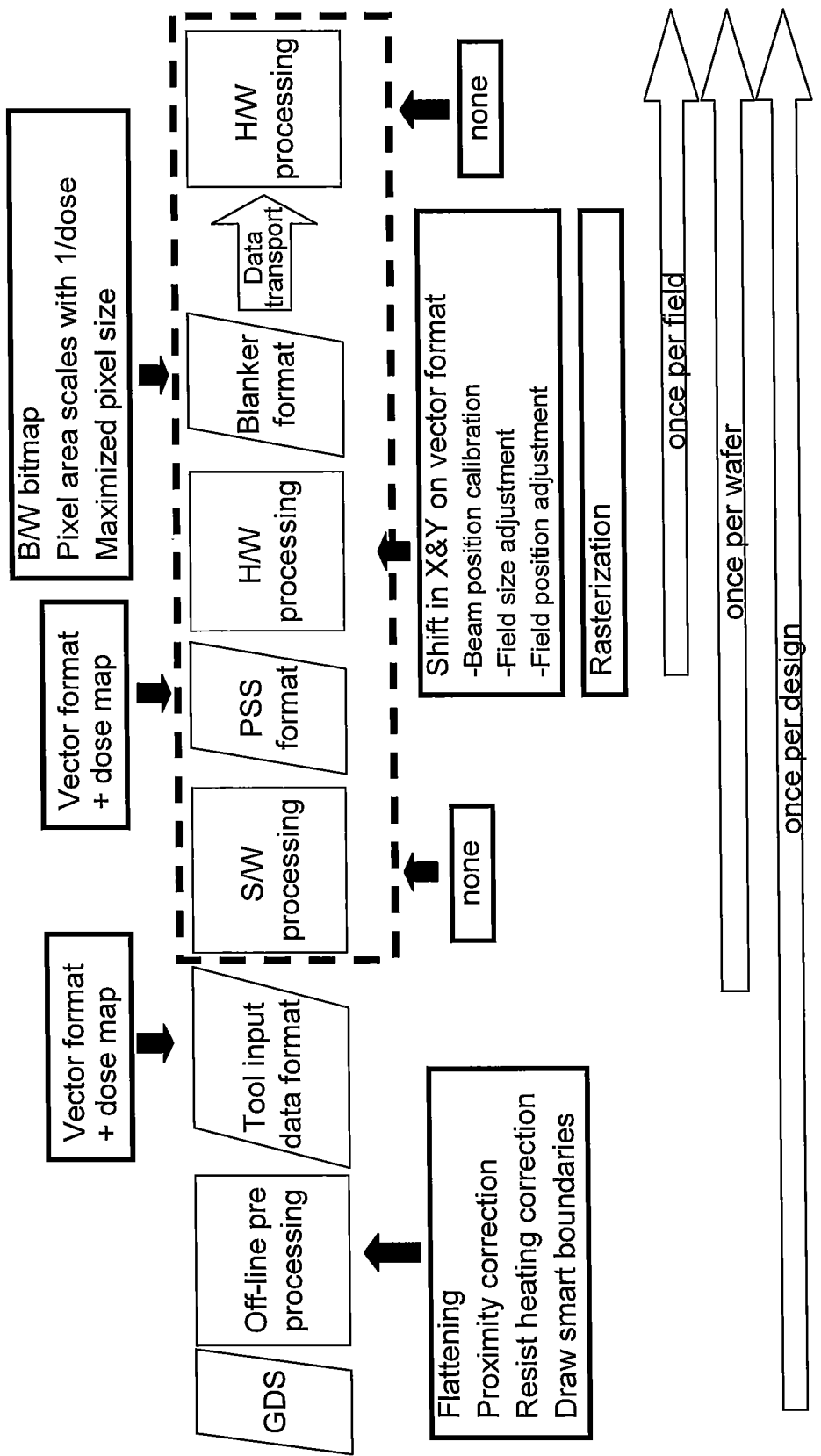
FIG. 62 is a functional flow diagram of an embodiment of a data path using real-line rasterization.

FIG. 62 shows an embodiment using real-line rasterization. This is similar to the FIG. 61 embodiment except rasterization is performed one step further on in the process, during real-time processing typically performed in hardware. Corrections for beam position calibration, field size adjustment, and/or field position adjustment are made on the vector format PSS format data, and then rasterization converts this to a B/W bitmap. Because the corrections are made on vector data, both full pixel shifts and subpixel shifts in the X and Y direction can be made.

Figure 53:
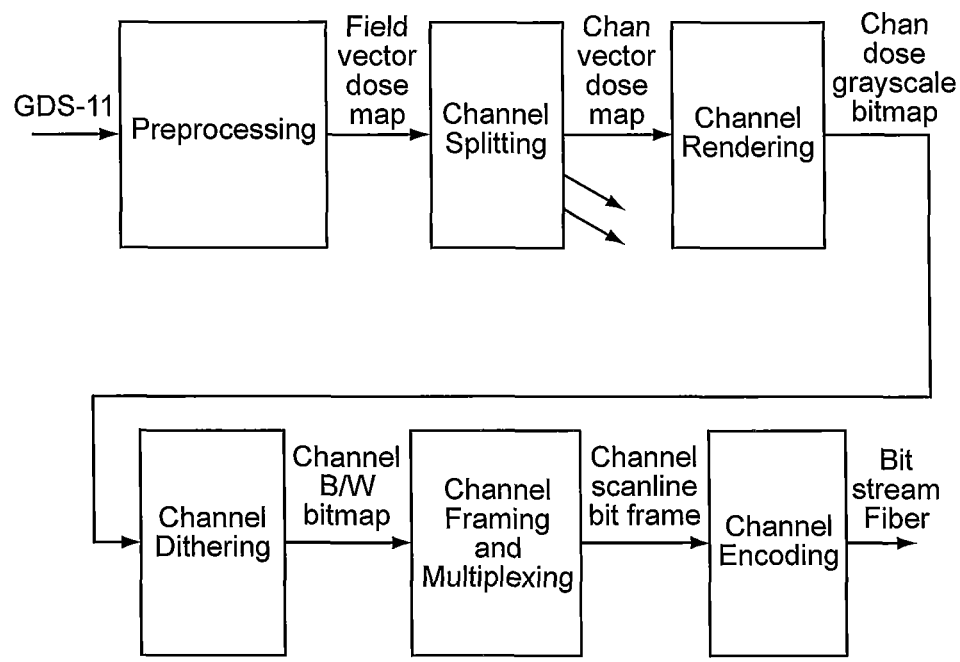
FIG. 53 is a functional block diagram of another embodiment of a data path.
Figure 54:
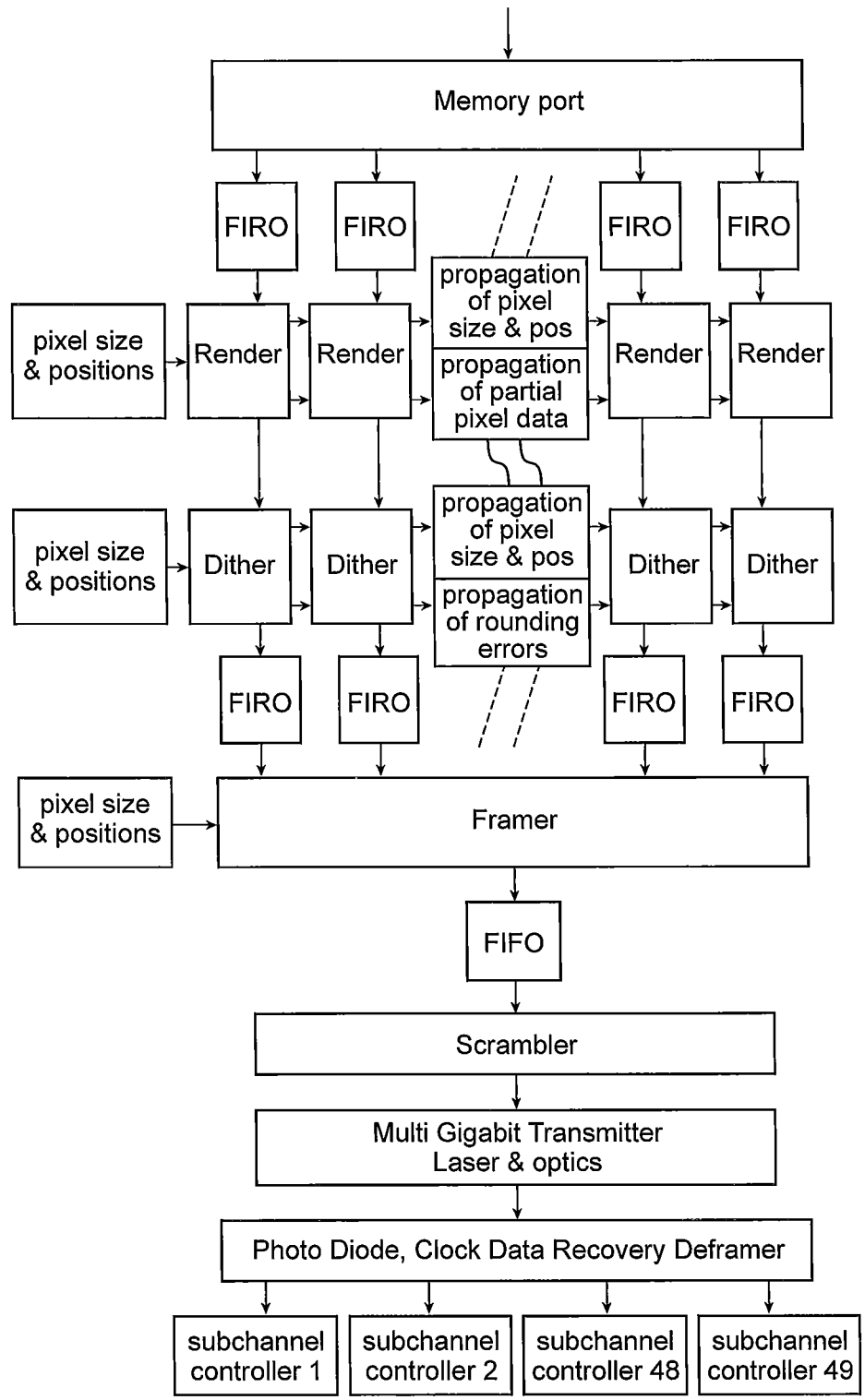
FIG. 54 is a block diagram showing detail of processing and transmission elements of a data path.

FIG. 53 shows the functional blocks for this architecture. For this option the functional units 3 and 4 (rasterization) are executed on the fly during the runs.

Corrections include:
Pixel shift (full and subpixel) corrections in X and Y. Parameters updated once per field.
Dose correction per subchannel. Parameters updated once per field.
Scaling corrections for Y per channel. Parameters updated once per field.
Blanker timing offset corrections. Parameter updates once per wafer scan.

The offline preprocessing system will prepare a vector format for all stripes. The pattern streamer will use this data as input. By rendering and dithering in real-time, the pattern streamer generates the B/W bitmap. During rendering and dithering, all kind of corrections is performed. From the BAA/bitmap the pattern streamer generates the beamlet bitframes, multiplexes data for all its beamlets of a channel and sends the data over the fiber to the blanker chip.

Resources needed for streaming data to the lasers:

The process consists of two steps: getting data from memory and rendering it to pixels in a logical order, reordering the logically ordered pixels to frames due to the sub-beam ordering. The first step may consist of actual rendering of vector data, or simply retrieving the rendered pixel data from memory.

For rendering vector data to pixels, each stripe is divided into substripes of 62.5 nm in the vector format. For a soft-edge of 500 nm (the maximum), the number of substripes to process is 2000+500+500/62.5=48 substripes. Each substripe is rendered in a substripe pipe. Each pipe will operate at approx 100 MHz, and 48 pipes will therefore produces the approx. needed 5 Gbit/s.

At the top of the pipe, a FIFO is used to cross the clock-domain boundary from the memory clock domain to the processing clock domain. This FIFO also serves as an intermediate storage buffer, as the memory bandwidth must be shared over multiple strips. The FIFO contains both corner data and dose map data. The rendering application can randomly address within the lower part of the FIFO. The FIFO needs to contain at least three blocks of data to allow some slack to the memory arbiter. Each block of data contains 272 bytes. 3 blocks of data=816 bytes. A standard block ram contains 18 kbits of data=2 kbyte of data. This means that from a datasize point of view each blockram can serve 3 substrip pipes. However, from a data-availability point of view, each pipe should use its own blockram on the top.

Each substripe pipe needs some internal FF's and LUT's for processing. We assume that the number of LUT's and FF's available with the required number of BLOCKRAMS is more than the number needed.

Reordering pixels for multi-beam exposure.

At the bottom of the substripe pipe, or directly below the memory port in case of bitmap data in memory, the data is stored in another FIFO. This FIFO needs to contain at least 245 lines of data, which is needed as we write the pixels in 49 beamlets with a K=5. Each line will contain 3000 nm/2 nm=1500 pixels (at max). 1500 pixels*245 lines=367,500 bits. This equals 20 blockrams, which is rounded up to 32 blockrams to facilitate the processing.

The framer/multiplexer reads from these 32 blockrams and forms frames suitable for sending to the laser. These frames are stored in another FIFO blockram, which is needed both as an asynchronous boundary between the MGT clock domain and as an elastic storage unit.

Cell Based Input Format

A vector representation is typically used for generating the pattern data, such as a GDS-II or OASIS format. As described above, different modes of operation are possible for the charged particle lithography machine. One mode described above is the real-time rasterization mode where pattern data in a vector based input format is used and processed by a processing unit (such as an FPGA) in real-time (i.e. pattern data for a set of fields of the wafer is processed, at least in part, while the scan of that set of fields takes place).

A cell based input format may be used for this real-time rasterization mode. One embodiment of the input format describes two aspects, the feature layout and dose rate. The feature layout is described using a cell-based approach, suitable and optimized for real-time FPGA rendering and dithering. The dose rate is described by a fixed-sized grid covering the area of all the features (e.g. the field).

A cell based format for the pattern data can yield a data set having a more predictable size, which is advantageous for streaming the pattern data to the lithography system for real-time and/or hardware processing. Pattern data in a vector format provides a less predictable size per cell. Pattern data in bitmap format may be used but would need to be compressed for transfer from a preprocessing system to the lithography system. The amount of compression of the bitmap data may vary considerably per cell depending on the features present in the cell. Streaming such compressed data to the lithography machine and then decompressing the data results in an unpredictable transmission rate of the uncompressed data.

It is advantageous to know in advance how much data (bits) is contained per cell at maximum, and what compression factor is achieved if the pattern data is compressed (e.g. when compared to the total size if encoded in bitmap format). The cell based format is designed to have these features. This is desired because it gives assurance that the cell based pattern data always fits in a certain size of memory (the memory size chosen at design time) that is substantially smaller than the size of the uncompressed bitmap data. This assurance could not be given for a bitmap compressed using general purpose compression algorithms such as ZIP. It is also desired because it gives assurance that the cell based pattern data can be converted into a bitmap in a certain maximum amount of time, which is important in case of real-time rasterization.

Furthermore, if a particular cell covering a certain area of the bitmapped field must be read from the "compressed file" encoded in the cell based format, it is immediately known where this cell is encoded in the file (no need to search for this area as would be the case if the file was in e.g. GDSII format where features are randomly present in the file).

The cell based format is also more suited for streaming to the lithography system because it is arranged per cell, and arranging the pattern data in sequence of cells to be scanned is relatively straightforward compared to a vector format.

An additional amount of "compression" is also obtained in the cell based format by only coding the relative position of features in each cell. This relative position in combination with the location of the cell gives the absolute position in the feature in the field. The relative feature position has fewer possible values (being limited to the size of the cell) and thus requires less bits to define than an absolute position with the field.

Relevant parameters for this embodiment of the cell based input format for describing the feature layout are summarized below.

| Name | Value |
| --- | --- |
| Grid resolution | 0.5 nm |
| Critical dimension (CD) | 22 nm |
| Minimum Feature Pitch | 64 nm |
| Possible line angles | n*45 degrees |
| Pattern dose map | 50%-100% |
| Pattern dose map grid size | CD |
| Pattern dose accuracy | 0.2% step size |

For the feature layout format the Minimum Feature Pitch is an important parameter. The Minimum Feature Pitch essentially limits the feature density. It means that a particular transition (e.g. ON->OFF or OFF->ON) can happen only twice within a distance of the Minimum Feature Pitch.

Figure 67:
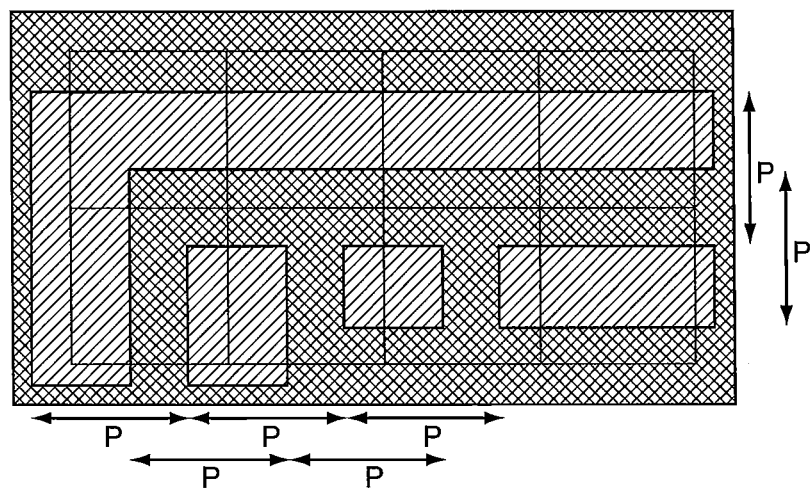
FIG. 67 is a diagram illustrating an example of a pattern layout.

In FIG. 67 an example pattern layout is shown, with features (the lighter colored areas) that comply with the Minimum Feature Pitch (P).

An important consequence of the feature description is that a render cell of 64×64 nm should describe 4 corners at maximum. When describing the features in such render cells, the render cell index provides its base position. The feature within a render cell can be described using relative positions.

Figure 69:
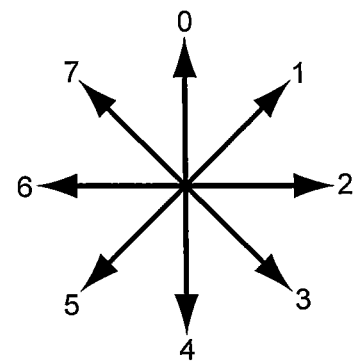
FIG. 69 is a diagram illustrating vector orientations.

The (partial) features within a render cell can be described by its corners or by straight lines. The line angles may be limited to multiples of 45 degrees, limiting vector orientations to only 8 possible directions as illustrated in FIG. 69. Eight orientation codes are assigned for each possible orientation as shown in FIG. 69.

Figure 68:
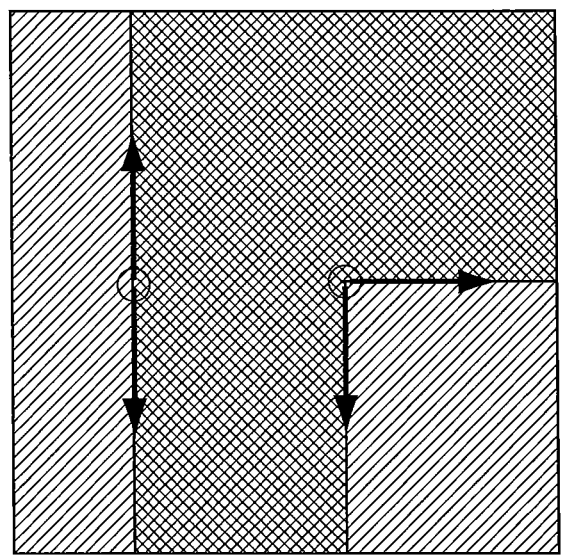
FIG. 68 is a diagram illustrating a corner concept.

FIG. 68 illustrates the corner concept. A cell is shown containing a corner of a feature (on the right side) and a straight line at an edge of a feature (on the left side). Both the corner and the straight line are considered "corners". Corner A is defined by the position of A (e.g. $X_A$, $Y_A$) and two vectors (e.g. defined using the orientation codes Edge1=2, Edge2=4). By definition, the area in the direction of moving from Edge1 to Edge2 in clockwise direction is the active area. In the same way the straight line is described by "pseudo corner" point B (e.g. $X_B$, $Y_B$) and the two edges (e.g. Edge1=4, Edge2=0). The location of this pseudo corner is an arbitrary point on the line it defines. Again the area in the direction moving clockwise from Edge1 to Edge2 is the active area.

Figure 70:
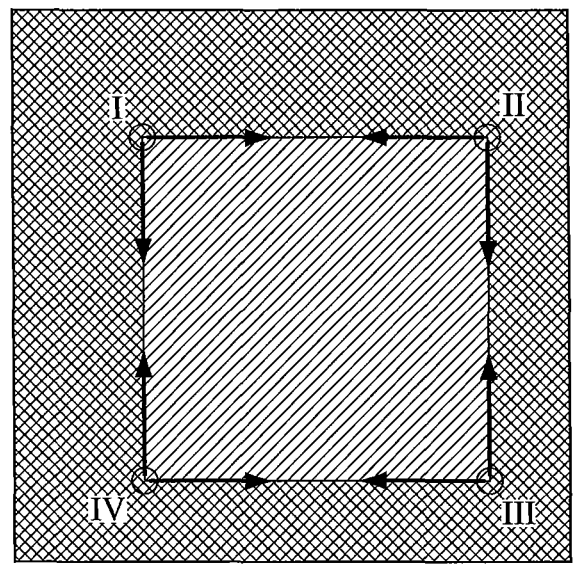
FIG. 70 is a diagram illustrating coding of a square feature.

Inside cells, corners of the same feature should be matched. FIG. 70 shows a simple square feature coded as 4 matching corners in a cell of 64 nm×64 nm. The table on the left side of FIG. 70 shows the parameters that fully describe the feature. The corners are described by their corner coordinates (X, Y) and the edges describe the corner orientation according to the directions defined in FIG. 69. From corner coordinates and orientation codes, it can be determined that all the corners in FIG. 70 describe a single feature.

For processing in a FPGA (or other types of hardware processors) it is advantageous to have fixed size data structures. This makes it easier for addressing the cell descriptions in memory and help to keep the FPGA logic simpler.

Figure 71:
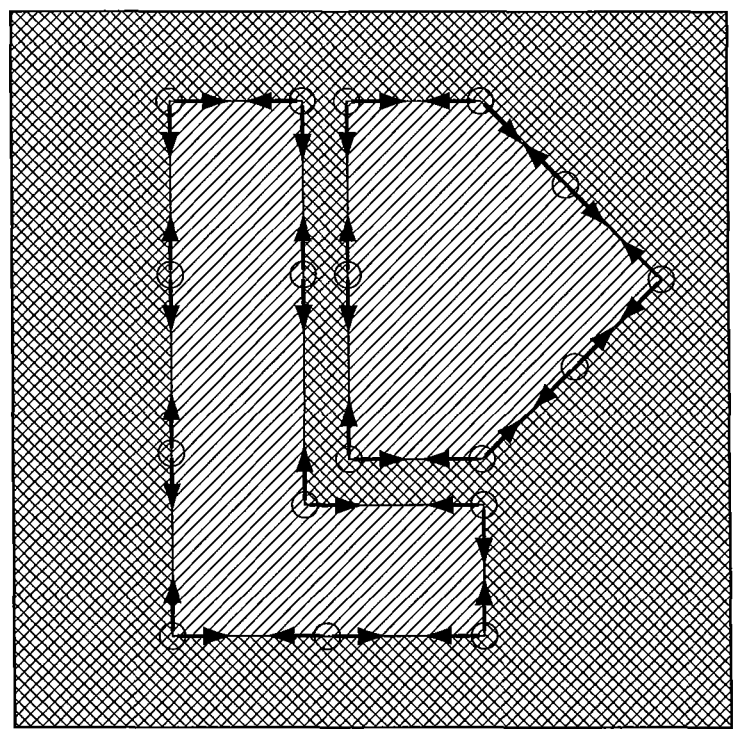
FIG. 71 is a diagram illustrating coding of complex feature shapes.

FIG. 71 shows an example of more complex feature shapes described by the corners in the cells. Lines of orientations along 45 and −45 degrees are also used for defining the features shown.

Feature Edges with 45 Degree Orientations

Figure 72:
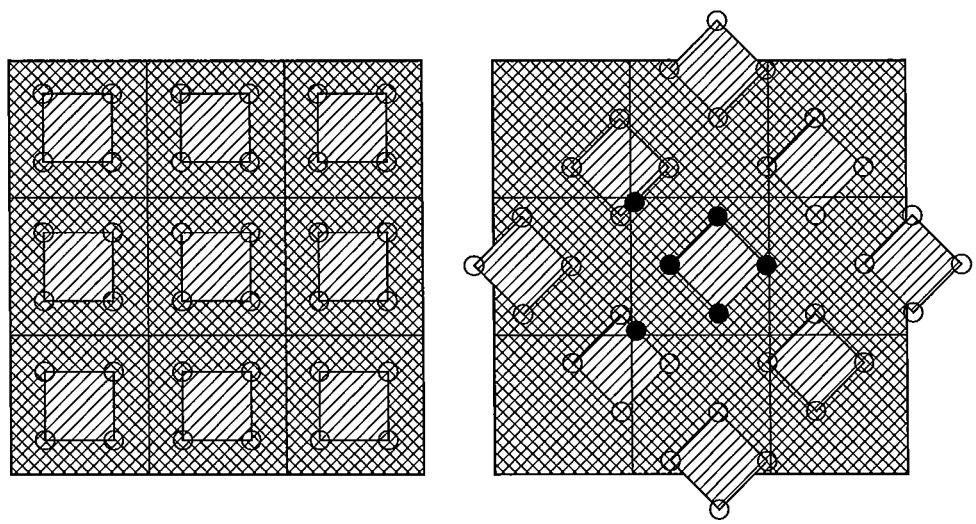
FIG. 72 is a diagram illustrating an example of a minimum feature pitch less than a diagonal length of a cell.

The Minimum Feature Pitch ensures a maximum number of corners in a cell. When considering features with edges at 45 degree orientations, a cell's maximum dimension is its diagonal, with length equal to the cell size times the square root of 2 for square cells (e.g. 64×√2 nm for a 64 nm square cell). When the Minimum Feature Pitch is less than this diagonal length, there is a risk that more than 4 corners may occur per cell. In FIG. 72 this situation is shown. On the left side a diagram shows a regular grid of square features with a pitch of 64 nm, positioned in cell of 64 nm, with 4 corners per cell (the corners indicated by small circles). On the right side, the grid of square features is rotated by 45 degrees. The highlighted corners show that six corners appear on the cell in the middle.

Several solutions may be applied for resolving this issue:
Specify a bigger Minimum Feature Pitch for +/−45 degree lines, at least equal to the length of the cell diagonal (e.g. 64×√2 nm for 64 nm square cells).
Reduce the cell size so that the cell diagonal is equal to (or less than) the Minimum Feature Pitch (e.g. ½√2×64 nm for 64 nm Minimum Feature Pitch).
Allow for a greater number (e.g. six) corners per cell.
Allow for a variable number of corners per cell.

In the following description, the first option above is assumed.

Proximity Effect Correction

Proximity effect corrections are needed to improve the pattern (especially corners) after processing the wafer. Proximity effect corrections can be addressed by tweaking either geometry or dose locally. It is assumed that proximity effect corrections are done by geometry changes using small serifs around corners, typically with length of ⅓ CD.

Figure 73:
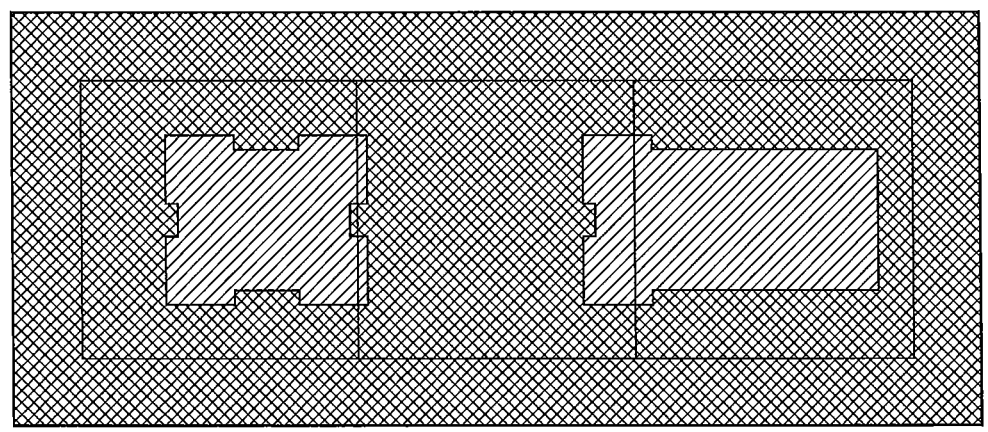
FIG. 73 is a diagram illustrating an example of features with serifs added to some of their corners.

In FIG. 73 an example is shown of two features with serifs added to some of their corners. There is preferably an option, per corner, to include a serif on a particular corner. As shown in the FIG. 73, one important consequence of such a technique is that a serif defined on a corner of one cell (e.g. feature B serifs in cell 2 in the drawing) may be partly rendered in a neighboring cell (e.g. feature B serifs extending into cell 3). Or a feature with all its corners in one cell (e.g. feature A in cell 1) needs rendering parts of its serifs in a neighboring cell (e.g. feature A serifs in cell 2).

Different approaches are possible to address this:
Share information about serif corners with neighbor cells.
Pack extra information (duplicate) in a cell definition as soon as an external serif corner has impact on rendering the cell.
Describe serifs as normal corners. This solution obviously increases (highly variable) the number of corners per cell.

Dose Grid

Besides features geometry, the dose rate is an important system parameter, relevant at a micro scale. The dose information may be described by providing a dose grid, containing one dose rate per cell (the dose information may be provided in other ways, for example by associating a dose value for each feature). The cell size is typically equal to or smaller than the desired critical dimension (CD). In theory the dose grid is independent from the render cell grid.

Two options for dealing with the two grids are:
Define both in grids independent from each other.
Align and optionally integrate both grids.

For FPGA processing it may be advantageous to combine the dose grid and the render cell grid. The dose grid size is typically smaller than the size of the render grid. This could be achieved, for example, by embedding 9 dose cells (3×3) inside a render cell. The grayscale value may be varied between 100% and 50% in steps of 0.2%. Therefore 8 bits are needed per dose cell.

A consequence is however that two independent concepts are linked. Whenever the pitch value is changed, it also has consequences for the dose cell size.

Pixel Grid

The pixel cell size and position are preferably flexible. Pixels may be non-square, but will always have the same dimension within a stripe/channel. Pixels may be rendered by (worst case) 4 render cells. Per row, different (Y direction) alignment can be used because of subpixel shifts.

Input Format Specification

The following specifications are provided for one embodiment. A render cell comprises a block of 64 by 64 nm containing up to 4 corners and extra information. An edge is a vector starting in a corner, either Edge1 or Edge2, and the clockwise angle from Edge1 to Edge2 defines the active side. A corner is a corner of a feature in the cell. A corner may have an angle of 180 degrees when a line traverses the cell without a real corner. A maximum of 4 corners per render cell is assumed.

A specification of corner data for an embodiment is provided in the table below:

| Name | Number of bits | Rationale |
| --- | --- | --- |
| X position | 8 | 64 nm@0.5 nm |
| Y position | 8 | 64 nm@0.5 nm |
| Edge1 direction | 3 | 8 directions |
| Edge2 direction | 3 | 7 directions possible, equal to Edge1 is a special case: entry not used |
| Serif size | 5 | 0 means off. |
| Total | 27 | |

To calculate a serif size from its field value, different strategies may be used, for example a table lookup where the field value is used as an index in a predefined table, or by calculation (e.g. serif size=value*0.5 nm, therefore its range is 0 . . . 15.5@0.5 nm, assuming a positive serif size).

A specification of render cell data for an embodiment is provided in the table below:

| Name | Bits per unit | # units | Total bits |
| --- | --- | --- | --- |
| Corners | 27 | 4 | 108 |
| Dose map 3 × 3 | 8 | 9 | 72 |
| Total | | | 180 |

The table below summarizes the data volume when using the above format. Assumption for this data volume table is that there is no stitching.

| Name | Formula | Result |
| --- | --- | --- |
| The number of bytes per cell | 180 bit/8 | 23 bytes |
| The number of cells per strip | 33 mm/64 nm * 2 µm/64 nm | 16E6 cells |
| The number of cells per field | 13000 * 16E6 | 209E9 cells |
| The number of bytes per field | 209E9 * 23 | 5 TByte |
| The number of bytes per stripe | 16E6 * 23 | 370 MByte |

There may be opportunities for compression of data. For example, it is expected that many cells contain less than 4 corners, and that the dose rate may be the same value for all dose cells.

Defining fixed sized data structures would ease the task of FPGA design (addressing and loading), but has consequences for memory. For communication and (disk) storage, standard compression techniques could be used to compress the data. This works well when the unused records are filled with the same values, e.g. all zero's for unused corners. Compression also works for repeating values like similar values for the dose map.

Some design issues for the above embodiment are:
A maximum of 4 corners per cell may not be not enough;
Looking in the neighbor cells for serifs is 'expensive' in processing time and memory and should be avoided if possible;
Serifs might be of different shapes than anticipated;
A fixed number of corners per is desirable for the hardware implementation;
A high fixed number of corners per cell results in huge data amounts;
A low fixed number of corners per cell results in inflexibility;
Coding all corners is over-information from an information-theoretical standpoint, but significantly facilitates the implementation in hardware;
The resolution of the corners is preferably 0.25 nm instead of 0.5 nm;
Coding only half the number of corners may be enough.

Coding Bigger Blocks Together

As a trade-off between a high and low fixed number of corners, one possibility is to limit the maximum number of corners for a bigger block of data, e.g. approximately 16 times bigger in the mechanical scan direction. It is assumed that a local maximum number of corners in one region of this bigger block will be compensated by a lesser number of corners in another region of the block.

A higher limit than 4 on the maximum number of corners is not desirable, due to the increase in memory usage. However, using a lower limit won't cover all possible cases. As an intermediate solution, the following scenario is considered: code the data in larger blocks than the current cells, e.g. a block of 16 cells at a time, and limit the number of corners within such a block, where the local maximum number of corners can be higher. In this scenario, serifs are coded as corners themselves, which facilitates the implementation.

To implement this embodiment, the following changes may be made to the above embodiment:
A block is defined, being 62.5 nm in Y direction (the deflection direction) and 1000 nm in X direction (the mechanical scan direction);
The Y size of the cell/block is decreased from 64 to 62.5 nm. This has 2 advantages: 16*62.5=1000 nm, and 62.5/0.25=250 which can be coded efficiently in 8 bits;
The density map can have a resolution of 31.25×31.25 nm (1/32 of 1000 nm);
The maximum number of corners is set to 64 per block (on average 4 corners per cell of 62.5×62.5 nm);
The serifs are coded within the data, as corners themselves.

The following specifications are provided for this embodiment:

| Name | Value |
| --- | --- |
| Render block | A block of 62.5 by 1000 nm containing 64 corners and dose information. |
| Edge | An vector starting in a corner. Either Edge1 or Edge2. The clockwise angle from Edge1 to Edge2 defines the active side. |
| Corner | A corner of a feature in the cell. Might also be a corner with an angle of 180 degrees in case a line traverses the cell without a real corner. A maximum of 4 corners per render cell is assumed. |

A specification of corner data for this embodiment is provided in the table below:

| Name | Number of bits | Rationale |
| --- | --- | --- |
| X position | 12 | 1000 nm@0.25 nm |
| Y position | 8 | 62.5 nm@0.25 nm |
| Edge1 direction | 3 | 8 directions |
| Edge2 direction | 3 | 7 directions possible, equal to Edge1 is a special case: entry not used |
| Total | 26 | |

A specification of render cell data for this embodiment is provided in the table below:

| Name | Bits per unit | # units | Total bits |
| --- | --- | --- | --- |
| Corners | 26 | 64 | 1664 |
| Dose map 32 × 2 | 8 | 64 | 512 |
| Total | | | 2176 |

The table below summarizes the data volume when using the above format. Assumption for this data volume table is that there is no stitching. This estimate does not take the rounding into account that takes place when storing the information in actual RAM.

| Name | Formula | Result |
| --- | --- | --- |
| The number of bytes per block | 2176 bit/8 | 272 bytes |
| The number of blocks per strip | 33 mm/1000 nm * 2 um/62.5 nm | 1056000 |
| The number of blocks per field | 13000 * 1E6 | 13.7E9 blocks |
| The number of bytes per field | 13E9 * 272 | 3.4 TByte |
| The number of bytes per stripe | 1E6 * 272 | 274 MByte |

There are opportunities for compression. For example, it is expected that many blocks contain less than 64 corners, and that the dose rate will have a similar value for neighboring dose cells. However, compression also leads to more complicated implementations. The data might be compressed while being transported through the system.

From an information theoretical point of view, coding all corners with all coordinates is not necessary. However, this drastically reduces the computational effort in the implementation. It may be beneficial to also code the crossings of the block-borders. This increases the number of corners but decreases the computational effort in the FPGA even more. Also, it should be taken into account that the whole process of rendering should be executable from both ends of the data. Leaving some 'obvious' information out in one direction, could pose a problem when scanning in the other direction.

The blocks could be oriented in the deflection scan direction as well. There are two reasons why this should not be done. The parallelism in the implementation needs to process data in several strips within the stripe, and this would not be possible if the data is oriented this way. Also, the granularity in the deflection scan direction would be 1000 nm, which is undesirable for the stitching. In the current orientation, the granularity of the stripe-width including stitching areas is 62.5 nm.

Packing the data in memory deserves some thoughts. It might be beneficial if the data for the dose map is stored in separate bit lanes from the corner data.

Using the approach of the previous paragraph has the following benefits:
- The data volume is smaller (e.g. 3.5 TB instead of 5 TB);
- The feature resolution is higher (e.g. 0.25 nm instead of 0.5 nm);
- The flexibility is higher, for serifs and for the number of corners in a local range;
- The implementation is less complex.

Patterned Beam Lithography System

Figure 74:
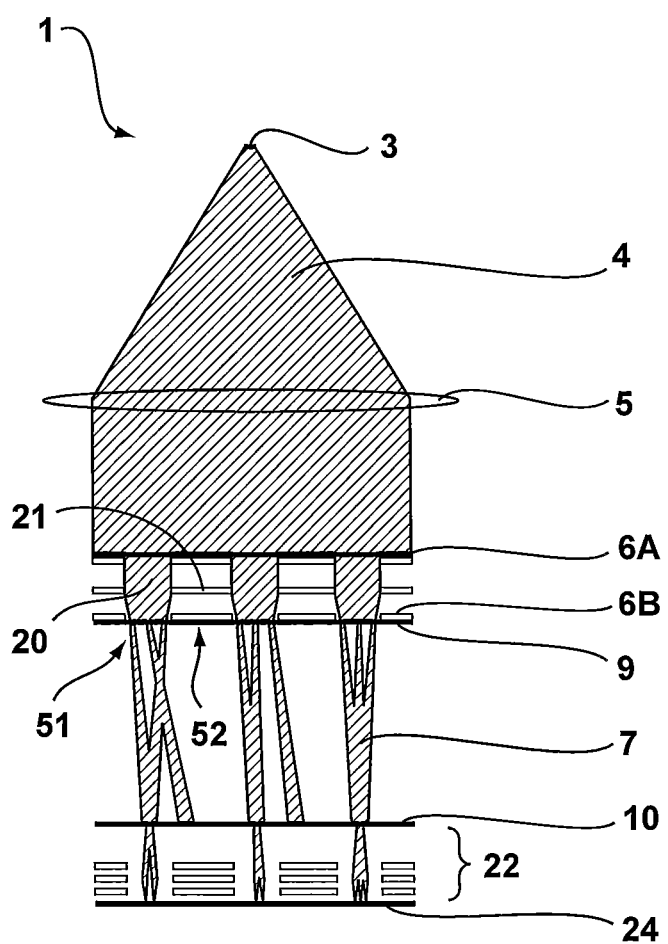
FIG. 74 is a simplified schematic drawing of an embodiment of a charged particle multi-beamlet lithography system.

FIG. 74 shows a simplified schematic drawing of an embodiment of a charged particle multi-beamlet lithography system 1 based upon an electron beam optical system without a common cross-over of all the electron beamlets. This optical system is described in detail in the U.S. patent application 61/045,243, which is incorporated herein by reference in its entirety.

Such a lithography system suitably comprises a beamlet generator generating a plurality of beamlets, a beamlet modulator patterning said beamlets into modulated beamlets, and a beamlet projector for projecting said beamlets onto a surface of a target. The beamlet generator typically comprises a source and at least one aperture array. The beamlet modulator is typically a beamlet blanker with a blanking deflector array and a beam stop array. The beamlet projector typically comprises a scanning deflector and a projection lens system. FIG. 74 does not show explicitly the wafer positioning and support structure of the present invention.

The lithography system 1 is particularly suited to implement a redundancy scan functionality in combination with a so-called dual or multi-pass scanning as described herein. Its achieved improvement of the accuracy of scanning lines onto the target surfaces enables that a second scan is carried out that fills the gaps left open in a first scanning sequence.

In the embodiment shown in FIG. 74, the lithography system comprises an electron source 3 for producing a homogeneous, expanding electron beam 4. Beam energy is preferably maintained relatively low in the range of about 1 to 10 keV. To achieve this, the acceleration voltage is preferably low, the electron source preferably kept at between about −1 to −10 kV with respect to the target at ground potential, although other settings may also be used.

The electron beam 4 from the electron source 3 passes a double octopole and subsequently a collimator lens 5 for collimating the electron beam 4. As will be understood, the collimator lens 5 may be any type of collimating optical system. Subsequently, the electron beam 4 impinges on a beam splitter, which is in one suitable embodiment an aperture array 6A. The aperture array 6 blocks part of the beam and allows a plurality of subbeams 20 to pass through the aperture array 6A. The aperture array preferably comprises a plate having through-holes. Thus, a plurality of parallel electron subbeams 20 is produced.

A second aperture array 6B creates a number of beamlets 7 from each subbeam. The system generates a large number of beamlets 7, preferably about 10,000 to 1,000,000 beamlets, although it is of course possible to use more or less beamlets. Note that other known methods may also be used to generate collimated beamlets.

This allows the manipulation of the subbeams, which turns out to be beneficial for the system operation, particularly when increasing the number of beamlets to 5,000 or more. Such manipulation is for instance carried out by a condenser lens, a collimator, or lens structure converging the subbeams to an optical axis, for instance in the plane of the projection lens.

A condenser lens array 21 (or a set of condenser lens arrays) is included behind the subbeam creating aperture array 6A, for focusing the subbeams 20 towards a corresponding opening in the beam stop array 10. A second aperture array 6B generates beamlets 7 from the subbeams 20. Beamlet creating aperture array 6B is preferably included in combination with the beamlet blanker array 9. For instance, both may be assembled together so as to form a subassembly. In FIG. 74, the aperture array 6B produces three beamlets 7 from each subbeam 20, which strike the beam stop array 10 at a corresponding opening so that the three beamlets are projected onto the target by the projection lens system in the end module 22. In practice a much larger number of beamlets may be produced by aperture array 6B for each projection lens system in end module 22. In one embodiment, 49 beamlets (arranged in a 7×7 array) are generated from each subbeam and are directed through a single projection lens system, although the number of beamlets per subbeam may be increased to 200 or more.

Generating the beamlets 7 stepwise from the beam 4 through an intermediate stage of subbeams 20 has the advantage that major optical operations may be carried out with a relatively limited number of subbeams 20 and at a position relatively remote from the target. One such operation is the convergence of the subbeams to a point corresponding to one of the projection lens systems. Preferably the distance between the operation and the convergence point is larger than the distance between the convergence point and the target. Most suitably, use is made of electrostatic projection lenses in combination herewith. This convergence operation enables the system to meet requirements of reduced spot size, increased current and reduced point spread, so as to do reliable charged particle beam lithography at advanced nodes, particularly at nodes with a critical dimension of less than 90 nm.

The beamlets 7 next pass through an array of modulators 9. This array of modulators 9 may comprise a beamlet blanker array having a plurality of blankers, which are each capable of deflecting one or more of the electron beamlets 7. The blankers are more specifically electrostatic deflectors provided with a first and a second electrode, the second electrode being a ground or common electrode. The beamlet blanker array 9 constitutes with beam stop array 10 a modulating device. On the basis of beamlet control data, the modulating means 8 add a pattern to the electron beamlets 7. The pattern will be projected onto the target 24 by means of components present within an end module 22.

In this embodiment, the beam stop array 10 comprises an array of apertures for allowing beamlets to pass through. The beam stop array, in its basic form, comprises a substrate provided with through-holes, typically round holes although other shapes may also be used. In one embodiment, the substrate of the beam stop array 8 is formed from a silicon wafer with a regularly spaced array of through-holes, and may be coated with a surface layer of a metal to prevent surface charging. In one embodiment, the metal is of a type that does not form a native-oxide skin, such as CrMo.

In one embodiment, the passages of the beam stop array 10 are aligned with the holes in the beamlet blanker array 9. The beamlet blanker array 9 and the beamlet stop array 10 operate together to block or let pass the beamlets 7. If beamlet blanker array 9 deflects a beamlet, it will not pass through the corresponding aperture in beamlet stop array 10, but instead will be blocked by the substrate of beamlet block array 10. But if beamlet blanker array 9 does not deflect a beamlet, then it will pass through the corresponding apertures in beamlet stop array 10 and will then be projected as a spot on a target surface 13 of the target 24.

The lithography system furthermore comprises a data path for supplying beamlet control data to the beamlet blanker array. The beamlet control data may be transmitted using optical fibers. Modulated light beams from each optical fiber end are projected on a light sensitive element on the beamlet blanker array 9. Each light beam holds a part of the pattern data for controlling one or more modulators coupled to the light sensitive element.

Subsequently, the electron beamlets 7 enter the end module. Hereinafter, the term 'beamlet' to refer to a modulated beamlet. Such a modulated beamlet effectively comprises time-wise sequential portions. Some of these sequential portions may have a lower intensity and preferably have zero intensity—i.e. portions stopped at the beam stop. Some portions will have zero intensity in order to allow positioning of the beamlet to a starting position for a subsequent scanning period.

The end module 22 is preferably constructed as an insertable, replaceable unit, which comprises various components. In this embodiment, the end module comprises a beam stop array 10, a scanning deflector array 11, and a projection lens arrangement 12, although not all of these need be included in the end module and they may be arranged differently.

After passing the beamlet stop array 10, the modulated beamlets 7 pass through a scanning deflector array 11 that provides for deflection of each beamlet 7 in the X- and/or Y-direction, substantially perpendicular to the direction of the undeflected beamlets 7. In this embodiment, the deflector array 11 is a scanning electrostatic deflector enabling the application of relatively small driving voltages, as will be explained hereinafter.

Next, the beamlets pass through projection lens arrangement 12 and are projected onto a target surface 24 of a target, typically a wafer, in a target plane. For lithography applications, the target usually comprises a wafer provided with a charged-particle sensitive layer or resist layer. The projection lens arrangement 12 focuses the beamlet, preferably resulting in a geometric spot size of about 10 to 30 nanometers in diameter. The projection lens arrangement 12 in such a design preferably provides a demagnification of about 100 to 500 times. In this preferred embodiment, the projection lens arrangement 12 is advantageously located close to the target surface.

In some embodiments, a beam protector may be located between the target surface 24 and the focusing projection lens arrangement 12. The beam protector may be a foil or a plate, provided with needed apertures, for absorbing the resist particles released from the wafer before they can reach any of the sensitive elements in the lithography system. Alternatively or additionally, the scanning deflection array 9 may be provided between the projection lens arrangement 12 and the target surface 24.

Roughly speaking, the projection lens arrangement 12 focuses the beamlets 7 to the target surface 24. Therewith, it further ensures that the spot size of a single pixel is correct. The scanning deflector 11 deflects the beamlets 7 over the target surface 24. Therewith, it needs to ensure that the position of a pixel on the target surface 24 is correct on a microscale. Particularly, the operation of the scanning deflector 11 needs to ensure that a pixel fits well into a grid of pixels which ultimately constitutes the pattern on the target surface 24. It will be understood that the macroscale positioning of the pixel on the target surface is suitably enabled by a wafer positioning system present below the target 24.

Such high-quality projection is relevant to obtain a lithography system that provides a reproducible result. Commonly, the target surface 24 comprises a resist film on top of a substrate. Portions of the resist film will be chemically modified by application of the beamlets of charged particles, i.e. electrons. As a result thereof, the irradiated portion of the film will be more or less soluble in a developer, resulting in a resist pattern on a wafer. The resist pattern on the wafer can subsequently be transferred to an underlying layer, i.e. by implementation, etching and/or deposition steps as known in the art of semiconductor manufacturing. Evidently, if the irradiation is not uniform, the resist may not be developed in a uniform manner, leading to mistakes in the pattern. Moreover, many of such lithography systems make use of a plurality of beamlets. No difference in irradiation ought to result from deflection steps.

Figure 75:
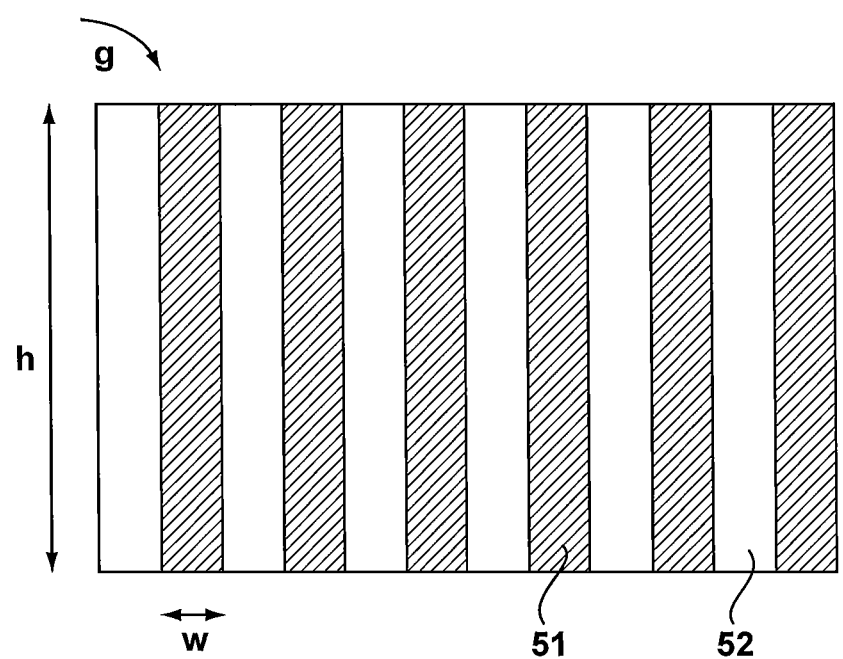
FIG. 75 is a diagram showing a division into beam areas and non-beam areas.

In one embodiment of such an optical system, space is left between a first and a second group of beamlets 7 originating from adjacent subbeams 20. Therewith, the system is defined to contain beam areas 51 and non-beam areas 52 as shown in FIG. 75. The division into beam areas 51 and non-beam areas 52 is present both in the modulation device as well as within the end module, e.g. the projection lens system. The non-beam areas 52 may be exploited in the projection lens system for the provision of mechanical support structures so as to minimize the effect of any vibrations. The space corresponding to the non-beam areas 52 may be filled, e.g. a predefined pattern is transferred to the space on the target in a subsequent step of the transfer process. This subsequent step is carried out after moving the target relative to the column. The specific order of filling spaces is also referred to as the writing strategy.

The invention has been described by reference to certain embodiments discussed above. It should be noted various constructions and alternatives have been described, which may be used with any of the embodiments described herein, as would be know by those of skill in the art. Furthermore, it will be recognized that these embodiments are susceptible to various modifications and alternative forms well known to those of skill in the art without departing from the spirit and scope of the invention. Accordingly, although specific embodiments have been described, these are examples only and are not limiting upon the scope of the invention, which is defined in the accompanying claims.

Definitions

The following represents further description by way of DEFINITIONS as to certain aspects of the present invention, sometimes also referred to as claims;

1. A method for exposing a wafer according to pattern data using a charged particle lithography machine generating a plurality of charged particle beamlets for exposing the wafer, the method comprising:
providing the pattern data in a vector format;
rendering the vector pattern data to generate multi-level pattern data;

dithering the multi-level pattern data to generate two-level pattern data;
supplying the two-level pattern data to the charged particle lithography machine;
and switching on and off the beamlets generated by the charged particle lithography machine on the basis of the two-level pattern data;
wherein the pattern data is adjusted on the basis of corrective data.

2. The method of claim 1, wherein adjusting the pattern data comprises adjusting the vector pattern data on the basis of first corrective data.

3. The method of claim 1 or 2, wherein adjusting the pattern data comprises adjusting the multi-level pattern data on the basis of second corrective data.

4. The method of any of the preceding claims, wherein adjusting the pattern data comprises adjusting the two-level pattern data on the basis of third corrective data.

5. The method of any one of the preceding claims, wherein rendering the vector pattern data comprises defining an array of pixel cells, and assigning multi-level values to the pixel cells based on relative coverage of the pixel cells by features defined by the vector pattern data.

6. The method of any one of the preceding claims, wherein dithering the multi-level pattern data comprises forming the two-level pattern data by application of error diffusion on the multi-level pattern data.

7. The method of the immediately preceding claim, wherein the error diffusion comprises distributing quantization error in a pixel of the multi-level pattern data to one or more adjacent pixels of the multi-level pattern data.

8. The method of the immediately preceding claim, wherein application of error diffusion includes:
defining an array of pixels;
dividing the array of pixels into portions, each portion being assigned to be exposed by a different beamlet;
determining error diffusion parameter values for each portion; and
assigning a two-level value to the pixels within each portion using error diffusion parameter values.

9. The method of the immediately preceding claim, wherein the error diffusion parameter values comprises a threshold value and a weight value for the higher level of the two-level value.

10. The method of the immediately preceding claim, wherein the error diffusion parameter values further comprises a weight value for the lower level of the two-level value.

11. The method of the two immediately preceding claims, wherein the threshold value equals 50 percent of the high level pixel value.

12. The method of the immediately preceding claim, wherein the threshold value equals the average of the high level pixel value and the low level pixel value.

13. The method of the immediately preceding claim, wherein determining the error diffusion parameter values are based on beamlet current measurements.

14. The method of any of the two immediately preceding claims, wherein the error diffusion parameter value is a threshold value, and wherein assigning a two-level value to the pixel cells within a portion is based on comparison with the threshold value determined for the portion.

15. The method of any of the three immediately preceding claims, wherein the error diffusion parameter is a value representing the higher level of the two-level value.

16. The method of any of the 10 immediately preceding claims, wherein the error diffusion is a one-dimensional error diffusion.

17. The method of any of the 11 immediately preceding claims, wherein the error diffusion is a two-dimensional error diffusion.

18. The method of any of the 12 immediately preceding claims, wherein the application of error diffusion restricted by disallowing diffusion towards one or more pixels with a multilevel value equal to or below a further threshold value.

19. The method of the immediately preceding claim, wherein the further threshold value equals zero.

20. The method of any of the 14 immediately preceding claims, wherein the application of error diffusion is restricted by disallowing diffusion to one or more pixels that are located outside the features described in the vector pattern data.

21. The method of any of claims 2-20, wherein the first corrective data comprises a proximity effect correction.

22. The method of claim 21, wherein the proximity effect correction comprises a dose correction.

23. The method of claim 21, wherein the proximity effect correction comprises a shape correction.

24. The method of claim 21, wherein the proximity effect correction comprises a combination of dose correction and shape correction.

25. The method of any of claims 2-24, wherein the first corrective data comprises a resist heating correction.

26. The method of any of claims 2-25, wherein the first corrective data comprises a correction to compensate for variation in the position of one or more of the beamlets.

27. The method of any of claims 2-26, wherein the first corrective data comprises a correction to compensate for errors in the positioning of a field of the wafer with respect to the wafer.

28. The method of any of claims 2-27, wherein the first corrective data comprises a correction to compensate for errors in the size of a field of the wafer.

29. The method of any of the three immediately preceding claims, wherein the correction comprises an adjustment of the vector pattern data that results in shifting the multi-level pattern data by less than a full pixel.

30. The method of any of the four immediately preceding claims, wherein the wafer is moved in a mechanical scan direction during exposure of the wafer, and wherein the correction comprises an adjustment of the vector pattern data that results a shift of the multi-level pattern data having a component in both the mechanical scan direction and a direction substantially perpendicular to the mechanical scan direction.

31. The method of any of claims 2-30, wherein the first corrective data comprises a correction to compensate for variation in the transmission time of the beamlet control signals to the lithography machine.

32. The method of any of claims 2-31, wherein the beamlets are switched on and off by beamlet blanker electrodes in a beamlet blanker array, each beamlet blanker electrode receiving a beamlet control signal, and wherein the first corrective data comprises a correction to compensate for a difference in the time when beamlet control signals are received by the beamlet blanker electrodes.

33. The method of any of claims 2-32, wherein the beamlets are deflected to scan the surface of the wafer, and wherein the first corrective data comprises a correction to compensate for variations in the amount of deflection experienced by different beamlets.

34. The method of any of claims 3-33, wherein dithering the multi-level pattern data comprises assigning a high value or a low value for each corresponding multi-level value of the multilevel pattern data based on comparison with a threshold value, and wherein a quantization error is calculated by subtracting a weight of the high level value or a weight of the low level value from the multi-level pattern data, the weight of the high level value being defined on the basis of the second corrective data.

35. The method of the immediately preceding claim, wherein the weight of the low value is defined on the basis of the second corrective data.

36. The method of any of the two immediately preceding claims, wherein the threshold value is defined on the basis of the second corrective data.

37. The method of any of claims 3-35, wherein dithering the multi-level pattern data comprises determining a two-level value by comparing a corresponding multi-level value of the multi-level pattern data to a threshold value, and wherein adjusting the pattern data comprises adjusting the threshold value on the basis of the second corrective data.

38. The method of any of claims 3-37, wherein the second corrective data comprises a correction to compensate for variation in the position of one or more beamlets.

39. The method of any of claims 3-37, wherein the second corrective data comprises a correction to compensate for errors in the positioning of a field of the wafer with respect to the wafer.

40. The method of any of claims 3-39, wherein the second corrective data comprises a correction to compensate for errors in the size of a field of the wafer.

41. The method of any of the three immediately preceding claims, wherein the correction comprises an adjustment of the multi-level pattern data equivalent to shifting the multi-level pattern data by less than a full pixel.

42. The method of any of the four immediately preceding claims, wherein the wafer is moved in a mechanical scan direction during exposure of the wafer, and wherein the correction comprises an adjustment of the multi-level pattern data that results a shift having a component in both the mechanical scan direction and a direction substantially perpendicular to the mechanical scan direction.

43. The method of any of claims 3-42, wherein the second corrective data comprises a correction for realizing a soft edge between areas exposed by different beamlets or groups of beamlets.

44. The method of the immediately preceding claim, wherein the soft edge is made by multiplying the multi-level pattern data with a soft edge factor, the soft edge factor increasing linearly with the distance to the edge until a maximum value is reached.

45. The method of the immediately preceding claim, wherein the maximum value is 1.

46. The method of the two immediately preceding claims, wherein a starting value of the factor is 0 at an edge.

47. The method of the immediately preceding claim, wherein the soft edge has a width of about 0.5 to 1.5 micron.

48. The method of any of claims 4-47, wherein the third corrective data comprises a correction to compensate for variation in the position of one or more beamlets.

49. The method of any of claims 4-48, wherein the third corrective data comprises a correction to compensate for errors in the positioning of a field of the wafer with respect to the wafer.

50. The method of any of claims 4-49, wherein the third corrective data comprises a correction to compensate for errors in the size of a field of the wafer.

51. The method of any of claims 4-50, wherein the wafer is moved in a mechanical scan direction during exposure of the wafer, and wherein the third corrective data comprises a full pixel shift in the mechanical scan direction.

52. The method of any of claims 4-51, wherein the wafer is moved in a mechanical scan direction during exposure of the wafer, and wherein the third corrective data comprises a full pixel shift in a direction substantially perpendicular to the mechanical scan direction.

53. The method of any of the preceding claims, wherein the step of providing pattern data in a vector format comprises: providing design data describing a plurality of layers of a device design; and transforming a layer of the design data to generate two dimensional pattern data in vector format.

54. The method of claim 53, wherein the design data comprises data in a GDS-II format.

55. The method of claim 53, wherein the design data comprises data in an OASIS format.

56. The method of any of the preceding claims, wherein the vector pattern data comprises vector data describing the shape of features for patterning on the wafer and dose values associated with the features.

57. The method of any of the preceding claims, wherein the vector pattern data comprises vector data describing the shape of features for patterning on the wafer and an array of dose values for corresponding areas on the wafer.

58. The method of any one of the preceding claims, wherein the multi-level pattern data comprises an array of multi-level values assigned to pixel cells.

59. The method of any of the preceding claims, wherein the multi-level pattern data comprises gray scale bitmap data.

60. The method of any of the preceding claims, wherein the two-level pattern data comprises black/white bitmap data.

61. The method of any of the preceding claims, wherein the rendering and rasterizing steps are performed by off-line processing whereby the rendering and rasterizing of pattern data for the whole wafer is completed before the wafer scan begins.

62. The method of any of the preceding claims, wherein the rendering and rasterizing steps are performed once per design.

63. The method of any of the preceding claims, wherein the rendering and rasterizing steps are performed by in-line processing, whereby the rendering and rasterizing of pattern data for a first set of fields of the wafer is completed before a scan of the first set of fields begins, while the rendering and rasterizing of pattern data for the remaining fields of the wafer continues during the scan of the first set of fields.

64. The method of the immediately preceding claim, wherein the first set of fields and the remaining fields do not overlap.

65. The method of the immediately preceding claim, wherein the first set of fields and the remaining fields together comprise the complete area of the wafer to be exposed.

66. The method of any of the 3 immediately preceding claims, wherein the first set of fields is exposed in a first scan of the wafer and the remaining fields are exposed in a second scan of the wafer.

67. The method of any of the 4 immediately preceding claims, wherein a first subset of the beamlets is allocated for exposing the first set of fields and a second subset of the beamlets is allocated for exposing the remaining fields.

68. The method of any of the preceding claims, wherein the rendering and rasterizing steps are performed once per wafer.

69. The method of any of the preceding claims, wherein the rendering and rasterizing steps are performed by real-time processing, whereby the rendering and rasterizing for a first set of fields of the wafer continues during the scan of the first set of fields.

70. The method of any of the preceding claims, wherein the rendering and rasterizing steps are performed once per field of the wafer.

71. The method of any of the preceding claims, wherein the rendering and rasterizing steps are performed during exposure of the wafer.

A further set of definitions relates to:

1. A charged particle lithography system for exposing a wafer according to pattern data, the system comprising: an electron optical column for generating a plurality of electron beamlets for exposing the wafer, the electron optical column including a beamlet blanker array for switching the beamlets on or off; a data path for transmitting beamlet control data for control of the switching of the beamlets; and a wafer positioning system for moving the wafer under the electron optical column in an x-direction, the wafer positioning system being provided with synchronization signals from the data path to align the wafer with the electron beams from the electron-optical column;

wherein the data path comprises one or more processing units for generating the beamlet control data and one or more transmission channels for transmitting the beamlet control data to the beamlet blanker array.

Transmission Channels/Multiplexing:

2. The system of claim 1, wherein the transmission system comprises a plurality of transmission channels, each transmission channel for transmitting data for a corresponding group of beamlets.

3. The system of any of the preceding claims, wherein the beamlets are arranged in a plurality of groups, and wherein each transmission channel is for transmitting beamlet control data for one of the groups of beamlets.

4. The system of the immediately preceding claim, wherein the data path comprises a plurality of multiplexers, each multiplexer for multiplexing beamlet control data for a group of beamlets.

5. The system of the immediately preceding claim, further comprising a plurality of demultiplexers, each demultiplexer for demultiplexing beamlet control data for a group of beamlets.

6. The system of any of the preceding claims, wherein the data path comprises electrical-to-optical conversion devices for converting the beamlet control data generated by the processing units to an optical signal for transmission to the charged particle lithography machine.

7. The system of the immediately preceding claim, wherein the transmission channels comprise optical fibers for guiding the optical signal.

8. The system of any of the two immediately preceding claims, wherein the beamlet blanker array comprises optical-to-electrical conversion devices for receiving the optical signal and converting it to an electrical signal for control of the beamlets.

9. The system of any of the three immediately preceding claims, wherein the transmission system comprises an array of lenses and a mirror, the array of lenses for guiding the optical signal onto the mirror, and the mirror for reflecting the optical signal onto the beamlet blanker array of the charged particle lithography machine.

10. The system of any of the preceding claims, further comprising a first number of processing units sufficient for processing the pattern data to generate first beamlet control data for a first subset of the beamlets allocated for exposing a first portion of the wafer.

11. The system of any of the preceding claims, further comprising a cross-connect switch for connecting the processing units to a subset of the transmission channels.

12. The system of any of the preceding claims, wherein the beamlets are arranged in a plurality of groups, and wherein each processing unit is for generating beamlet control data for any one group of beamlets, and each transmission channel is dedicated for transmitting beamlet control data for one of the groups of beamlets.

13. The method of the immediately preceding claim, wherein seven processing units are provided for every twelve transmission channels.

14. The system of any of the two immediately preceding claims, wherein the charged particle lithography system allocates a first subset of the beamlets for exposing a first portion of the wafer and a second subset of the beamlets for exposing a second portion of the wafer; and wherein the cross-connect switch connects the processing units to a first subset of the transmission channels corresponding to the first subset of the beamlets for a scan of the first portion of the wafer, and connects the processing units to a second subset of the transmission channels corresponding to the second subset of the beamlets for a scan of the second portion of the wafer.

15. The system of any of the preceding claims, wherein the first number of processing units is sufficient for processing the pattern data to generate the first beamlet control data and processing the pattern data to generate the second beamlet control data, but not sufficient for processing the pattern data to generate both the first and second beamlet control data at the same time.

16. The system of any of the preceding claims, wherein the lithography system is adapted for exposing the wafer in a dual-pass scan in which a first portion of the wafer is exposed according to first pattern data and subsequently a second portion of the wafer is exposed according to second pattern data, and wherein the processing units comprise memory, the memory being divided into a first memory portion for storing the first pattern data and a second memory portion for storing the second pattern data, and wherein during exposure of the second portion of a wafer of a current batch of wafers, first pattern data for a wafer of a next batch of wafers is loaded into the first memory portion.

17. A method for exposing a wafer in a charged particle lithography system, the method comprising:

generating a plurality of charged particle beamlets, the beamlets arranged in groups, each group comprising an array of beamlets;

moving the wafer under the beamlets in a first direction at a wafer scan speed;

deflecting the beamlets in a second direction substantially perpendicular to the first direction at a deflection scan speed;

and adjusting the wafer scan speed to adjust a dose imparted by the beamlets on the wafer.

18. The method of claim 17, wherein the beamlets expose the wafer using a parallel projection writing strategy.

19. The method of any of claims 17-18, wherein the deflection scan speed comprises a beamlet scan speed and a fly-back speed.

20. The method of any of claims 17-19, wherein each array of beamlets has a projection pitch Pproj in the first direction between beamlets of the array, and a group distance equal to the projection pitch Pproj multiplied by the number of beamlets in the array, and wherein a scan step, equal to the relative movement in the x-direction between the beamlets and the wafer between each scan, equals the group distance divided by an integer K.

21. The method of claim 20, wherein the scan step is adjusted by adjusting a beamlet scan speed and/or a fly-back speed.

22. The method of claim 20, wherein the scan step is adjusted by adjusting a beamlet deflection period, the beamlet deflection period comprising the time for one beamlet scan in the y-direction and a beamlet fly-back time.

23. The method of claim 22, wherein the deflection period equals the group distance divided by integer K, divided by the beamlet scan speed.

24. The method of any of claims 20-24, wherein K satisfies a requirement that the greatest common denominator of K and the number of beamlets in each array, is one.

25. A method for exposing a wafer in a charged particle lithography system, the method comprising:
generating a plurality of charged particle beamlets, the beamlets arranged in groups, each group comprising an array of beamlets;
moving the wafer under the beamlets in an first direction at a wafer scan speed;
deflecting the beamlets in a second direction substantially perpendicular to the first direction at a deflection scan speed;
switching the beamlets on and off according to pattern data as the beamlets are deflected to expose pixels onto the wafer; and
adjusting the wafer scan speed relative to the deflection scan speed to adjust the pixel width in the first direction.

26. The method of claim 25, wherein the beamlets expose the wafer using a parallel projection writing strategy.

27. The method of any of claims 25-26, wherein the deflection scan speed comprises a beamlet scan speed and a fly-back speed.

28. The method of any of claims 25-27, wherein each array of beamlets has a projection pitch Pproj in the first direction between beamlets of the array, and a group distance equal to the projection pitch Pproj multiplied by the number of beamlets in the array, and wherein a scan step, equal to the relative movement in the x-direction between the beamlets and the wafer between each scan, equals the group distance divided by an integer K.

29. The method of claim 28, wherein the scan step is adjusted by adjusting a beamlet scan speed and/or a fly-back speed.

30. The method of claim 28, wherein the scan step is adjusted by adjusting a beamlet deflection period, the beamlet deflection period comprising the time for one beamlet scan in the y-direction and a beamlet fly-back time.

31. The method of claim 30, wherein the deflection period equals the group distance divided by integer K, divided by the beamlet scan speed.

32. The method of any of claims 28-31, wherein K satisfies a requirement that the greatest common denominator of K and the number of beamlets in each array, is one.

33. A method for exposing a wafer in a charged particle lithography system, the method comprising: generating a plurality of charged particle beamlets, the beamlets arranged in groups, each group comprising an array of beamlets; creating relative movement in a first direction between the beamlets and the wafer; deflecting the beamlets in a second direction substantially perpendicular to the x-direction at a deflection scan speed, so that each beamlet exposes a plurality of scan lines on the wafer; and adjusting the relative movement in the first direction and the deflection of the beamlets in the second direction to adjust a dose imparted by the beamlets on the wafer; wherein each array of beamlets has a projection pitch Pproj in the first direction between beamlets of the array, and a group distance equal to the projection pitch Pproj multiplied by the number of beamlets in the array, and wherein the relative movement in the x-direction between the beamlets and the wafer between each scan equals the group distance divided by an integer K.

34. The method of claim 33, wherein K satisfies a requirement that the greatest common denominator of K and the number of beamlets in each array, is one.

35. The method of claim 33 or 34, wherein a width of the scan lines is the projection pitch Pproj divided by integer K.

36. The method of any of claims 33-35, wherein the beamlets are switched on and off according to pattern data as the beamlets are deflected to expose pixels onto the wafer, and wherein a width of the pixels in the first direction is the projection pitch Pproj divided by integer K.

Yet, another set of definitions relates to:

1. A method for defining features for writing on a target using a lithography process, the method comprising: defining an array of cells, the features occupying one or more of the cells; describing for each cell any corners of the features that fall within the cell.

2. The method of claim 1, wherein each corner is described by a corner position, a first vector, and a second vector, the two vectors originating from the position.

3. The method of claim 2, wherein the corner positions are described by two coordinates.

4. The method of any of claims 2-3, wherein the corner positions are described by Cartesian coordinates.

5. The method of any of claims 2-4, wherein each vector is described by an orientation code specifying a direction for the vector.

6. The method of any of claims 2-5, wherein the feature is defined as the area bounded by the vectors and the cell boundaries when moving in a predetermined direction from the first vector to the second vector.

7. The method of claim 6, wherein the predetermined direction is a clockwise direction.

8. The method of any of claims 1-7, wherein a pseudo corner is defined for a feature falling partly within a cell but otherwise having no corners within the cell.

9. The method of claim 8, wherein the pseudo corner is described by first and second vectors oriented at 180 degrees with respect to each other.

10. The method of any of claims 2-9, wherein the vectors can only have a direction parallel to a cell boundary or perpendicular to a cell boundary.

11. The method of any of claims 2-9, wherein the vectors can only have a direction parallel to a cell boundary, perpendicular to a cell boundary, or at 45 degrees to a cell boundary.

12. The method of any of the preceding claims, wherein a minimum feature pitch is defined and wherein the cells have a size equal to or less than the minimum feature pitch.

13. The method of any of the preceding claims, wherein a minimum feature pitch is defined and wherein the cells have a size equal to or less than half of the square root of two multiplied by the minimum feature pitch.

14. The method of claim 10, wherein a minimum feature pitch is defined having a size equal to or greater than the size of the cells multiplied by the square root of two.

15. The method of claim 10, wherein, for features or part of features having an edge oriented at 45 degrees to a cell boundary, a minimum feature pitch is defined having a size equal to or greater than the size of the cells multiplied by the square root of two.

16. The method of any of the preceding claims, wherein a maximum number of corners may be defined for each cell.

17. The method of any of the preceding claims, wherein each cell may contain one or more features, and/or a portion of one of more features.

18. The method of any of the preceding claims, wherein each cell comprises pattern data for part of a field of the wafer.

19. The method of the immediately preceding claim, wherein each cell comprises pattern data of a stripe of a field of the wafer.

20. A method of processing pattern data for use in a lithography process, the method comprising:
providing the pattern data in a vector format;
transforming the vector pattern data a generate pattern data in a cell based format; and
rasterizing the cell based pattern data to generate two-level pattern data for use in the lithography process.

21. The method of claim 20, wherein the cell based pattern data comprises cell data describing features occupying one or more of the cells of an array of cells, the cell data describing for each cell any corners of the features that fall within the cell.

22. The method of claim 20 or 21, wherein rasterizing the cell based pattern data is performed in real-time processing while the lithography process is being performed.

23. The method of any of claims 20-22, wherein rasterizing the cell based pattern data comprises:
rendering the cell based pattern data to generate multi-level pattern data;
dithering the multi-level pattern data to generate the two-level pattern data.

24. A method for exposing a wafer according to pattern data using a charged particle lithography machine generating a plurality of charged particle beamlets for exposing the wafer, the method comprising:
providing the pattern data in a vector format; transforming the vector pattern data a generate pattern data in a cell based format;
rasterizing the cell based pattern data to generate two-level pattern data; and
streaming the two-level pattern data to a beamlet blanker array for switching on and off the beamlets generated by the charged particle lithography machine; and
switching on and off the beamlets on the basis of the two-level pattern data.

25. The method of claim 24, wherein the cell based pattern data comprises cell data describing features occupying one or more of the cells of an array of cells, the cell data describing for each cell any corners of the features that fall within the cell.

26. The method of claim 24 or 25, wherein rasterizing the cell based pattern data is performed in real-time processing while the lithography machine is exposing the wafer.

27. The method of any of claims 24-26, wherein rasterizing the cell based pattern data comprises:
rendering the cell based pattern data to generate multi-level pattern data;
dithering the multi-level pattern data to generate the two-level pattern data.

The invention claimed is:

1. A method for exposing a plurality of stripes of a field of a wafer using a plurality of charged particle beamlets by an electron optical column of a charged particle lithography system comprising a moveable stage, the method comprising:
transmitting control signals for the charged particle beamlets by channels of a data path, wherein each channel transmits beamlet control data for a group of the beamlets, wherein each group of beamlets is arranged to scan one stripe of the field of the wafer;
identifying non-functional beamlets of the charged particle lithography system among the beamlets prior to performing a first scan;
calculating, by a processing unit communicatively connected to the charged particle lithography system, a first subset of the beamlets, first channels and a first wafer offset for exposing a first portion of the stripes, the first subset of the beamlets excluding the non-functional beamlets as identified prior to performing the first scan;
calculating, by the processing unit, a second subset of the beamlets, second channels and a second wafer offset for exposing a second portion of the stripes, the second subset also excluding the non-functional beamlets as identified prior to performing the first scan;
moving the wafer using the moveable stage to a first position based on the first wafer offset before beginning the first scan;
performing the first scan for exposing the entire first portion of the stripes using the first channels;
moving the wafer using the moveable stage to a second position based on the second wafer offset after the first scan and before beginning the second scan, wherein the second position is shifted with respect to the first position; and
performing the second scan of the same field of said wafer to be exposed in the charged particle lithography system for exposing the entire second portion of the stripes using the second channels,
wherein the first and second wafer offsets comprise shifting the wafer with respect to the electron optical column in the y-direction and/or x-direction by an amount corresponding to a number of stripes until channels with properly functioning beamlets are positioned to write the respective portions of the stripes,
wherein the first and second portions of the stripes do not overlap and together comprise the complete area of the wafer to be exposed; and
wherein the first subset of the beamlets is different from the second subset of the beamlets.

2. The method of claim 1, wherein the first and second subsets are substantially equal in size.

3. The method of claim 1, wherein the first and second portions each comprise selected stripes from a plurality of fields of the target.

4. The method of claim 1, wherein identifying the non-functional beamlets comprises measuring the beamlets to identify failed or out-of-specification beamlets.

5. The method of claim 4, wherein measuring the beamlets comprises directing the plurality of beamlets onto a sensor and detecting presence of the beamlets.

6. The method of claim 4, wherein measuring the beamlets comprises directing the plurality of beamlets onto a sensor and measuring beamlet position.

7. The method of claim 4, wherein measuring the beamlets comprises scanning the plurality of beamlets onto a sensor and measuring beamlet deflection.

8. The method of claim 4, wherein measuring the beamlets comprises scanning the plurality of beamlets onto a sensor and measuring beamlet current.

9. The method of claim 1, wherein the plurality of beamlets are divided into groups, each group of beamlets for exposing a corresponding stripe within each field of the target.

10. The method of claim 1, wherein a position of the target with respect to the plurality of beamlets is different at the beginning of the second scan than at the beginning of the first scan.

11. The method of claim 1, wherein the beamlets are switched on and off by a beamlet blanker array during each scan according to beamlet control data.

12. The method of claim 11, wherein the beamlet control data comprise first beamlet control data for switching the first subset of beamlets during the first scan, and second beamlet control data for switching the second subset of beamlets during the second scan, and wherein the method further comprises transmitting the first beamlet control data to the beamlet blanker array during the first scan and transmitting the second beamlet control data to the beamlet blanker array during the second scan.

13. The method of claim 12, further comprising processing pattern data to generate the beamlet control data, and wherein the second beamlet control data is generated during the first scan.

14. The method of claim 13, wherein processing the pattern data comprises rasterizing the pattern data to generate the beamlet control data, and wherein the rasterizing for the second beamlet control data is performed during the first scan.

15. The method of claim 13, wherein processing the pattern data comprises preparing the beamlet control data for streaming to the beamlet blanker array, and wherein the second beamlet control data is prepared for streaming to the blanker array during the first scan.

16. The method of claim 12, further comprising processing pattern data to generate the beamlet control data, and wherein the first beamlet control data of the next target to be exposed is generated during the second scan of the target currently being exposed.

17. The method of claim 16, wherein processing the pattern data comprises rasterizing the pattern data to generate the beamlet control data, and wherein the rasterizing for the first beamlet control data of the next target to be exposed is performed during the second scan of the target currently being exposed.

18. The method of claim 16, wherein processing the pattern data comprises preparing the beamlet control data for streaming to the beamlet blanker array, and wherein the first beamlet control data of the next target to be exposed is prepared for streaming to the blanker array during the second scan of the target currently being exposed.

19. The method of claim 12, further comprising:
providing a first number of processing units sufficient for processing the pattern data to generate the first beamlet control data;
providing a second number of channels for transmitting the beamlet control data to the beamlet blanker array, each channel transmitting data for a corresponding group of beamlets;
connecting the processing units to the channels corresponding to the first subset of beamlets for exposing the first portion of the target;
processing the pattern data in the processing units to generate the first beamlet control data; and
transmitting the first beamlet control data to the beamlet blanker array.

20. The method of claim 12, further comprising:
providing a third number of processing units sufficient for processing the pattern data to generate the second beamlet control data;
providing a fourth number of channels for transmitting the beamlet control data to the beamlet blanker array, each channel transmitting data for a corresponding group of beamlets;
connecting the processing units to the channels corresponding to the second subset of beamlets for exposing the second portion of the target;
processing the pattern data in the processing units to generate the second beamlet control data; and
transmitting the second beamlet control data to the beamlet blanker array.

21. The method of claim 16, wherein the first number of processing units is sufficient for processing the pattern data to generate the first beamlet control data and processing the pattern data to generate the second beamlet control data, but not sufficient for processing the pattern data to generate both the first and second beamlet control data at the same time.

22. The method of claim 16, wherein seven processing units are provided for every twelve channels.

23. The method of claim 1, wherein moving the target to the second position after the first scan and before beginning a second scan comprises:
moving the target back to the first position after the first scan;
shifting the target to the second position after the first scan and before beginning the second scan.

24. A charged particle lithography system for exposing a plurality of stripes of a field of a wafer using a plurality of charged particle beamlets, the system comprising:
a charged particle optics column including a blanker configured for generating charged particle beamlets for projection of a pattern onto the wafer, wherein the beamlets are divided into groups, wherein each group of beamlets is arranged to scan one stripe of the field of the wafer;
a target support comprising a moveable stage, said column and target support being included moveable relative to one another in the system; and
a data path configured for processing and transferring pattern data to the blanker, said blanker being configured to switch each of said beamlets on and off in respect of projection on said wafer, said data path comprising processing units for processing the pattern data into projection data related to a stripe, and said data path comprising channels connected to the blanker for individually controlling beamlets by said projection data, each channel being assigned to transmit beamlet control signals to a corresponding beamlet group for exposing the corresponding stripe according to the pattern data,
wherein the system further comprises a sensor configured to identify non-functional beamlets of the charged particle lithography system among the beamlets prior to performing a first scan,
wherein a processing unit of the data path is configured to calculate a first subset of the beamlets, first channels and a first wafer offset for exposing a first portion of the stripes, the first subset of the beamlets excluding the non-functional beamlets as identified prior to performing the first scan, wherein the processing unit is further configured to calculate a second subset of the beamlets, second channels and a second wafer offset for exposing a second portion of the stripes, the second subset also excluding the non-functional beamlets as identified prior to performing the first scan, wherein the system is further configured to move the wafer using the moveable stage to a first position based on the first wafer offset before beginning the first scan, wherein the system is further configured to perform the first scan for exposing the entire first portion of the stripes using the first channels, wherein the system is further configured to move the wafer using the moveable stage to a second position based on the second wafer offset after the first scan and before beginning the second scan, wherein the second position is shifted with respect to the first position, wherein the system is further configured to perform the second scan of the same field of said wafer to be exposed in the charged particle lithography system for exposing the entire second portion of the stripes using the second channels, wherein the first and second wafer offsets comprise shifting the wafer with respect to the electron optical column in the y-direction and/or x-direction by an amount corresponding to a number of stripes until channels with properly functioning beamlets are positioned to write the respective portions of the stripes, wherein the first and second portions of the stripes do not overlap and together comprise the complete area of the wafer to be exposed, and wherein the first subset of the beamlets is different from the second subset of the beamlets.

* * * * *